US012604515B2

(12) United States Patent
Tsai et al.

(10) Patent No.: US 12,604,515 B2
(45) Date of Patent: Apr. 14, 2026

(54) SEMICONDUCTOR DEVICE STRUCTURE WITH INNER SPACER LAYER

(71) Applicant: Taiwan Semiconductor Manufacturing Company, Ltd., Hsinchu (TW)

(72) Inventors: Ching-Wei Tsai, Hsinchu (TW); Yu-Xuan Huang, Hsinchu (TW); Kuan-Lun Cheng, Hsin-chu (TW); Chih-Hao Wang, Baoshan Township, Hsinchu County (TW); Min Cao, Hsinchu (TW); Jung-Hung Chang, Changhua County (TW); Lo-Heng Chang, Hsinchu (TW); Pei-Hsun Wang, Kaohsiung (TW); Kuo-Cheng Chiang, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 176 days.

(21) Appl. No.: 18/477,055

(22) Filed: Sep. 28, 2023

(65) Prior Publication Data

US 2024/0021481 A1    Jan. 18, 2024

Related U.S. Application Data

(62) Division of application No. 17/473,486, filed on Sep. 13, 2021, now Pat. No. 12,243,780, which is a
(Continued)

(51) Int. Cl.
*H10D 84/03*       (2025.01)
*H10D 30/01*       (2025.01)
(Continued)

(52) U.S. Cl.
CPC ......... *H10D 84/038* (2025.01); *H10D 30/024* (2025.01); *H10D 30/6735* (2025.01);
(Continued)

(58) Field of Classification Search
CPC ............ H01L 29/7851; H01D 30/6757; H01D 62/121; H01D 64/017; H01D 84/0158;
(Continued)

(56) References Cited

U.S. PATENT DOCUMENTS 9,209,247 B2    12/2015  Colinge et al.
9,236,267 B2    1/2016   De et al.
(Continued)

FOREIGN PATENT DOCUMENTS

CN          107039455 A      8/2017
CN          109727916 A      5/2019
CN          110911404 A    *  3/2020    ......... H10D 84/0158

*Primary Examiner* — Mohammad M Choudhry
(74) *Attorney, Agent, or Firm* — Birch, Stewart, Kolasch & Birch, LLP

(57)                ABSTRACT

A semiconductor device structure is provided. The semiconductor device structure includes a substrate having a base. The semiconductor device structure includes a first multilayer stack over the base. The first multilayer stack includes a first channel layer and a second channel layer over and spaced apart from the first channel layer. The semiconductor device structure includes a gate stack over the substrate. The gate stack wraps around the first multilayer stack. The semiconductor device structure includes an inner spacer layer between the second channel layer and the first channel layer and between the first channel layer and the base. The semiconductor device structure includes a bottom spacer over the base. The semiconductor device structure includes a first source/drain structure over the bottom spacer and connected to the second channel layer.

20 Claims, 77 Drawing Sheets

Related U.S. Application Data division of application No. 16/586,523, filed on Sep. 27, 2019, now Pat. No. 11,121,037.

(51) Int. Cl.

| | |
|---|---|
| *H10D 30/67* | (2025.01) |
| *H10D 30/69* | (2025.01) |
| *H10D 62/10* | (2025.01) |
| *H10D 64/01* | (2025.01) |
| *H10D 84/01* | (2025.01) |
| *H01L 21/02* | (2006.01) |
| *H10D 84/85* | (2025.01) |

(52) U.S. Cl.

CPC ....... *H10D 30/6757* (2025.01); *H10D 30/797* (2025.01); *H10D 62/121* (2025.01); *H10D 64/015* (2025.01); *H10D 64/017* (2025.01); *H10D 64/018* (2025.01); *H10D 84/0158* (2025.01); *H10D 84/0167* (2025.01); *H10D 84/017* (2025.01); *H10D 84/0172* (2025.01); *H01L 21/02603* (2013.01); *H10D 30/031* (2025.01); *H10D 30/6713* (2025.01); *H10D 84/856* (2025.01)

(58) Field of Classification Search

CPC ............. H10D 64/018; H10D 84/0172; H10D 84/0167; H10D 30/024

See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,929,235 B1 | 3/2018 | Yang et al. | |
| 2008/0099849 A1 | 5/2008 | Kim et al. | |
| 2015/0340457 A1 | 11/2015 | Xie et al. | |
| 2017/0069481 A1 | 3/2017 | Doris et al. | |
| 2017/0194510 A1 | 7/2017 | Doris et al. | |
| 2017/0255735 A1 | 9/2017 | Kim et al. | |
| 2018/0122703 A1* | 5/2018 | Cheng .................. | H10D 64/018 |
| 2018/0261668 A1 | 9/2018 | Yang et al. | |
| 2019/0109040 A1 | 4/2019 | Chao et al. | |
| 2019/0267391 A1* | 8/2019 | Imai ....................... | H10B 43/50 |
| 2019/0305104 A1 | 10/2019 | Xie et al. | |
| 2019/0348498 A1 | 11/2019 | Cheng et al. | |
| 2020/0091152 A1* | 3/2020 | Noh ..................... | H10D 84/017 |
| 2020/0227305 A1 | 7/2020 | Cheng et al. | |

* cited by examiner

II                                                                II'

I                                                                    I'

II                                          II'

II                                                                II'

II                                                                II'

III                           III'

SEMICONDUCTOR DEVICE STRUCTURE WITH INNER SPACER LAYER

CROSS REFERENCE

This application is a Divisional of U.S. application Ser. No. 17/473,486, filed on Sep. 13, 2021, which is a Divisional of U.S. application Ser. No. 16/586,523, filed on Sep. 27, 2019, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1 to 1H-1 are cross-sectional views illustrating the semiconductor device structure along the sectional line I-I' in FIGS. 1A-1H, in accordance with some embodiments.

FIGS. 1A-2 to 1H-2 are cross-sectional views illustrating the semiconductor device structure along the sectional line II-II' in FIGS. 1A-1H, in accordance with some embodiments.

FIG. 1A-3 is a top view of the semiconductor device structure of FIG. 1A, in accordance with some embodiments.

FIG. 1F-3 is a cross-sectional view illustrating the semiconductor device structure along a sectional line III-III' in FIG. 1F, in accordance with some embodiments.

FIG. 1G-3 is a cross-sectional view illustrating the semiconductor device structure along a sectional line III-III' in FIG. 1G, in accordance with some embodiments.

FIG. 1H-3 is a cross-sectional view illustrating the semiconductor device structure along a sectional line III-III' in FIG. 1H, in accordance with some embodiments.

FIG. 1H-4 is a cross-sectional view illustrating the semiconductor device structure along a sectional line IV-IV' in FIG. 1H, in accordance with some embodiments.

FIGS. 2A-1 to 2M-1 are cross-sectional views illustrating the semiconductor device structure along the sectional line I-I' in FIGS. 2A-2M, in accordance with some embodiments.

FIGS. 2A-2 to 2M-2 are cross-sectional views illustrating the semiconductor device structure along the sectional line II-II' in FIGS. 2A-2M, in accordance with some embodiments.

FIGS. 2A-3 to 2M-3 are cross-sectional views illustrating the semiconductor device structure along a sectional line in FIGS. 2A-2M, in accordance with some embodiments.

FIG. 2C-4 is a perspective view of the semiconductor device structure of FIG. 2C, in accordance with some embodiments.

FIG. 2M-4 is a perspective view of the semiconductor device structure of FIG. 2M, in accordance with some embodiments.

FIG. 2M-5 is a cross-sectional view illustrating the semiconductor device structure along a sectional line IV-IV' in FIG. 2M, in accordance with some embodiments.

FIG. 2M-6 is a cross-sectional view illustrating the semiconductor device structure along a sectional line V-V' in FIG. 2M, in accordance with some embodiments.

FIG. 5 is a cross-sectional view of a semiconductor device structure, in accordance with some embodiments.

DETAILED DESCRIPTION

Figure 1A:
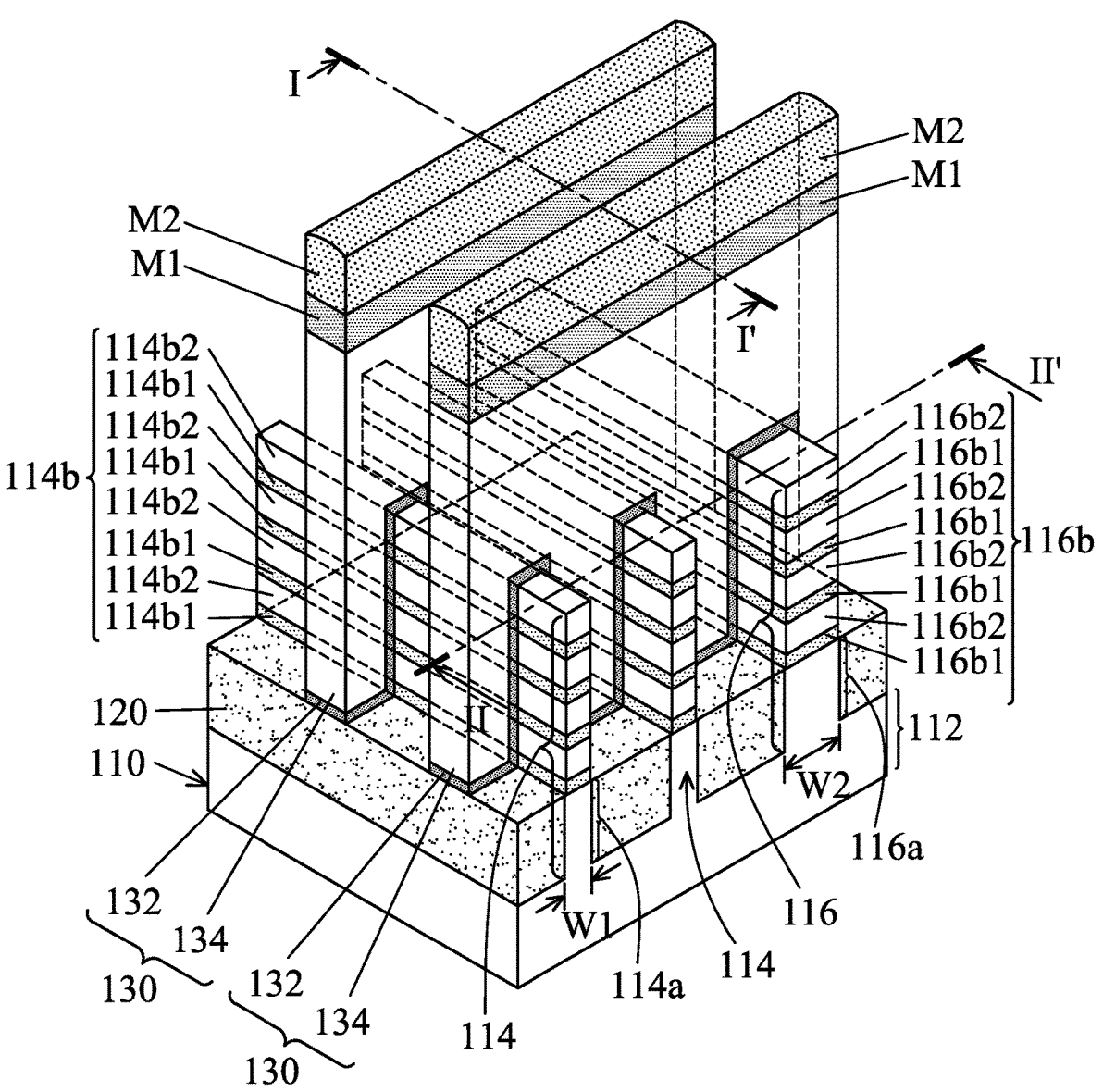
FIGS. 1A-1H are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figures 1, 1A:
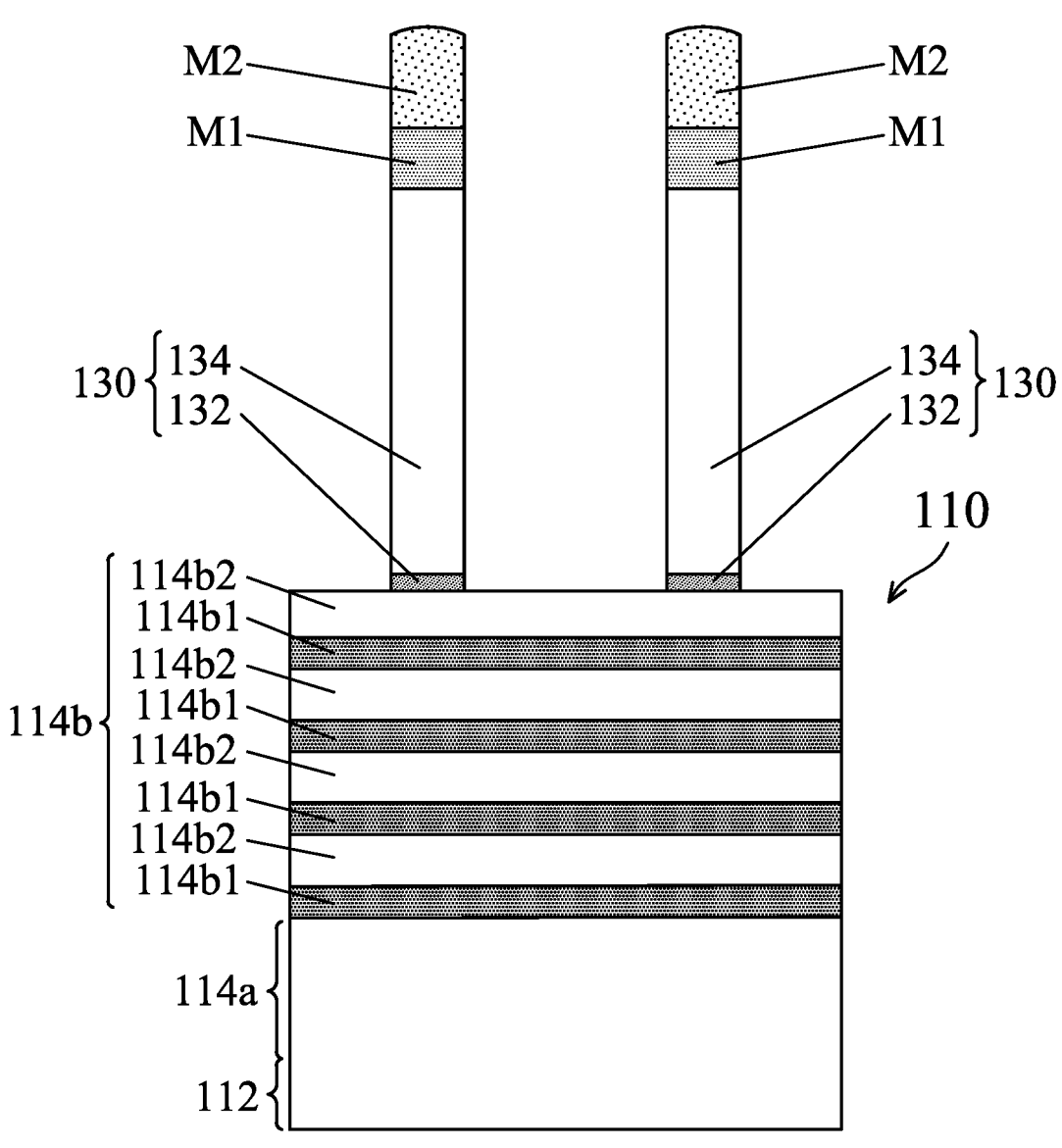
Figures 1, 1A, 2:
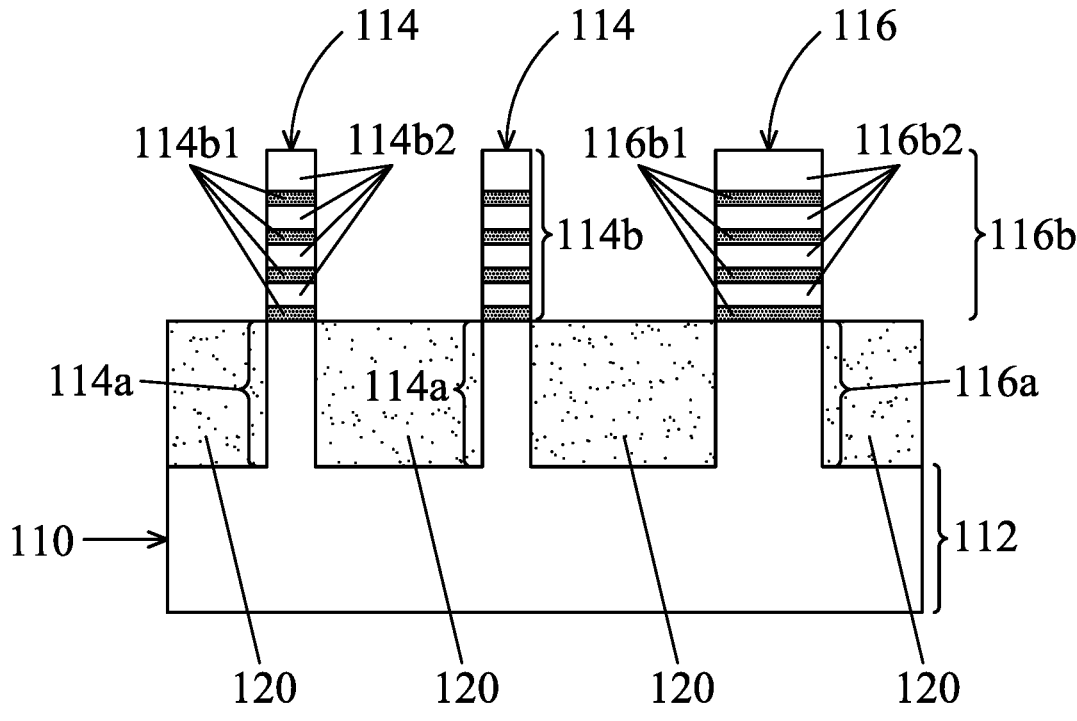
Figures 1, 1A, 2, 3:
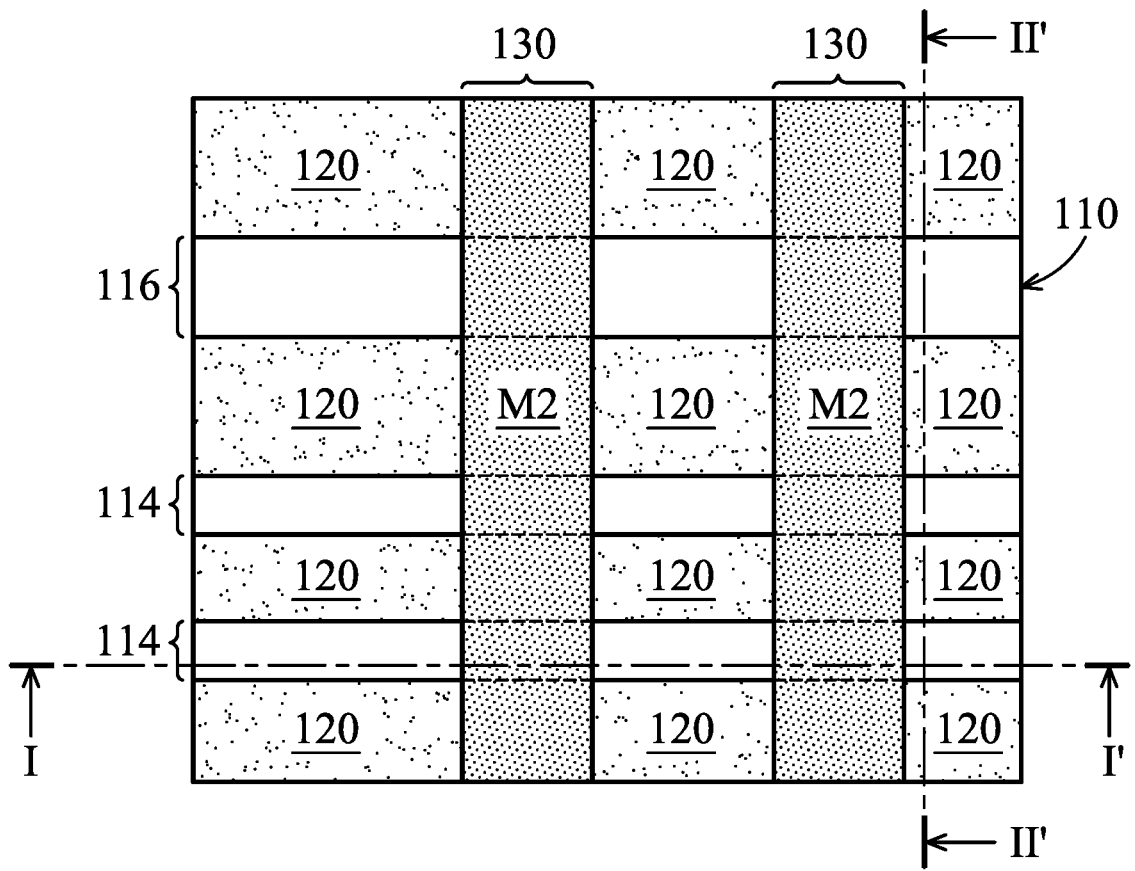
Figure 1B:
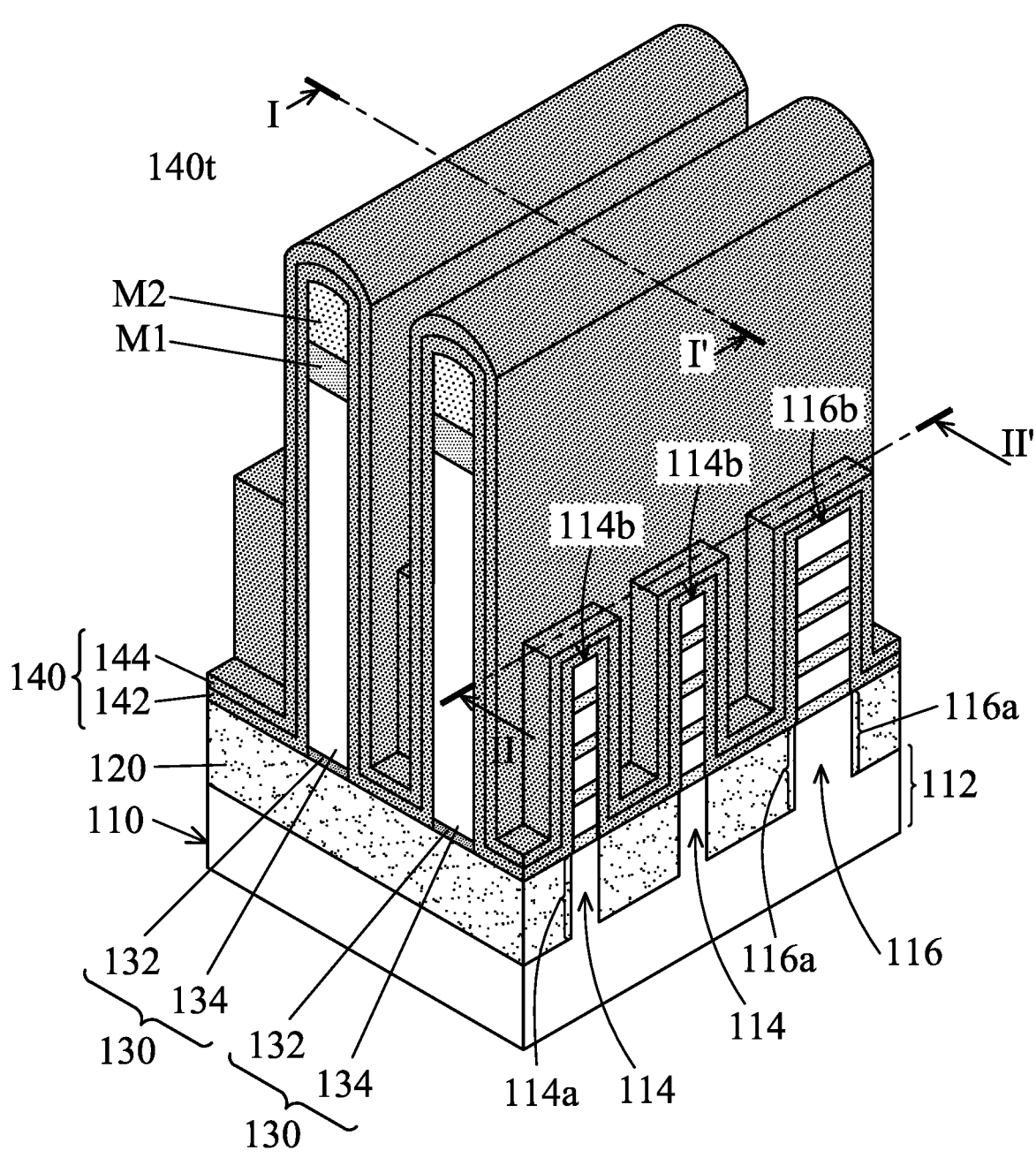
Figures 1, 1B:
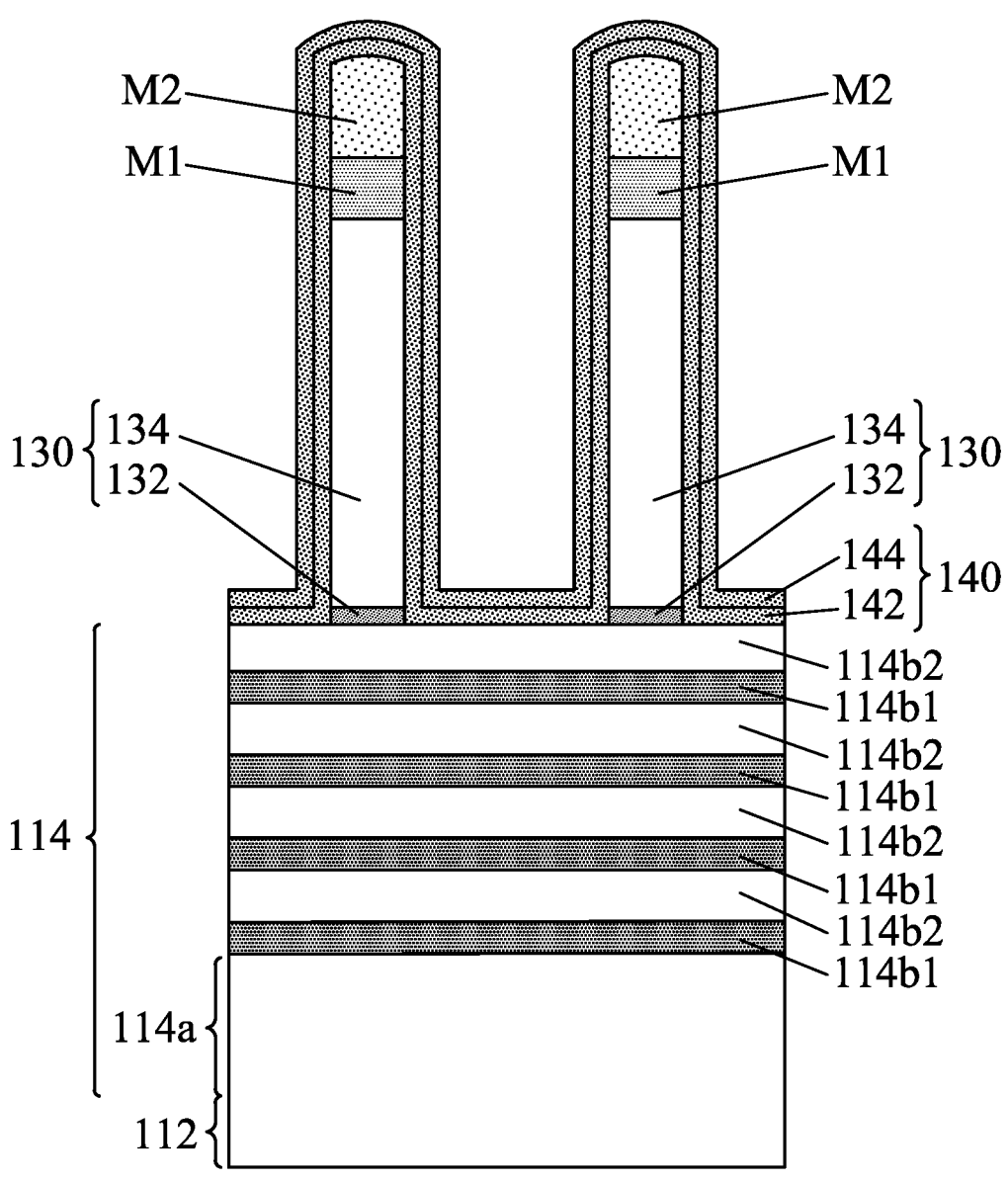
Figures 1, 1B, 2:
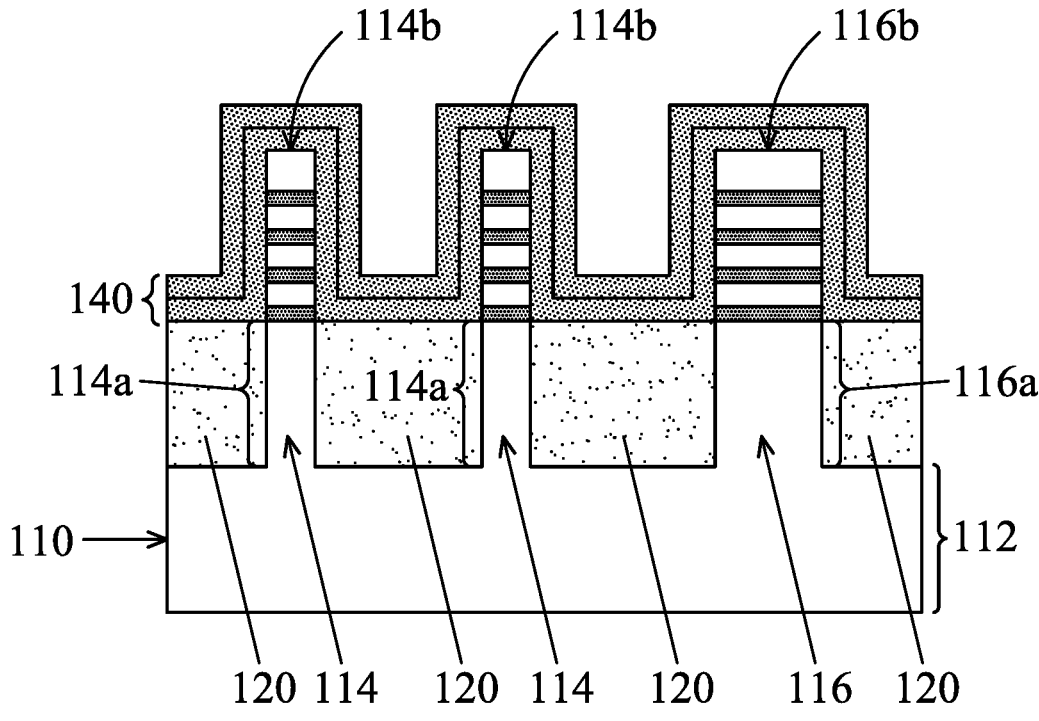
Figure 1C:
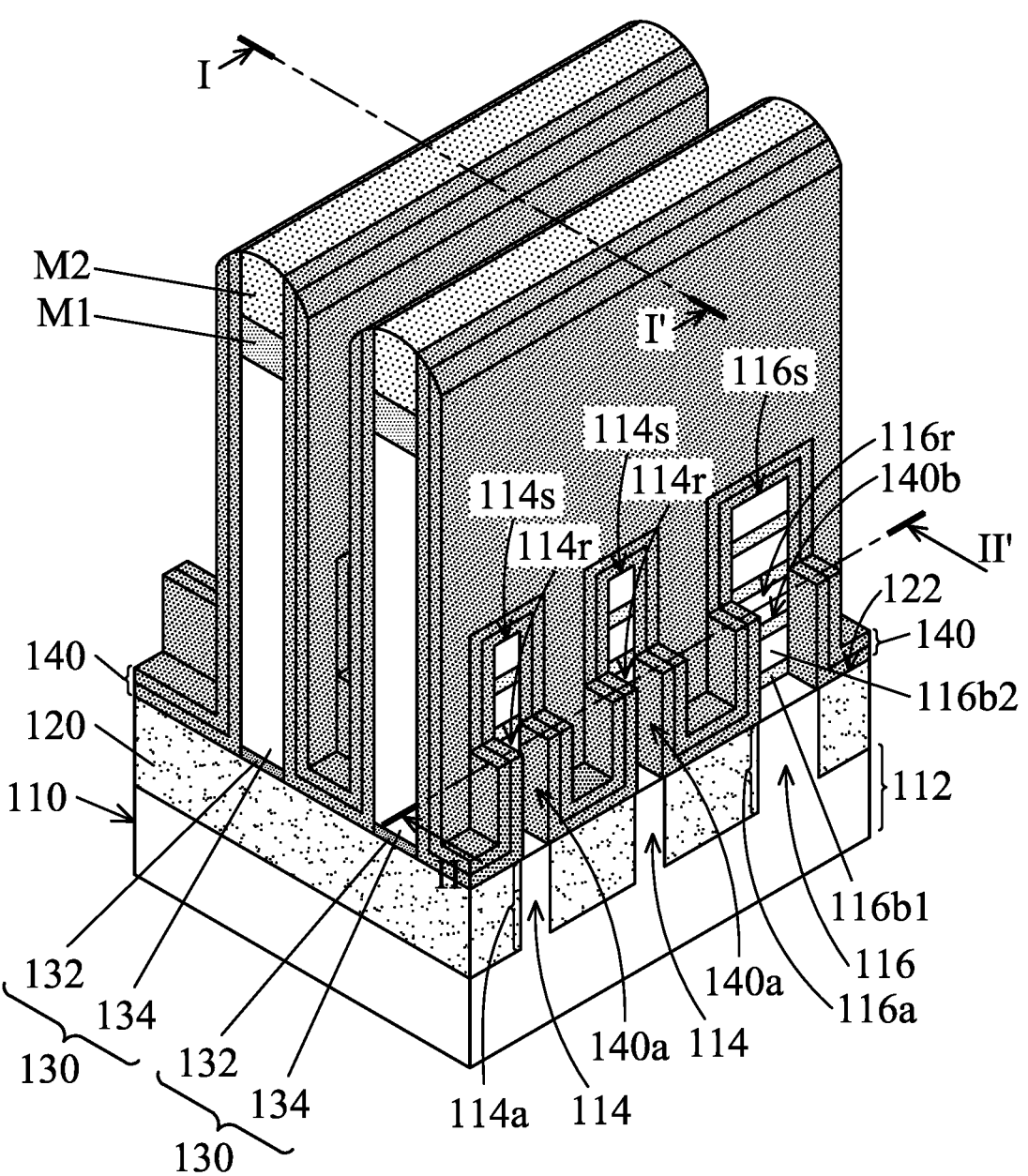
Figures 1, 1C:
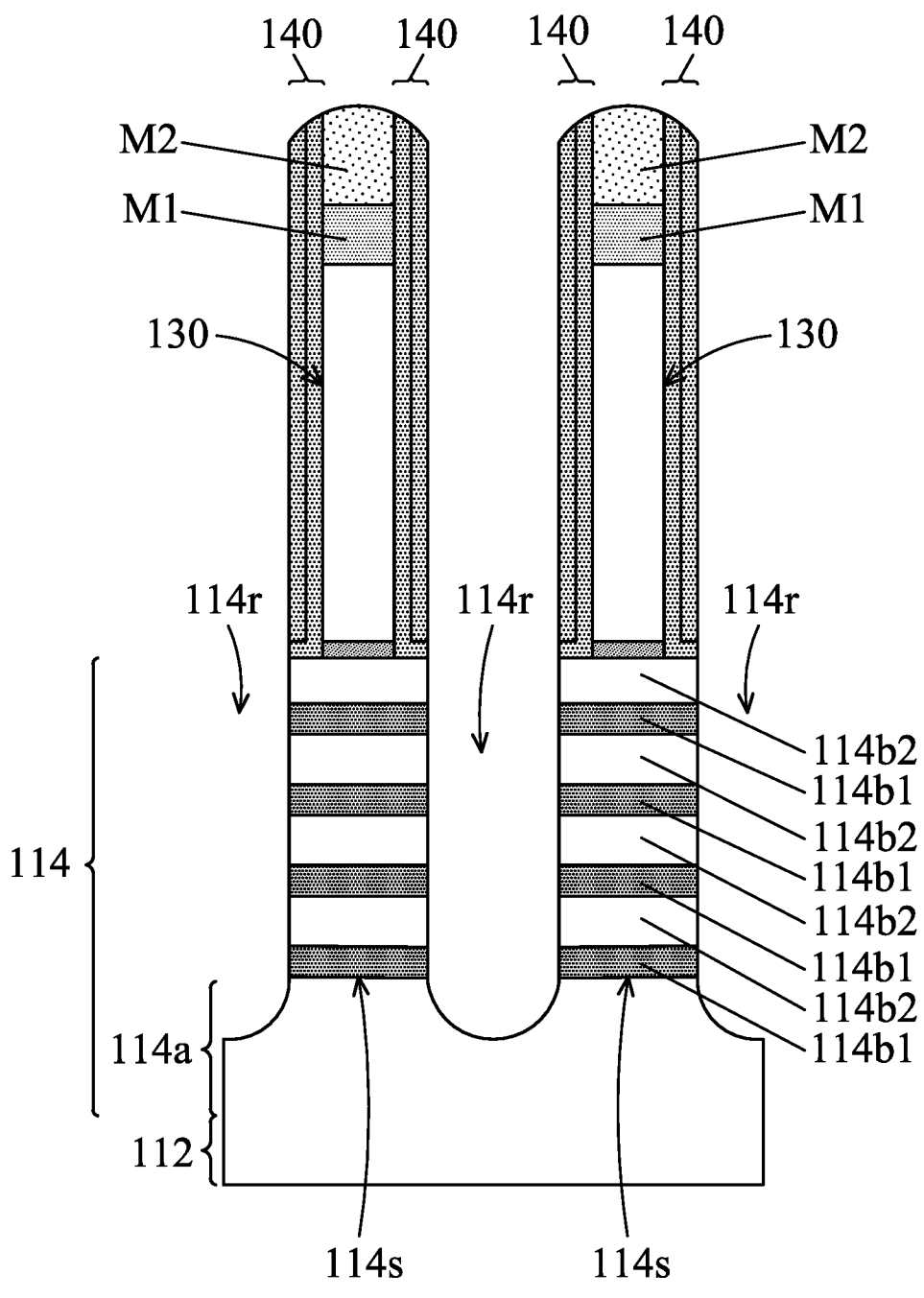
Figures 1, 1C, 2:
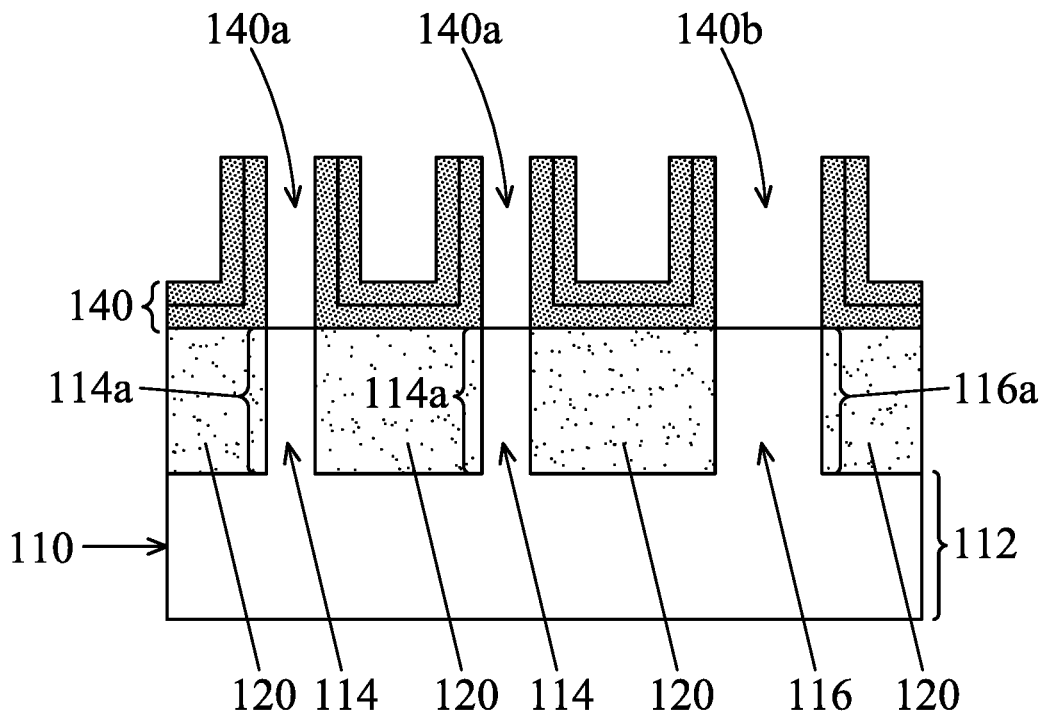
Figure 1D:
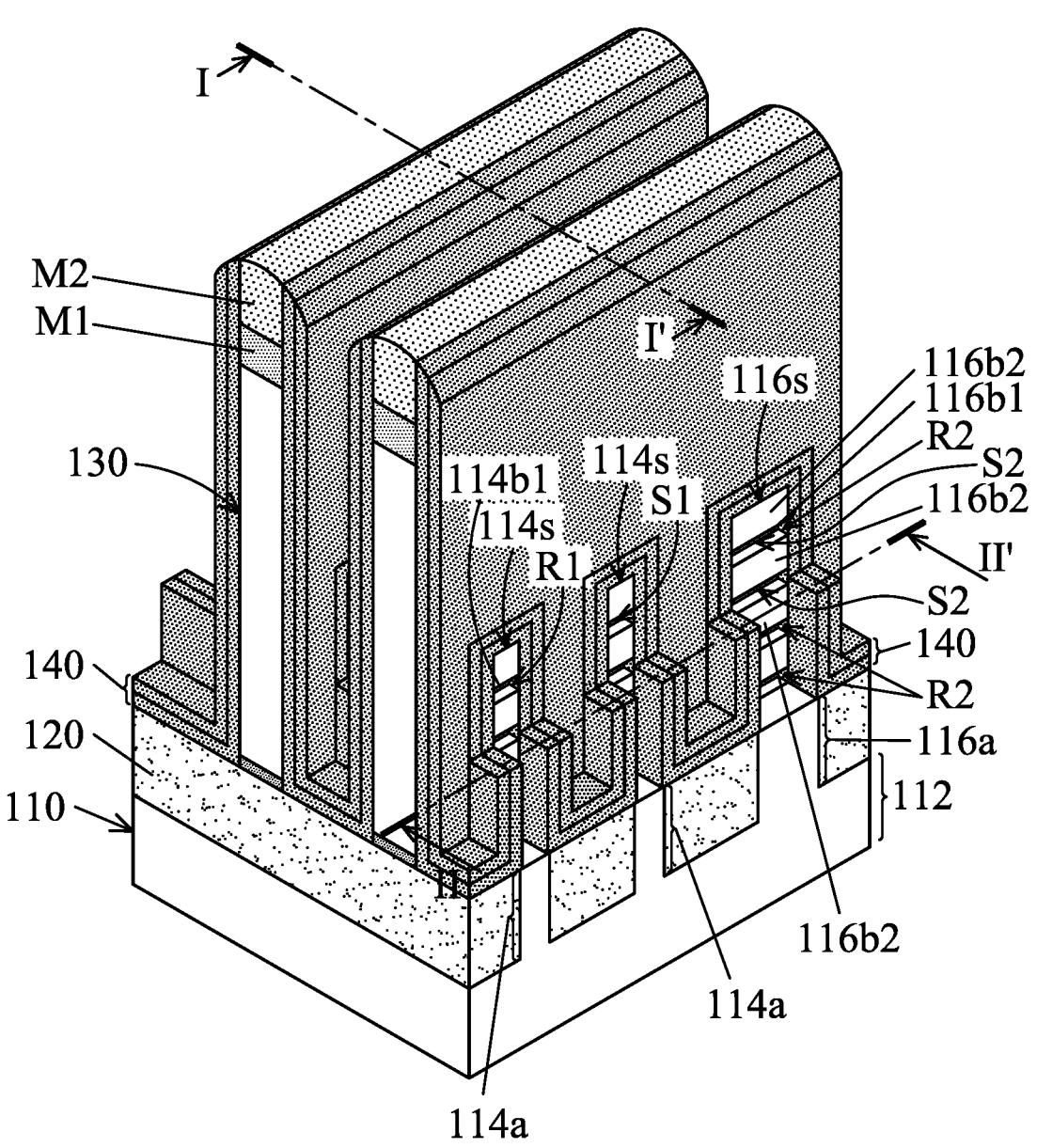
Figures 1, 1D:
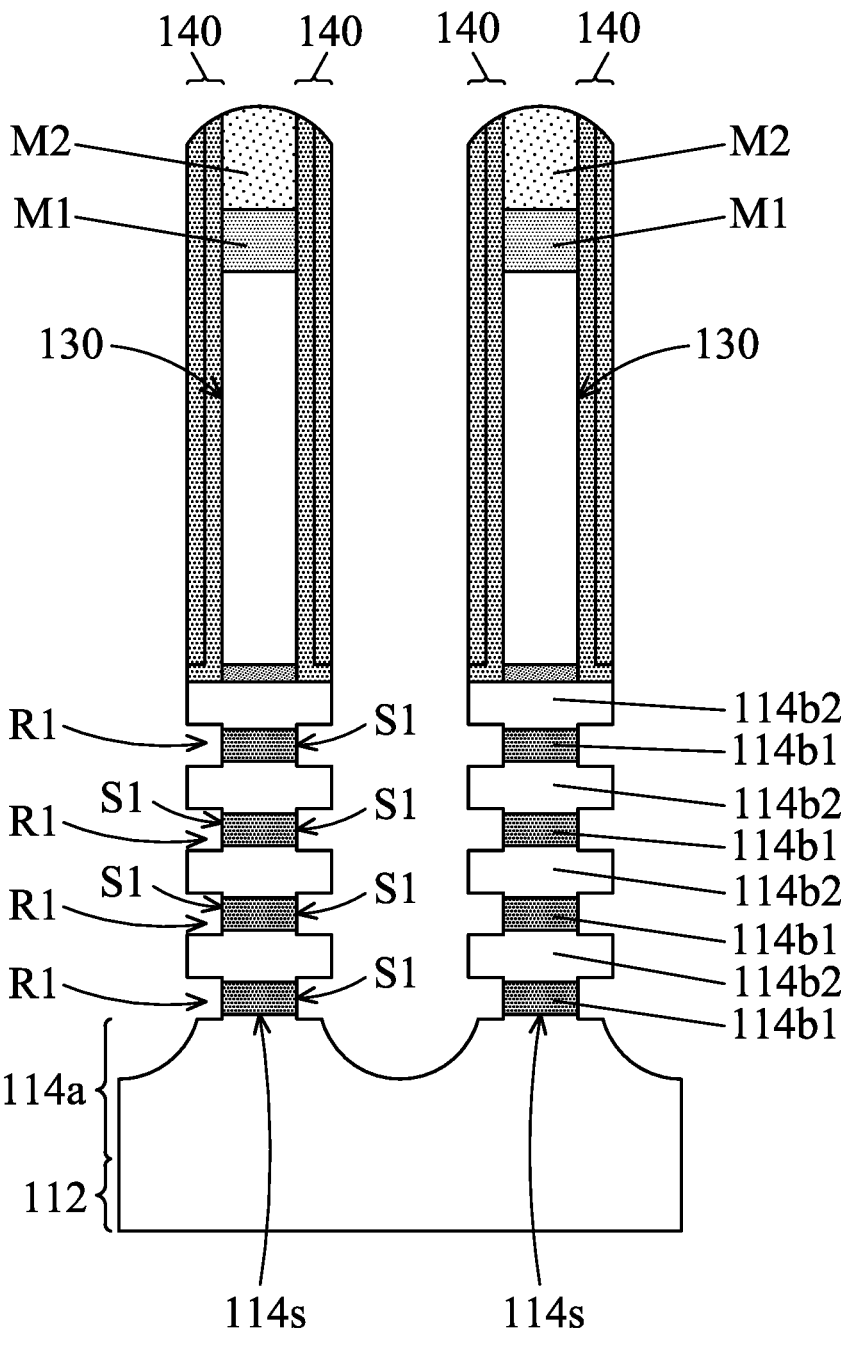
Figures 1, 1D, 2:
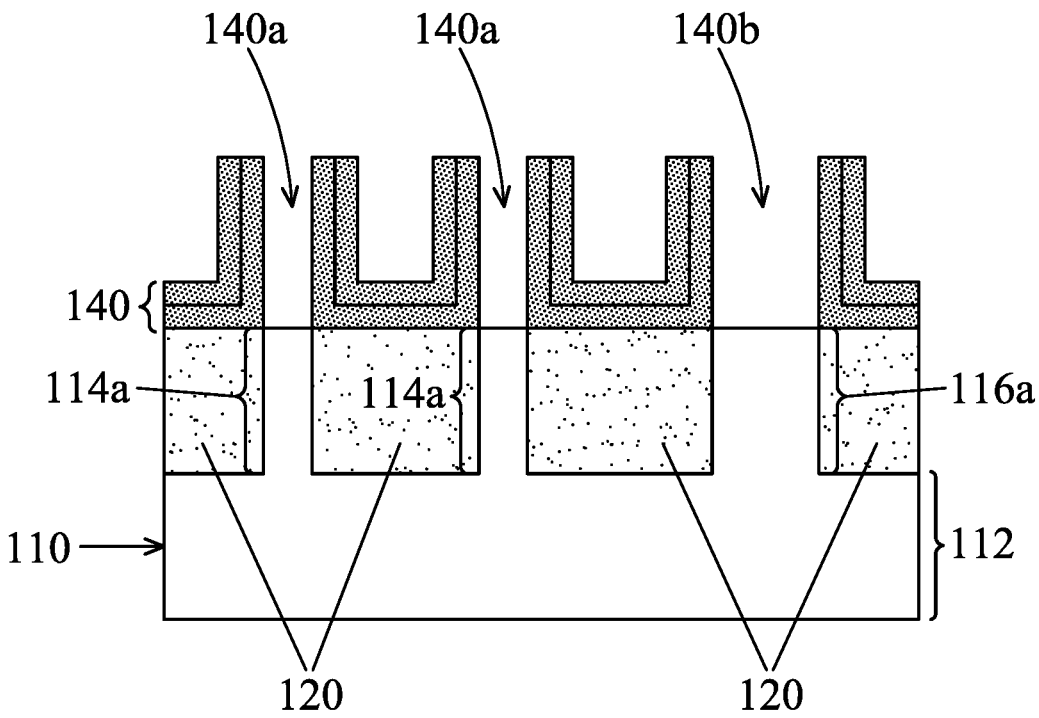
Figure 1E:
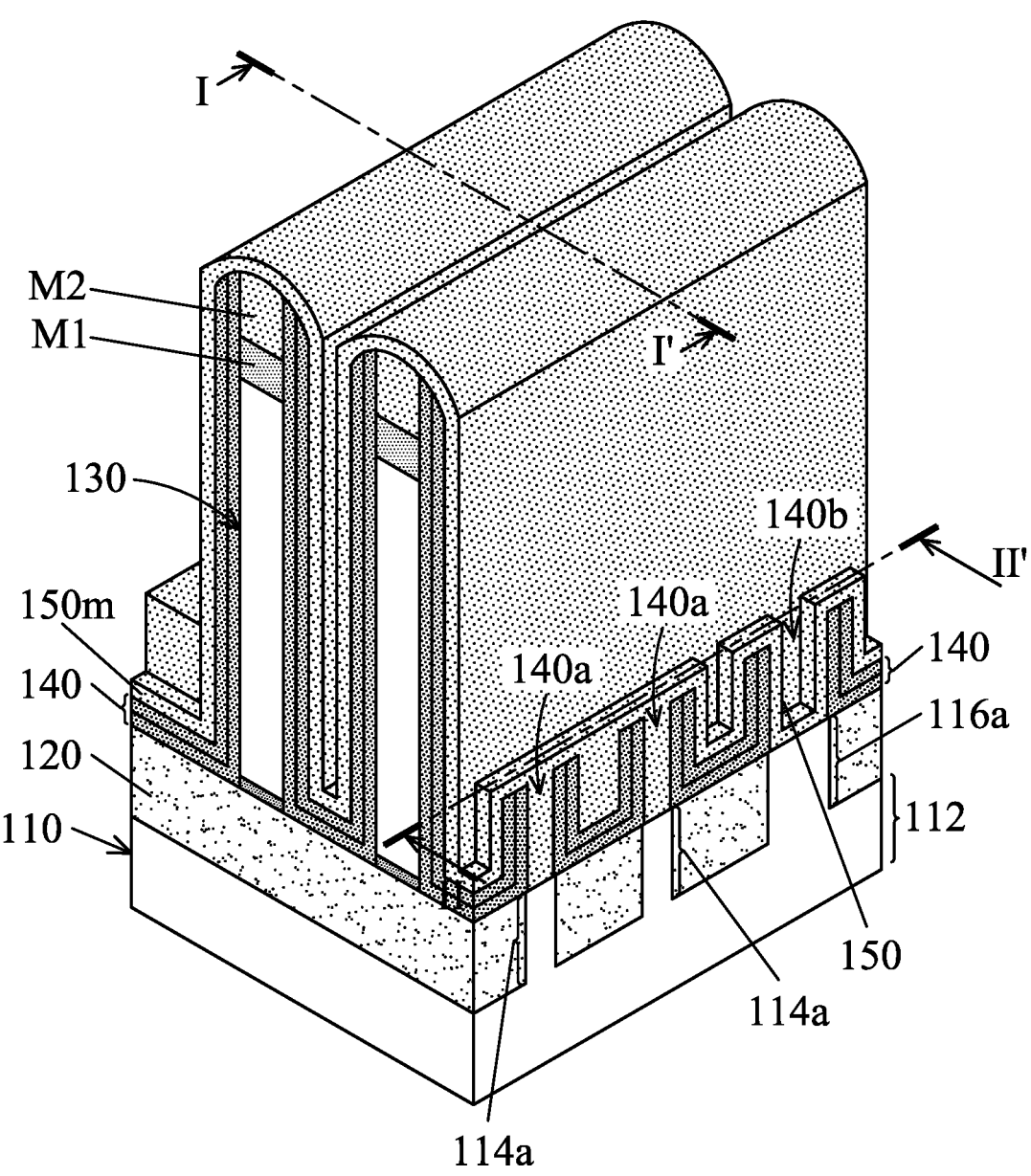
Figures 1, 1E:
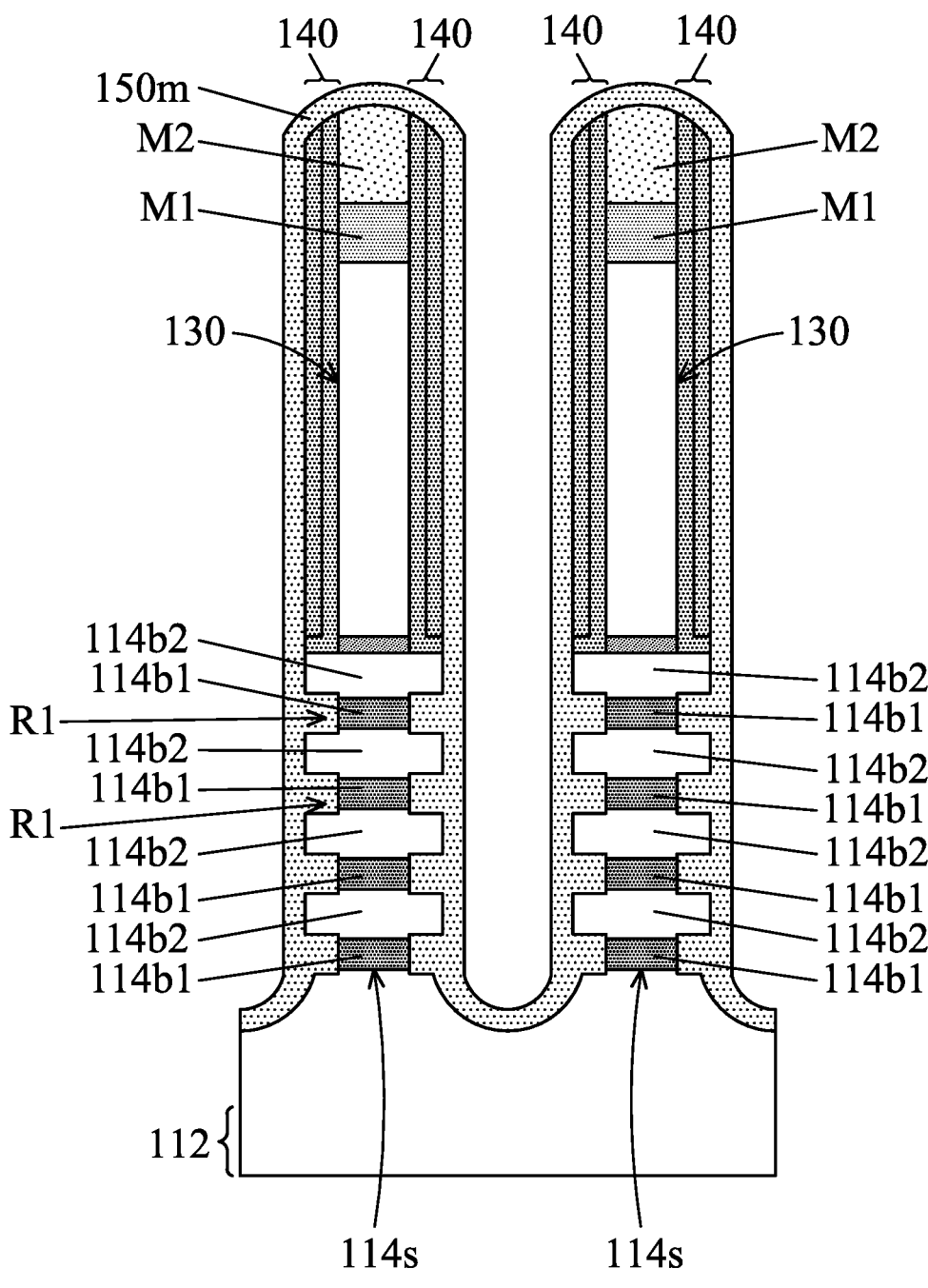
Figures 1, 1E, 2:
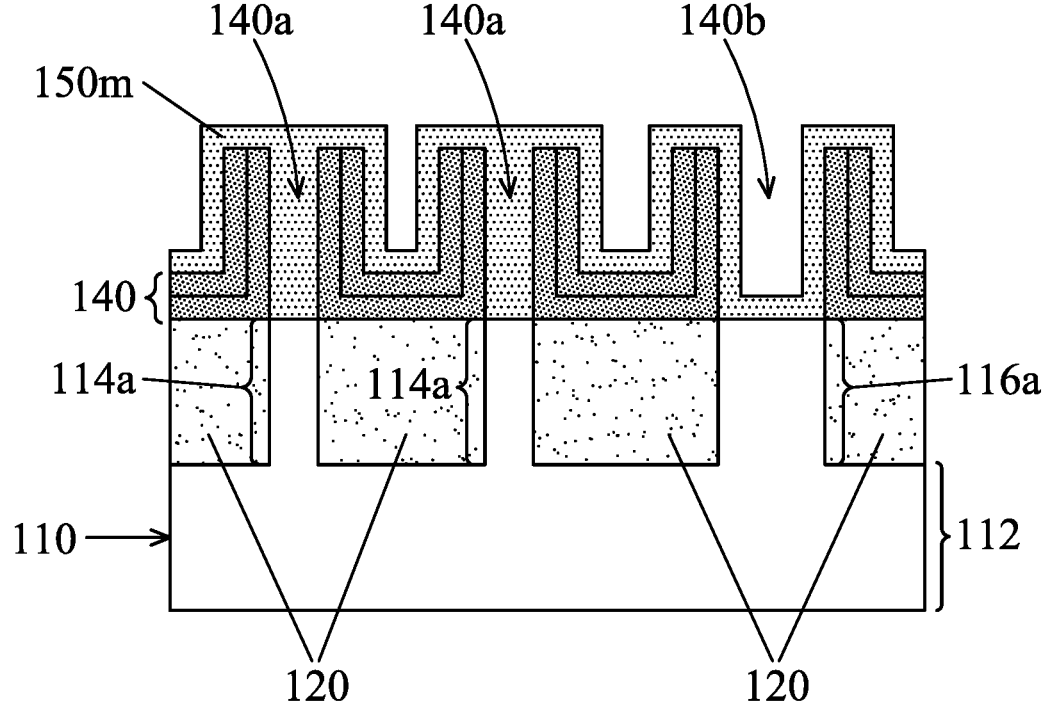
Figure 1F:
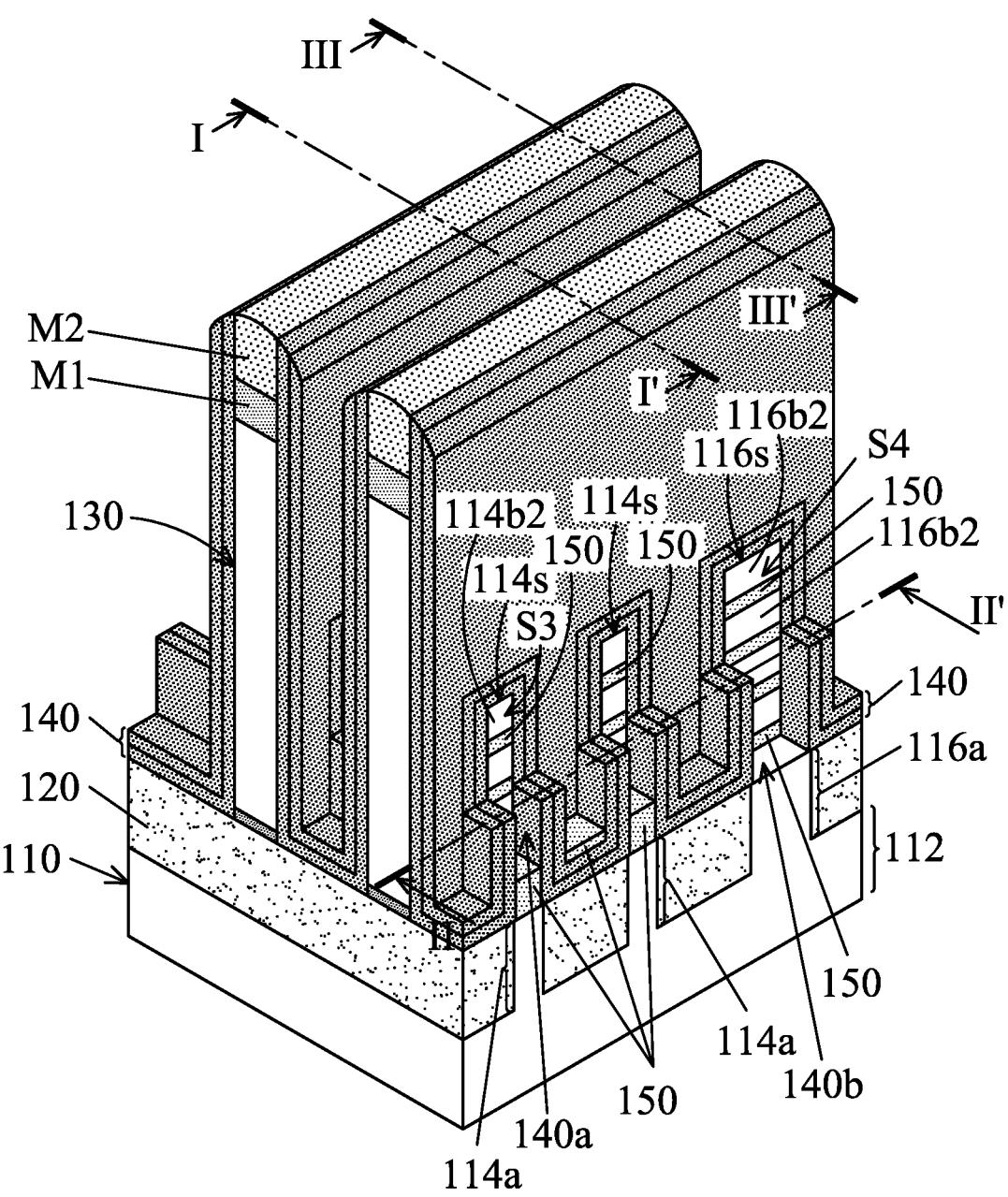
Figures 1, 1F:
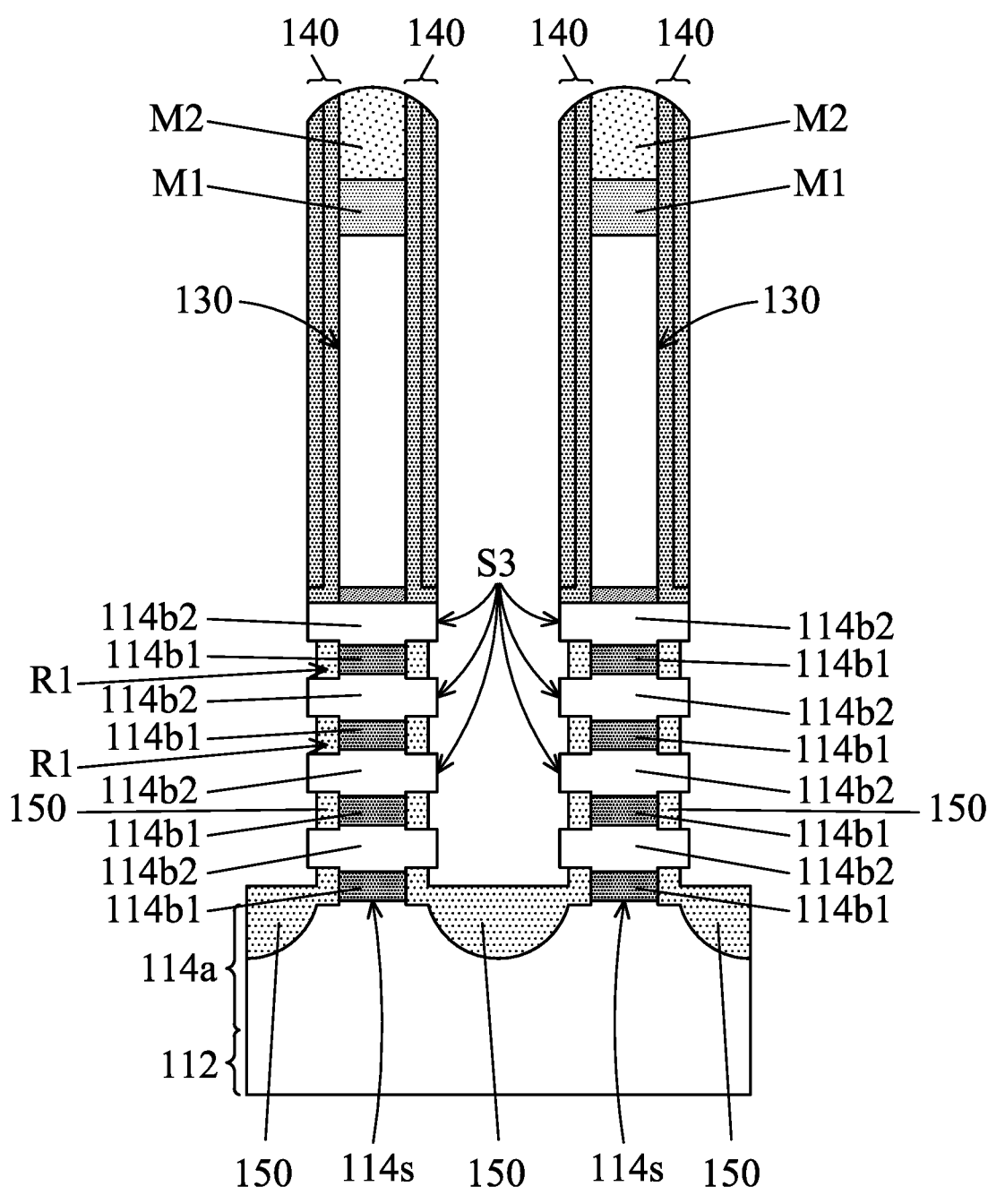
Figures 1, 1F, 2:
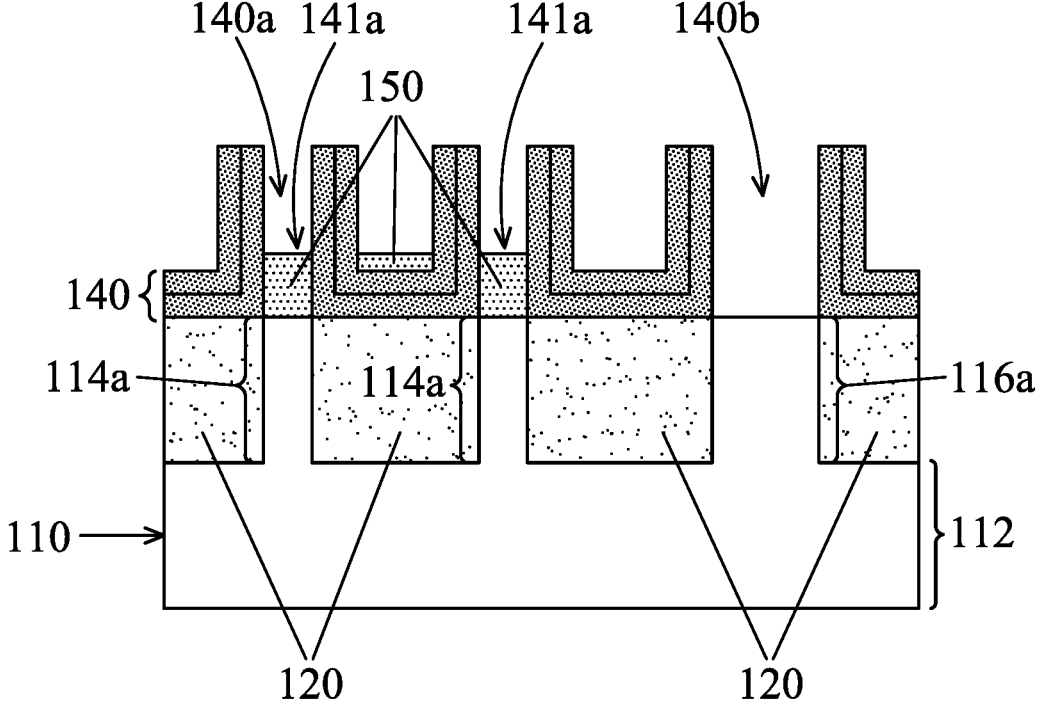
Figures 1, 1F, 2, 3:
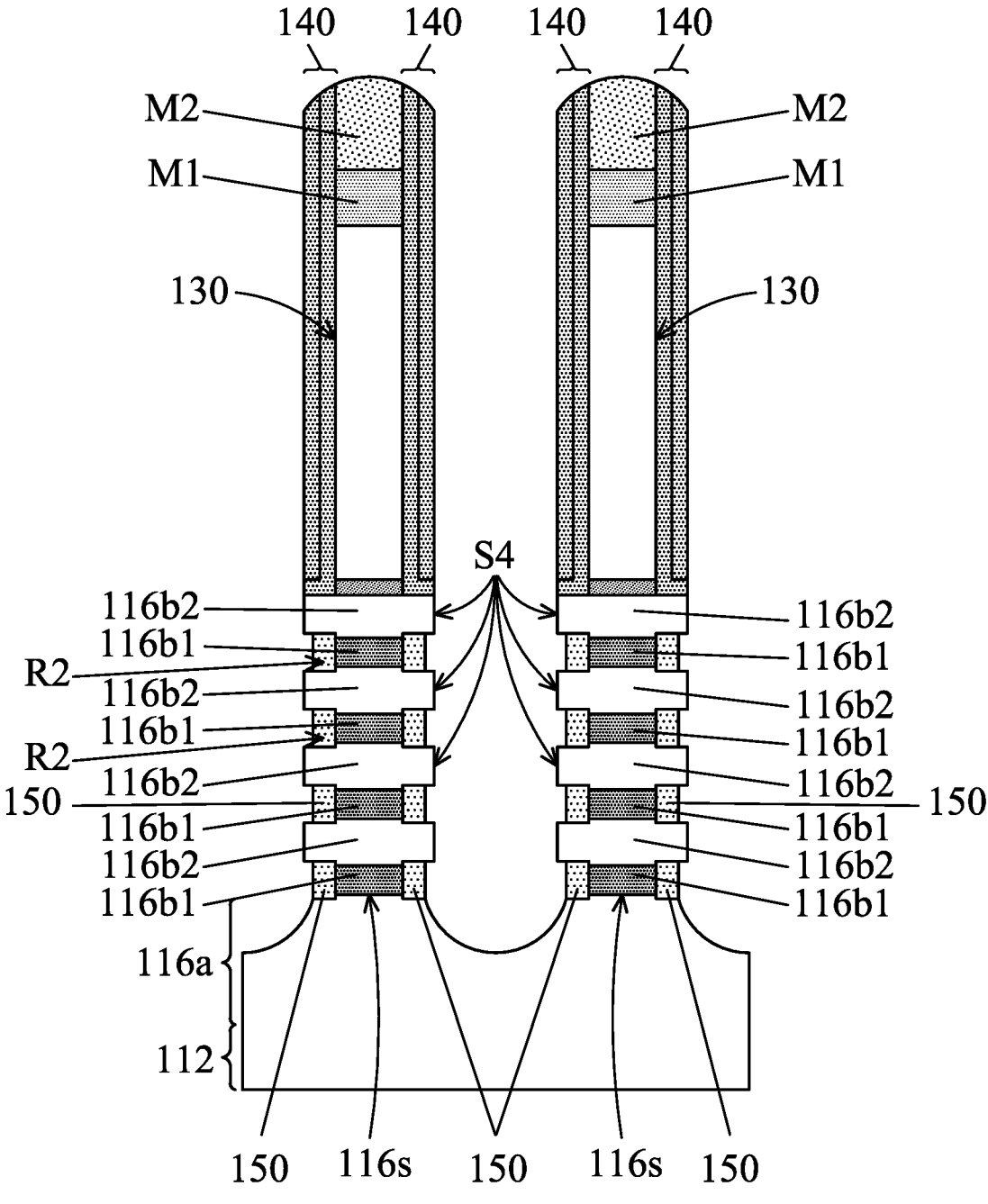
Figure 1G:
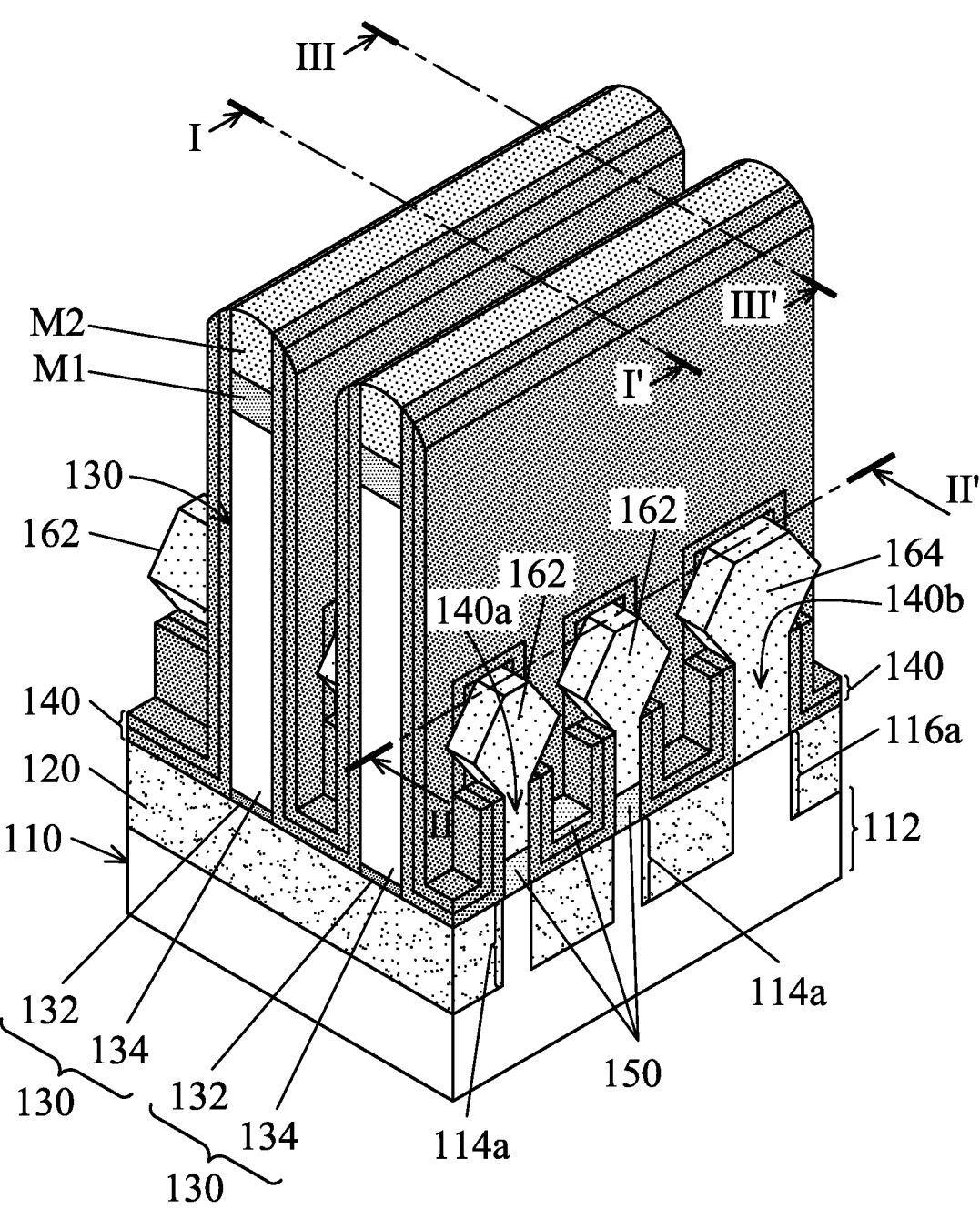
Figures 1, 1G:
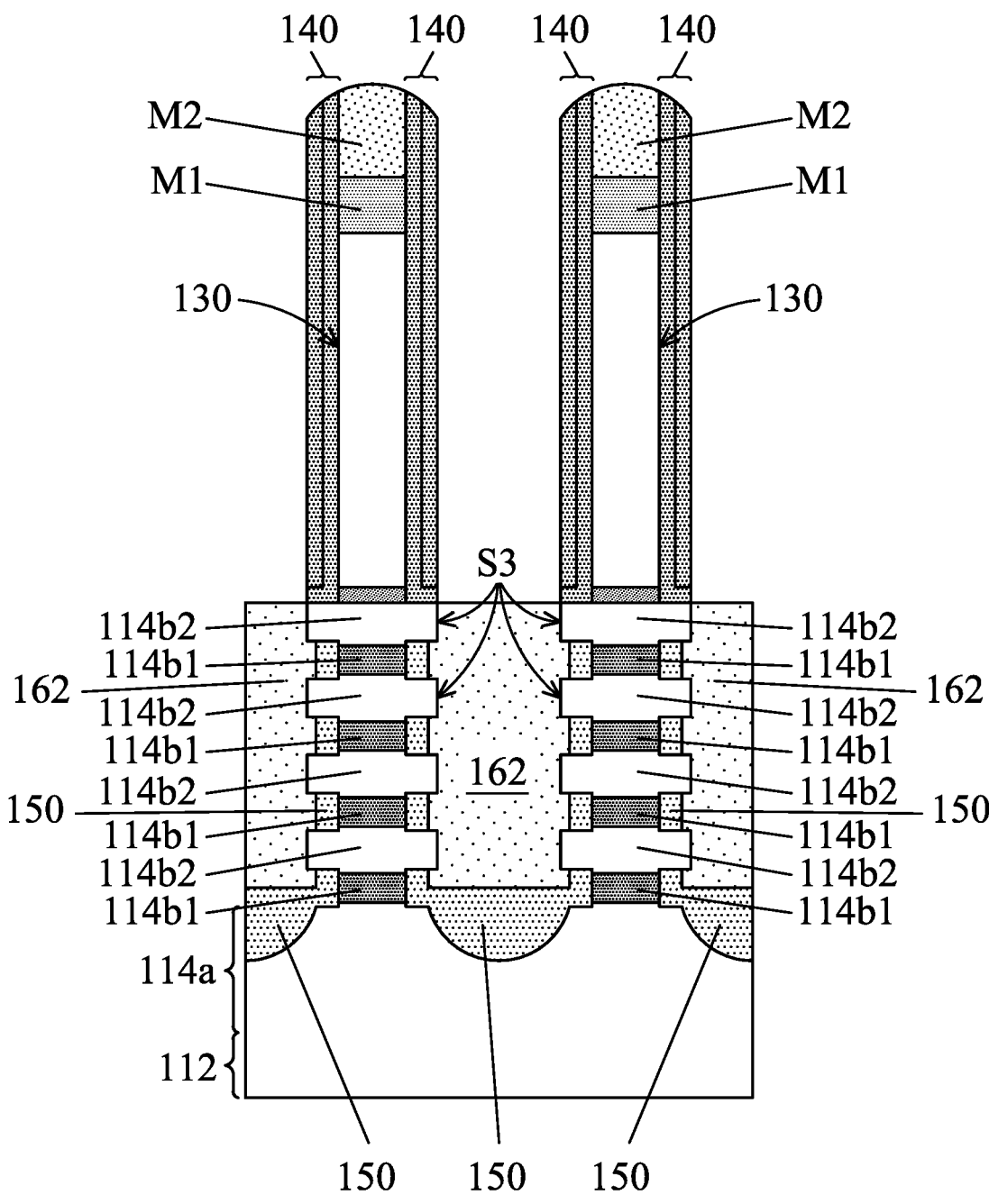
Figures 1, 1G, 2:
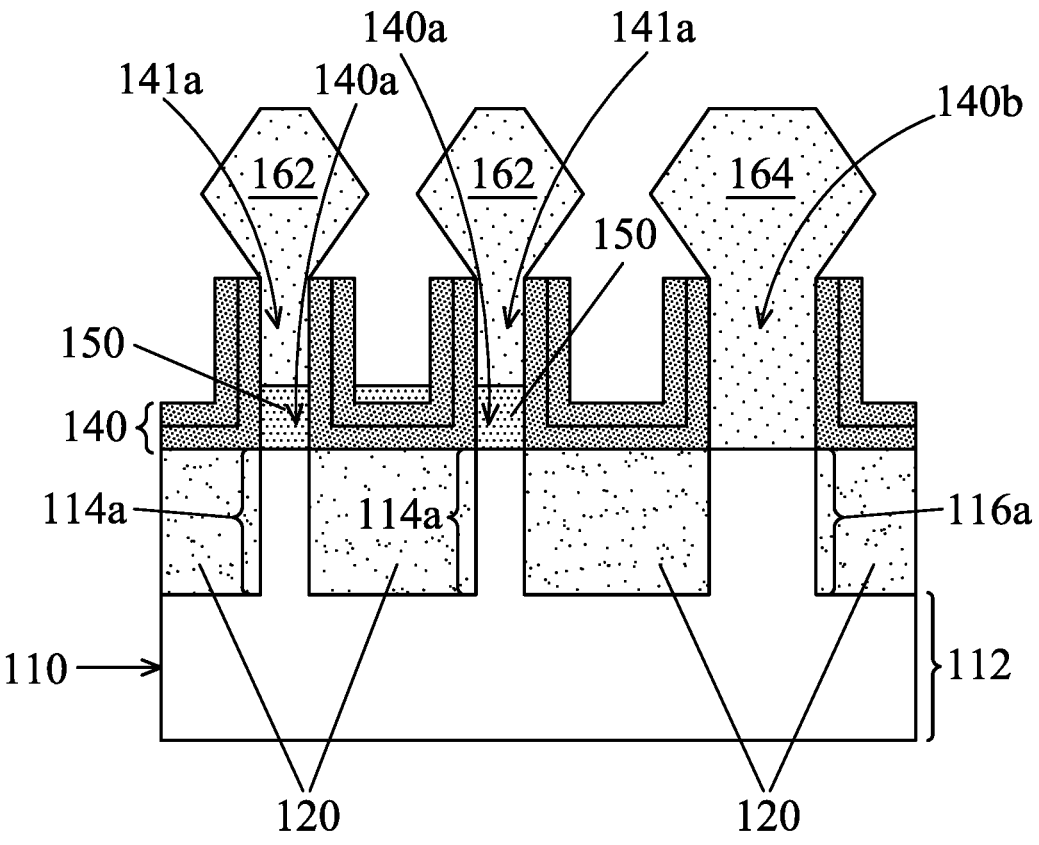
Figures 1, 1G, 2, 3:
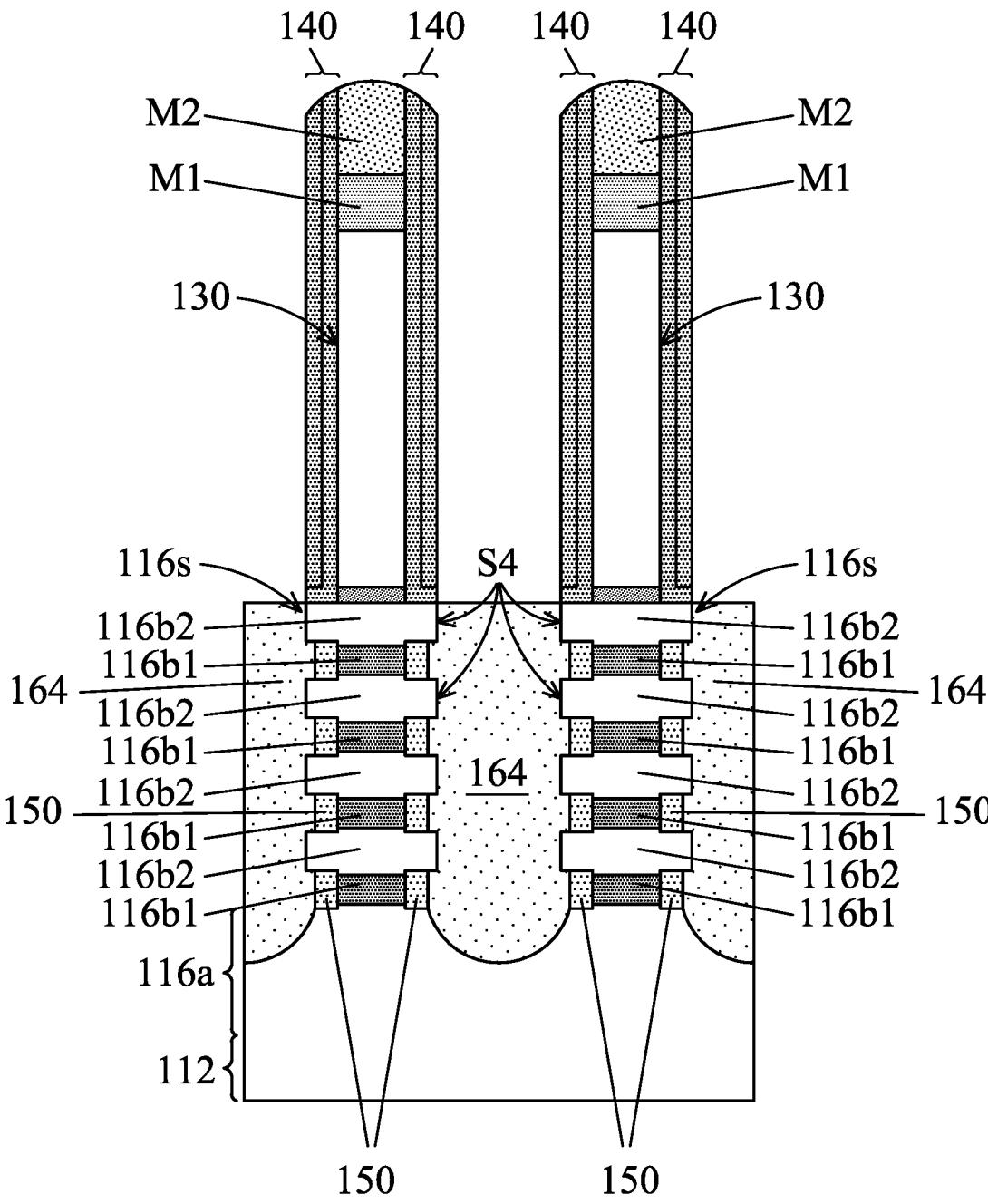
Figure 1H:
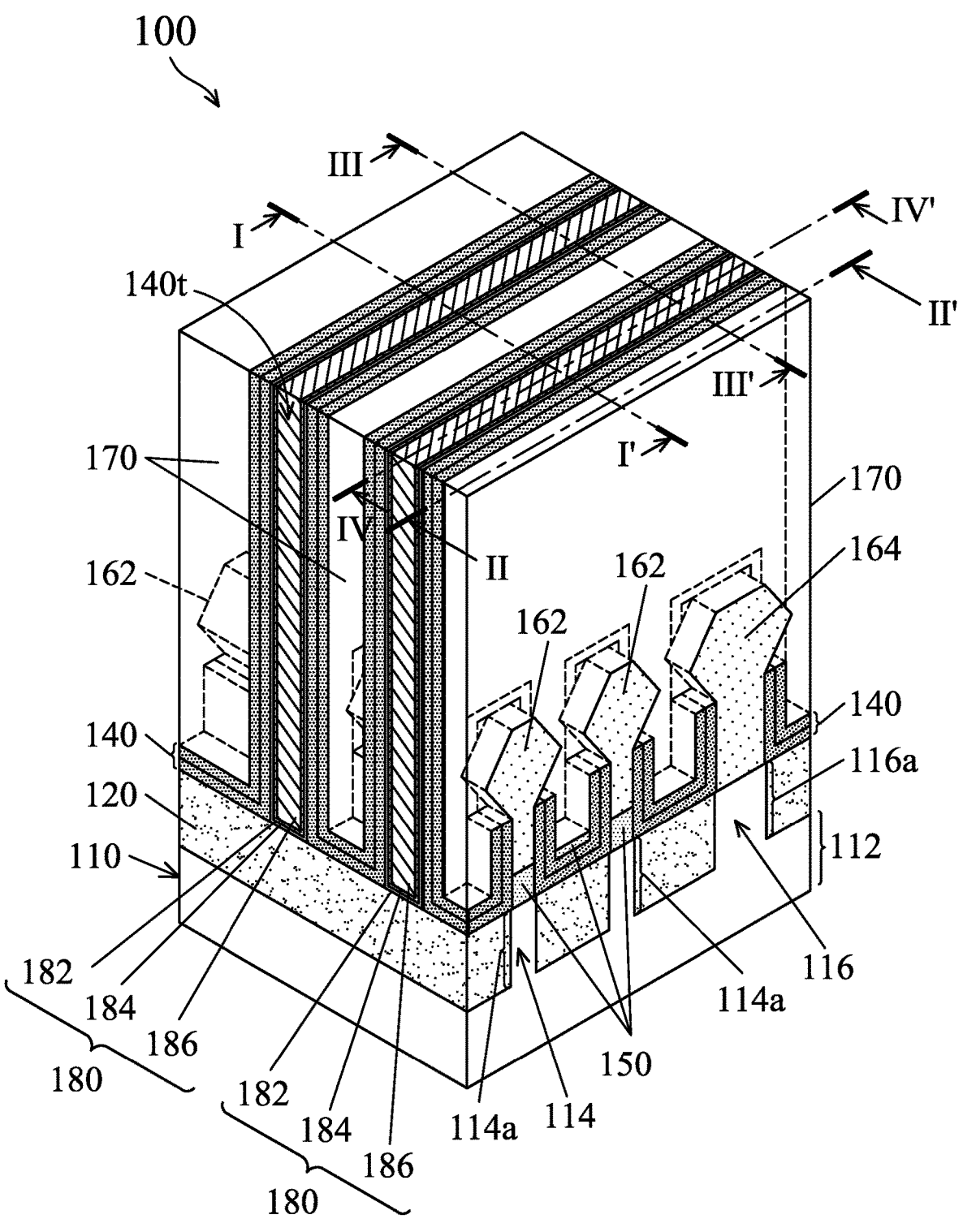
Figures 1, 1H:
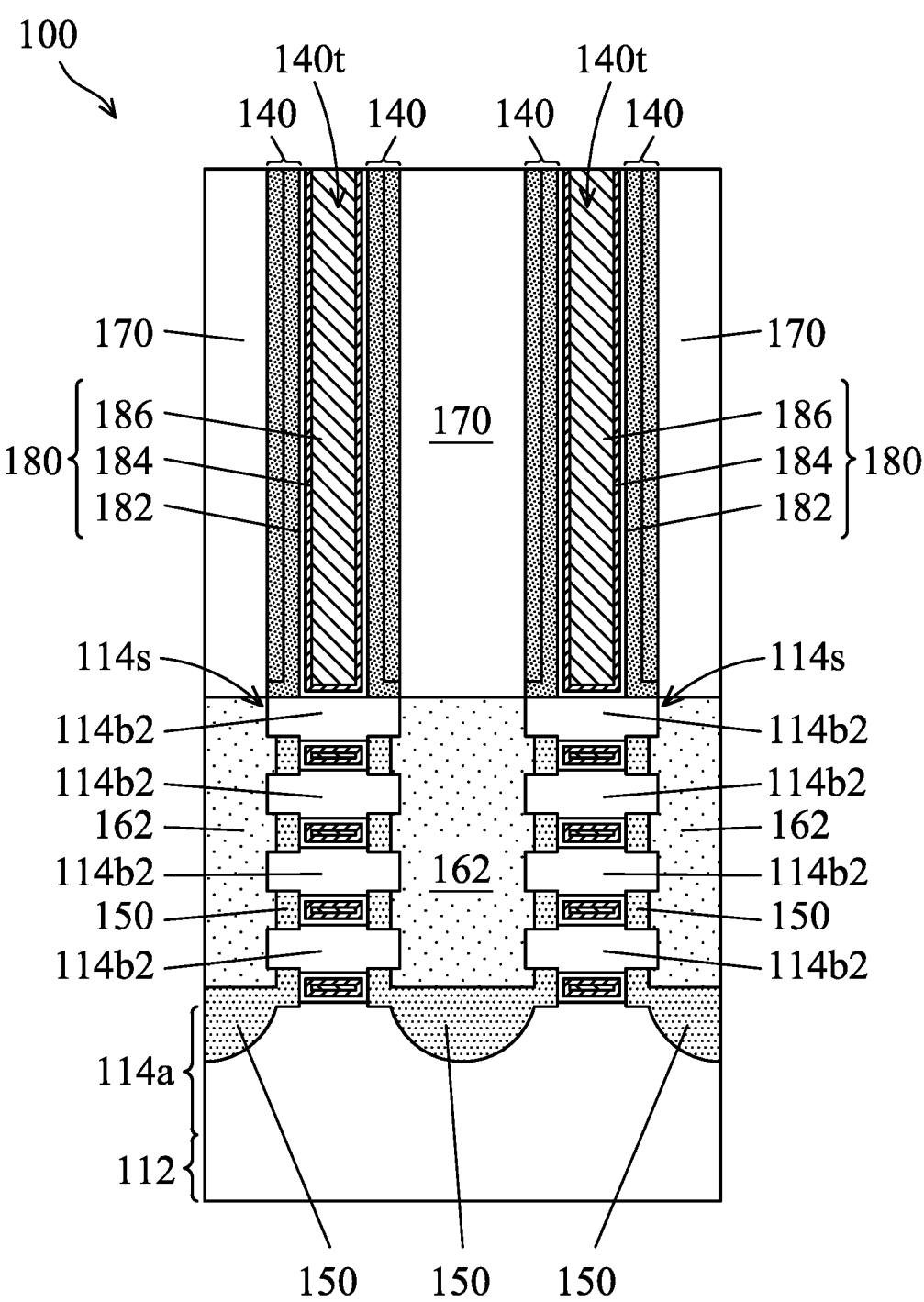
Figures 1, 1H, 2:
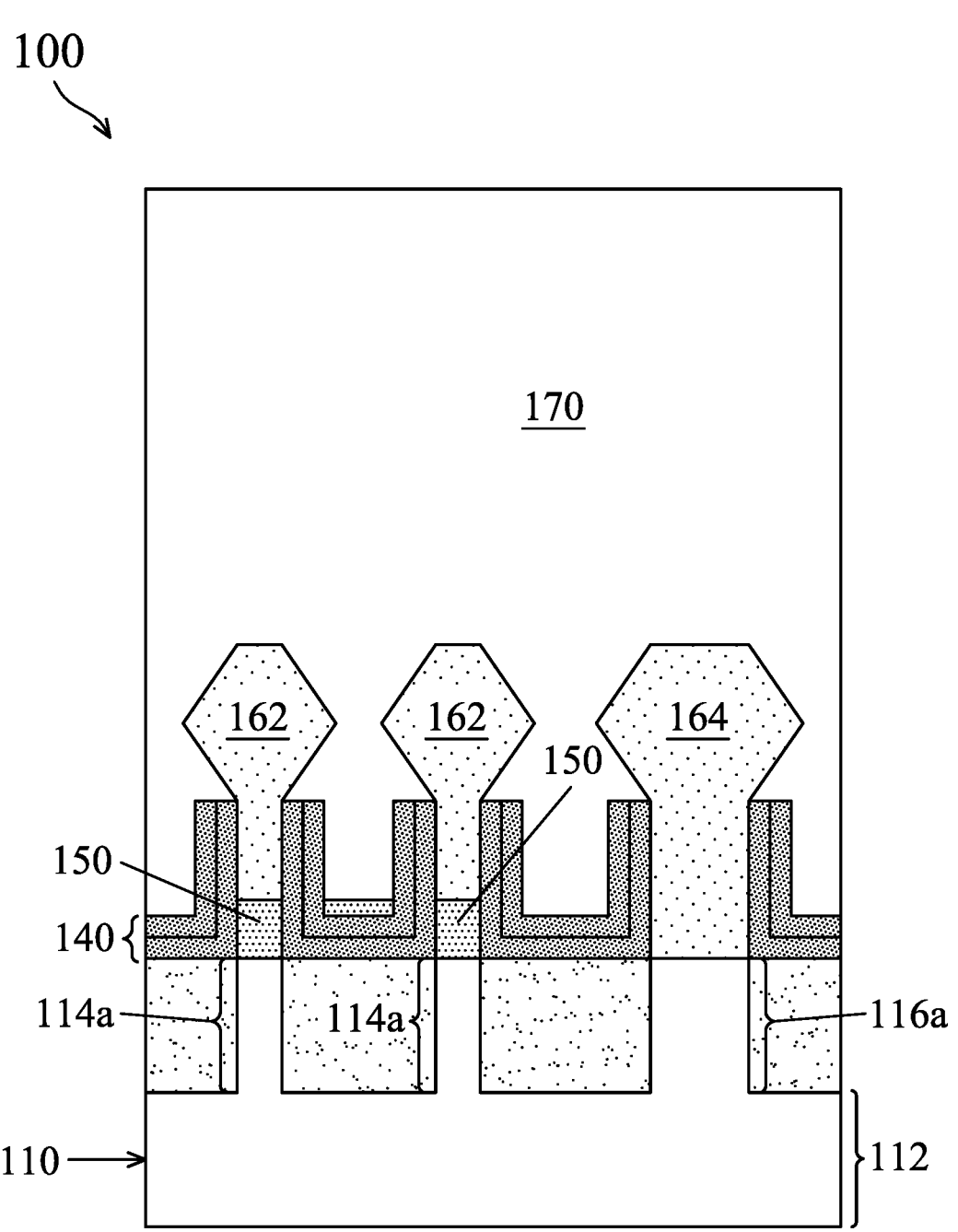
Figures 1, 1H, 2, 3:
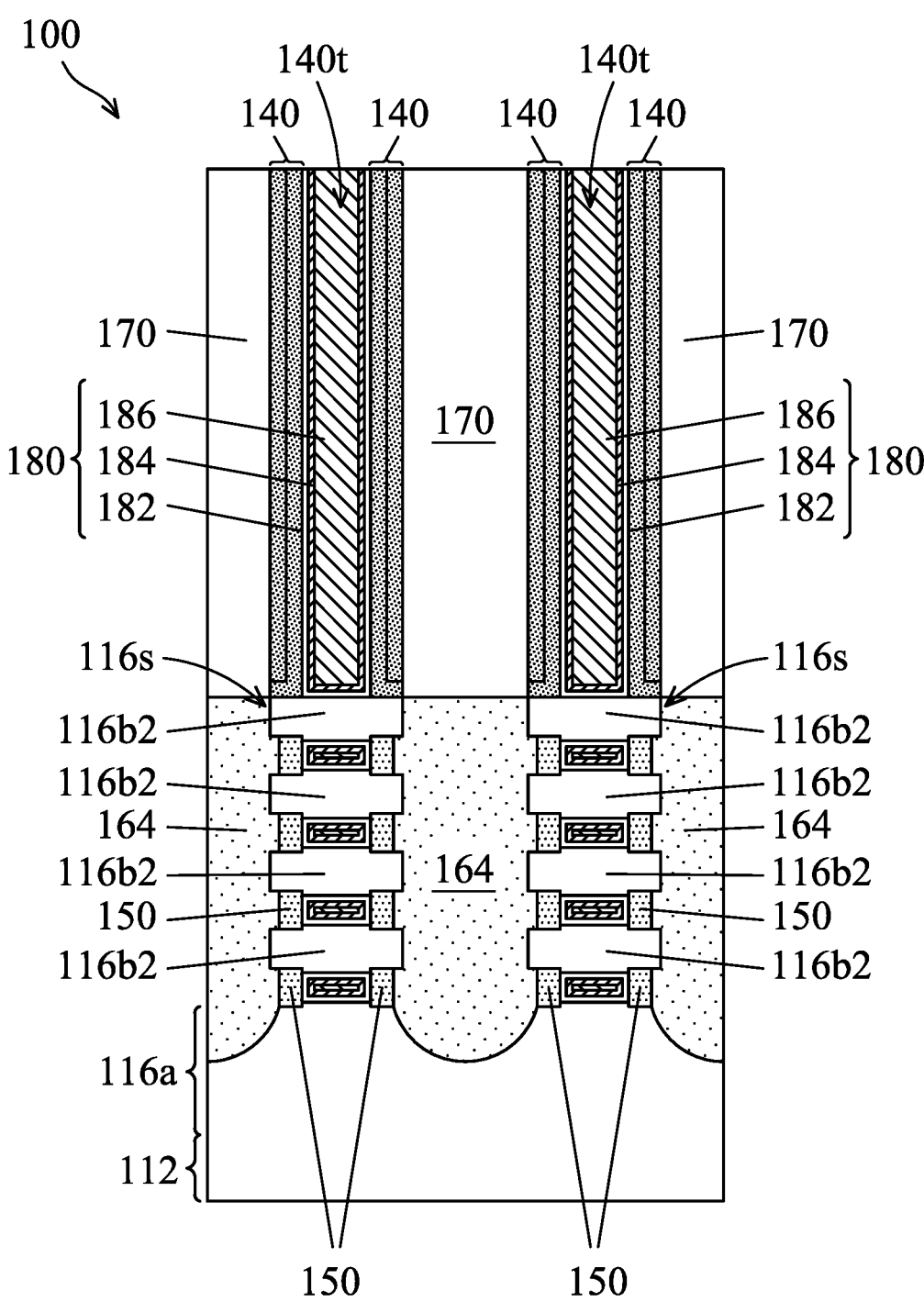
Figures 1, 1H, 2, 3, 4:
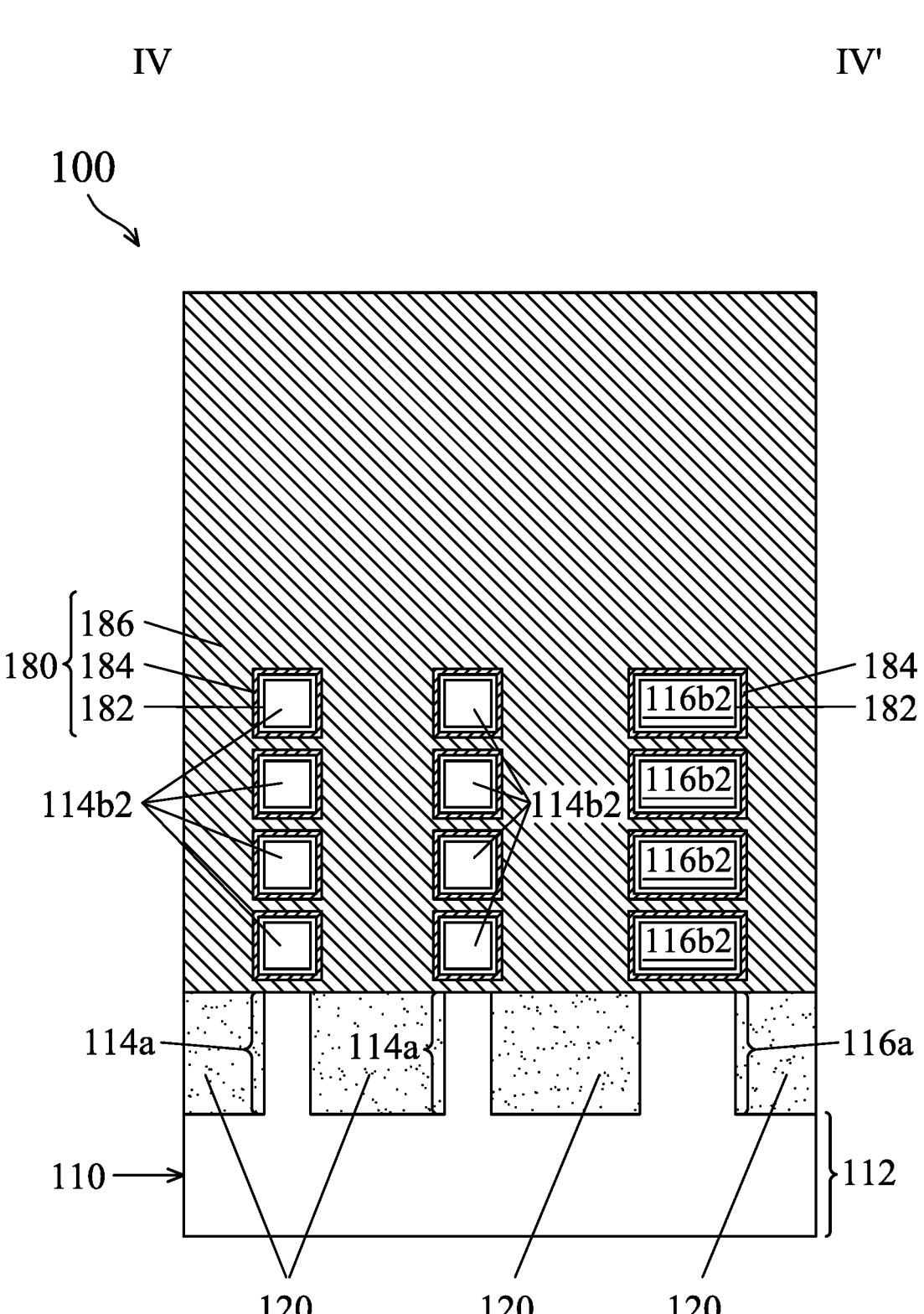

FIGS. 1A-1H are perspective views of various stages of a process for forming a semiconductor device structure, in accordance with some embodiments. FIGS. 1A-1 to 1H-1 are cross-sectional views illustrating the semiconductor device structure along the sectional line I-I' in FIGS. 1A-1H, in accordance with some embodiments. FIGS. 1A-2 to 1H-2 are cross-sectional views illustrating the semiconductor device structure along the sectional line II-II' in FIGS. 1A-1H, in accordance with some embodiments.

FIG. 1A-3 is a top view of the semiconductor device structure of FIG. 1A, in accordance with some embodiments. FIG. 1A-1 is a cross-sectional view illustrating the semiconductor device structure along the sectional line I-I' in FIG. 1A-3, in accordance with some embodiments. FIG. 1A-2 is a cross-sectional view illustrating the semiconductor device structure along the sectional line II-II' in FIGS. 1A-3, in accordance with some embodiments.

As shown in FIGS. 1A, 1A-1, 1A-2, and 1A-3, a substrate 110 is provided, in accordance with some embodiments. The substrate 110 has a base 112 and fin structure 114 and 116, in accordance with some embodiments. The base 112 includes, for example, a semiconductor substrate. The semiconductor substrate includes, for example, a semiconductor wafer (such as a silicon wafer) or a portion of a semiconductor wafer. In some embodiments, the base 112 is made of an elementary semiconductor material including silicon or germanium in a single crystal, polycrystal, or amorphous structure.

In some other embodiments, the base 112 is made of a compound semiconductor, such as silicon carbide, gallium arsenide, gallium phosphide, indium phosphide, and/or indium arsenide, an alloy semiconductor, such as SiGe and/or GaAsP, or a combination thereof. The base 112 may also include multi-layer semiconductors, semiconductor on insulator (SOI) (such as silicon on insulator or germanium on insulator), or a combination thereof.

In some embodiments, the base 112 is a device wafer that includes various device elements. In some embodiments, the various device elements are formed in and/or over the base 112. The device elements are not shown in figures for the purpose of simplicity and clarity. Examples of the various device elements include active devices, passive devices, other suitable elements, or a combination thereof. The active devices may include transistors or diodes (not shown). The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the base 112. The isolation features are used to define active regions and electrically isolate various device elements formed in and/or over the base 112 in the active regions. In some embodiments, the isolation features include shallow trench isolation (STI) features, local oxidation of silicon (LOCOS) features, other suitable isolation features, or a combination thereof.

The fin structures 114 and 116 are over the base 112, in accordance with some embodiments. The fin structure 116 is wider than the fin structure 114, in accordance with some embodiments. The fin structure 114 has a width W1, in accordance with some embodiments. The fin structure 116 has a width W2, in accordance with some embodiments. In some embodiments, a ratio (W2/W1) of the width W2 to the width W1 is greater than about 2. The ratio (W2/W1) ranges from about 2 to about 20, in accordance with some embodiments.

Each fin structure 114 includes a bottom portion 114$a$ and a multilayer stack 114$b$, in accordance with some embodiments. The multilayer stack 114$b$ is over the bottom portion 114$a$, in accordance with some embodiments. The multilayer stack 114$b$ includes sacrificial layers 114$b$1 and channel layers 114$b$2, in accordance with some embodiments. The sacrificial layers 114$b$1 and the channel layers 114$b$2 are alternately arranged as illustrated in FIG. 1A, in accordance with some embodiments.

It should be noted that, for the sake of simplicity, FIG. 1A shows four layers of the sacrificial layers 114$b$1 and four layers of the channel layers 114$b$2 for illustration, but does not limit the invention thereto. In some embodiments, the number of the sacrificial layers 114$b$1 or the channel layers 114$b$2 is between 2 and 10.

The sacrificial layers 114$b$1 are made of a first material, such as a first semiconductor material, in accordance with some embodiments. The channel layers 114$b$2 are made of a second material, such as a second semiconductor material, in accordance with some embodiments.

The first material is different from the second material, in accordance with some embodiments. The first material has an etch selectivity with respect to the second material, in accordance with some embodiments. In some embodiments, the sacrificial layers 114$b$1 are made of SiGe, and the channel layers 114$b$2 are made of Si.

In some other embodiments, the sacrificial layers 114$b$1 or the channel layers 114$b$2 are made of other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof.

The channel layers 114b2, the bottom portion 114a, and the base 112 are made of the same material such as Si, and the sacrificial layers 114b1 and the bottom portion 114a (or the base 112) are made of different materials, in accordance with some embodiments. In some other embodiments, the sacrificial layers 114b1, the channel layers 114b2, and the bottom portion 114a (or the base 112) are made of different materials, in accordance with some embodiments. The sacrificial layers 114b1 and the channel layers 114b2 are formed using a molecular beam epitaxy (MBE) process, a metal-organic chemical vapor deposition (MOCVD) process, and/ or another suitable epitaxial growth process.

Each fin structure 116 includes a bottom portion 116a and a multilayer stack 116b, in accordance with some embodiments. The multilayer stack 116b is over the bottom portion 116a, in accordance with some embodiments. The multilayer stack 116b includes sacrificial layers 116b1 and channel layers 116b2, in accordance with some embodiments. The sacrificial layers 116b1 and the channel layers 116b2 are alternately arranged as illustrated in FIG. 1A, in accordance with some embodiments.

It should be noted that, for the sake of simplicity, FIG. 1A shows four layers of the sacrificial layers 116b1 and four layers of the channel layers 116b2 for illustration, but does not limit the invention thereto. In some embodiments, the number of the sacrificial layers 116b1 or the channel layers 116b2 is between 2 and 10.

The sacrificial layers 116b1 are made of a first material, such as a first semiconductor material, in accordance with some embodiments. The channel layers 116b2 are made of a second material, such as a second semiconductor material, in accordance with some embodiments.

The first material is different from the second material, in accordance with some embodiments. The first material has an etch selectivity with respect to the second material, in accordance with some embodiments. In some embodiments, the sacrificial layers 116b1 are made of SiGe, and the channel layers 116b2 are made of Si.

In some other embodiments, the sacrificial layers 116b1 or the channel layers 116b2 are made of other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof.

The channel layers 116b2, the bottom portion 116a, and the base 112 are made of the same material such as Si, and the sacrificial layers 116b1 and the bottom portion 116a (or the base 112) are made of different materials, in accordance with some embodiments. In some other embodiments, the sacrificial layers 116b1, the channel layers 116b2, and the bottom portion 116a (or the base 112) are made of different materials, in accordance with some embodiments. The sacrificial layers 114b1 and 116b1 are made of the same material such as SiGe, in accordance with some embodiments. The channel layers 114b2 and 116b2 are made of the same material such as Si, in accordance with some embodiments.

The sacrificial layers 116b1 and the channel layers 116b2 are formed using a molecular beam epitaxy (MBE) process, a metal-organic chemical vapor deposition (MOCVD) process, and/or another suitable epitaxial growth process.

As shown in FIG. 1A, a dielectric layer 120 is formed over the base 112, in accordance with some embodiments. The dielectric layer 120 is made of oxide (such as silicon oxide), fluorosilicate glass (FSG), a low-k dielectric material, and/or another suitable dielectric material. The dielectric layer 120 may be formed by an atomic layer deposition (ALD) process, a chemical vapor deposition (CVD) process, or another applicable process.

As shown in FIGS. 1A, 1A-1, and 1A-3, gate stacks 130 and mask layers M1 and M2 are formed over the fin structures 114 and 116 and the dielectric layer 120, in accordance with some embodiments. The gate stacks 130 wrap around upper portions (i.e., the multilayer stacks 114b and 116b) of the fin structures 114 and 116, in accordance with some embodiments.

Each gate stack 130 includes a gate dielectric layer 132 and a gate electrode 134, in accordance with some embodiments. The gate dielectric layer 132, the gate electrode 134, and the mask layers M1 and M2 are sequentially stacked over the fin structures 114 and 116, in accordance with some embodiments.

The gate dielectric layer 132 conformally covers the fin structures 114 and 116 and the dielectric layer 120, in accordance with some embodiments. The gate dielectric layer 132 is made of an insulating material, such as oxide (e.g., silicon oxide), in accordance with some embodiments. The gate electrode 134 is made of a semiconductor material (e.g. polysilicon) or a conductive material (e.g., metal or alloy), in accordance with some embodiments.

The formation of the gate dielectric layer 132 and the gate electrode 134 includes: depositing a gate dielectric material layer (not shown) over the fin structures 114 and 116 and the dielectric layer 120; depositing a gate electrode material layer (not shown) over the gate dielectric material layer; sequentially forming the mask layers M1 and M2 over the gate electrode material layer, wherein the mask layers M1 and M2 expose portions of the gate electrode material layer; and removing the exposed portions of the gate electrode material layer and the gate dielectric material layer thereunder, in accordance with some embodiments.

In some embodiments, the mask layer M1 serves a buffer layer or an adhesion layer that is formed between the underlying gate electrode 134 and the overlying mask layer M2. The mask layer M1 may also be used as an etch stop layer when the mask layer M2 is removed or etched.

In some embodiments, the mask layer M1 is made of an oxide-containing insulating material (e.g., silicon oxide), a nitride-containing insulating material (e.g., silicon nitride, silicon oxynitride, silicon oxycarbonitride, or silicon carbonitride), or a metal oxide material (e.g., aluminum oxide).

In some embodiments, the mask layer M1 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the mask layer M2 is made of an oxide-containing insulating material (e.g., silicon oxide), a nitride-containing insulating material (e.g., silicon nitride, silicon oxynitride, silicon oxycarbonitride, or silicon carbonitride), silicon carbide, or a metal oxide material (e.g., aluminum oxide). The mask layers M1 and M2 are made of different materials, in accordance with some embodiments.

In some embodiments, the mask layer M2 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After the formation of the mask layer M1 and the mask layer M2, the mask layer M1 and the overlying mask layer M2 are patterned by a photolithography process and an etching process, so as to expose the portions of the gate electrode material layer.

As shown in FIGS. 1B, 1B-1, and 1B-2, a spacer layer 140 is conformally formed over the fin structures 114 and 116, the dielectric layer 120, the gate stacks 130, and the mask layers M1 and M2, in accordance with some embodiments. In some embodiments, as shown in FIG. 1B, the spacer layer 140 is a multi-layered structure.

The spacer layer 140 includes layers 142 and 144, in accordance with some embodiments. The layer 144 is over the layer 142, in accordance with some embodiments. The layers 142 and 144 are made of different materials, in accordance with some embodiments. In some other embodiments (not shown), the spacer layer 140 is a single-layered structure.

In some embodiments, the layer 142 or 144 is made of an oxide-containing insulating material, such as silicon oxide. In some other embodiments, the layer 142 or 144 is made of a nitride-containing insulating material, such as silicon nitride (SiN), silicon oxynitride (SiON), silicon oxycarbonitride (SiOCN), or silicon carbonitride (SiCN). The layers 142 and 144 are formed using a deposition process, such as a chemical vapor deposition (CVD) process, an atomic layer deposition (ALD) process, or a physical vapor deposition (PVD) process, in accordance with some embodiments.

As shown in FIGS. 1B, 1C, 1C-1, and 1C-2, portions of the spacer layer 140 and the multilayer stacks 114b and 116b, which are not covered by the gate stacks 130 and the spacer layer 140 over sidewalls of the gate stacks 130, are removed, in accordance with some embodiments. After the removal process, the spacer layer 140 remains over opposite sidewalls of the gate stacks 130, opposite sidewalls of the mask layers M1 and M2, and the top surfaces 122 of the dielectric layer 120, in accordance with some embodiments. In some other embodiments (not shown), the spacer layer 140 over the top surfaces 122 is also removed.

The removal process forms recesses 114r and 116r in the fin structures 114 and 116, in accordance with some embodiments. Each multilayer structure 114b is divided into multilayer stacks 114s by the recesses 114r, in accordance with some embodiments. Each multilayer stack 114s includes four layers of the sacrificial layers 114b1 and four layers of the channel layers 114b2, in accordance with some embodiments.

Each multilayer structure 116b is divided into multilayer stacks 116s by the recesses 116r, in accordance with some embodiments. Each multilayer stack 116s includes four layers of the sacrificial layers 116b1 and four layers of the channel layers 116b2, in accordance with some embodiments. The removal process for forming the recesses 114r and 116r includes an etching process, such as an anisotropic etching process (e.g., a dry etching process), in accordance with some embodiments.

The removal process forms recesses 140a and 140b in the spacer layer 140, in accordance with some embodiments. The recesses 140a are respectively over and respectively expose the bottom portions 114a of the fin structures 114, in accordance with some embodiments. The recesses 140b is over and exposes the bottom portion 116a of the fin structure 116, in accordance with some embodiments. The recess 140a is narrower than the recess 140b, in accordance with some embodiments.

As shown in FIGS. 1D, 1D-1, and 1D-2, portions of the sacrificial layers 114b1 are removed from sidewalls S1 of the sacrificial layers 114b1 to form recesses R1 in the multilayer stacks 114s, in accordance with some embodiments. Each recess R1 is surrounded by the corresponding sacrificial layer 114b1 and the corresponding channel layers 114b2, in accordance with some embodiments.

As shown in FIG. 1D, portions of the sacrificial layers 116b1 are removed from sidewalls S2 of the sacrificial layers 116b1 to form recesses R2 in the multilayer stacks 116s, in accordance with some embodiments. Each recess R2 is surrounded by the corresponding sacrificial layer 116b1 and the corresponding channel layers 116b2, in accordance with some embodiments. The removal process of the sacrificial layers 114b1 and 116b1 includes an etching process, such as an isotropic etching process (e.g., a dry etching process or a wet etching process), in accordance with some embodiments.

As shown in FIGS. 1D, 1E, 1E-1, and 1E-2, an inner spacer material layer 150m is formed in the recesses 140a, 140b, R1 and R2, in accordance with some embodiments. Since the recess 140a is narrower than the recess 140b, the recesses 140a are filled with the inner spacer material layer 150m, and the inner spacer material layer 150m conformally covers inner walls and a bottom surface of the recess 140b, in accordance with some embodiments.

The inner spacer material layer 150m and the spacer layer 140 are made of different materials. In some embodiments, the inner spacer material layer 150m is made of an oxide-containing insulating material, such as silicon oxide. In some other embodiments, the inner spacer material layer 150m is made of a nitride-containing insulating material, such as silicon nitride (SiN), silicon oxynitride (SiON), silicon oxycarbonitride (SiOCN), or silicon carbonitride (SiCN). The inner spacer material layer 150m is formed using a deposition process, such as a chemical vapor deposition process or a physical vapor deposition process, in accordance with some embodiments.

FIG. 1F-3 is a cross-sectional view illustrating the semiconductor device structure along a sectional line in FIG. 1F, in accordance with some embodiments. As shown in FIGS. 1F, 1F-1, 1F-2, and 1F-3, the inner spacer material layer 150m is partially removed, in accordance with some embodiments. The removal process removes the inner spacer material layer 150m covering the bottom portion 116a and sidewalls S3 and S4 of the channel layers 114b2 and 116b2, in accordance with some embodiments.

The remaining inner spacer material layer 150m forms an inner spacer layer 150, in accordance with some embodiments. The inner spacer layer 150 is in the recesses 140a of the spacer layer 140 and the recesses R1 and R2 of the multilayer stacks 114s and 116s, in accordance with some embodiments. The inner spacer layer 150 is over the bottom portions 114a and the spacer layer 140, in accordance with some embodiments. As shown in FIG. 1F-2, there are recesses 141a surrounded by the inner spacer layer 150 and the spacer layer 140, in accordance with some embodiments.

FIG. 1G-3 is a cross-sectional view illustrating the semiconductor device structure along a sectional line III-III' in FIG. 1G, in accordance with some embodiments. As shown in FIGS. 1G, 1G-1, 1G-2, and 1G-3, stressors 162 and 164 are respectively formed over the spacer layer 150 and the bottom portion 116a, in accordance with some embodiments.

As shown in FIG. 1G-2, the stressor 162 is partially in the corresponding recess 141a, in accordance with some embodiments. The stressor 164 is partially in the recess 140b, in accordance with some embodiments. The stressor 164 is in direct contact with the bottom portion 116a, in accordance with some embodiments.

Since the spacer layer 140 originally over sidewalls of the multilayer stacks 114b and 116b (as shown in FIG. 1B-2) remains during forming the stressors 162 and 164 (as shown in FIG. 1G-2), the remaining spacer layer 140 may constrain the size (e.g., the width) of the stressors 162 and 164 to avoid bridge between neighboring stressors 162 and 164, in accordance with some embodiments. Therefore, the yield of the stressors 162 and 164 is improved, in accordance with some embodiments.

In some embodiments, the stressors 162 and 164 are made of a semiconductor material (e.g., silicon germanium) with P-type dopants, such as the Group IIIA element, in accordance with some embodiments. The Group IIIA element includes boron or another suitable material.

In some other embodiments, the stressors 162 and 164 are made of a semiconductor material (e.g., silicon) with N-type dopants, such as the Group VA element, in accordance with some embodiments. The Group VA element includes phosphor (P), antimony (Sb), or another suitable Group VA material. The stressors 162 and 164 are formed using an epitaxial process, in accordance with some embodiments.

FIG. 1H-3 is a cross-sectional view illustrating the semiconductor device structure along a sectional line III-III' in FIG. 1H, in accordance with some embodiments. As shown in FIGS. 1H, 1H-1, 1H-2, and 1H-3, a dielectric layer 170 is formed over the stressors 162 and 164 and the spacer layer 140, in accordance with some embodiments. The dielectric layer 170 is made of an oxide-containing insulating material, such as silicon oxide, or a nitride-containing insulating material, such as silicon nitride, silicon oxynitride, silicon oxycarbonitride, or silicon carbonitride, in accordance with some embodiments.

As shown in FIGS. 1H, 1H-1, and 1H-3, the gate electrodes 134 are removed to form trenches 140t in the spacer layer 140, in accordance with some embodiments. The removal process includes an etching process, such as a wet etching process or a dry etching process, in accordance with some embodiments.

As shown in FIGS. 1H, 1H-1, and 1H-3, the gate dielectric layers 132 are removed through the trenches 140t, in accordance with some embodiments. The removal process includes an etching process, such as a wet etching process or a dry etching process, in accordance with some embodiments.

As shown in FIGS. 1H-1 and 1H-3, the sacrificial layers 114b1 and 116b1 are removed through the trenches 140t, in accordance with some embodiments. The removal process includes an etching process, such as a wet etching process or a dry etching process, in accordance with some embodiments.

As shown in FIGS. 1H, 1H-1, and 1H-3, gate stacks 180 are formed in the trenches 140t, in accordance with some embodiments. In this step, a semiconductor device structure 100 is substantially formed, in accordance with some embodiments. Each gate stack 180 includes a gate dielectric layer 182, a work function layer 184, and a gate electrode layer 186, in accordance with some embodiments.

The gate dielectric layer 182, the work function layer 184, and the gate electrode layer 186 are sequentially stacked over the channel layers 114b2 and 116b2, in accordance with some embodiments. The gate stack 180 wraps around the channel layers 114b2 and 116b2, in accordance with some embodiments.

Since the inner spacer layer 150 electrically insulates the stressors 162 thereover from the bottom portions 114a thereunder, the inner spacer layer 150 prevents current leakage between the stressors 162 and the bottom portions 114a, in accordance with some embodiments.

The current leakage is positively related to voltage across the stressors, the voltage across the stressors is positively related to the resistance of the channel layers, and the resistance of the channel layers is negatively related to the channel area. Since the fin structure 116 is wider than the fin structure 114, the channel layer 116b2 of the fin structure 116 is wider than the channel layer 114b2 of the fin structure 114 (as shown in FIG. 1H-4), and the channel area of the channel layer 116b2 is greater than that of the channel layer 114b2. Therefore, the voltage across the stressors 164 is less than the voltage across the stressors 162, in accordance with some embodiments. Therefore, the current leakage between the stressors 164 and the bottom portions 116a is significantly less than the current leakage between the stressors 162 and the bottom portions 114a, in accordance with some embodiments. As a result, even if there is no inner spacer layer 150 between the stressors 164 and the bottom portions 116a, the current leakage between the stressors 164 and the bottom portions 116a is very small and acceptable.

Figure 2A:
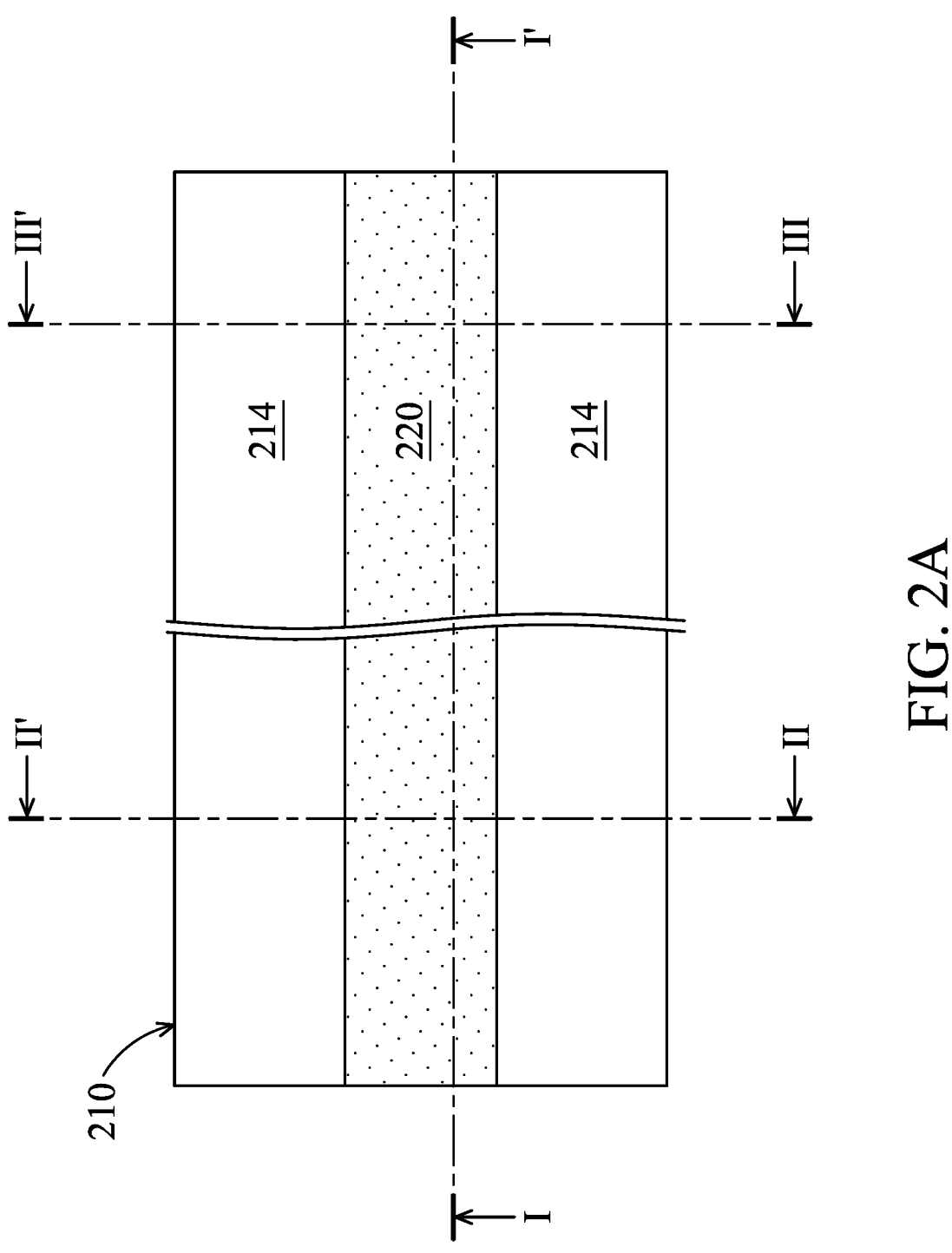
FIGS. 2A-2M are top views of various stages of a process for forming a semiconductor device structure, in accordance with some embodiments.
Figures 2, 2A, 3:
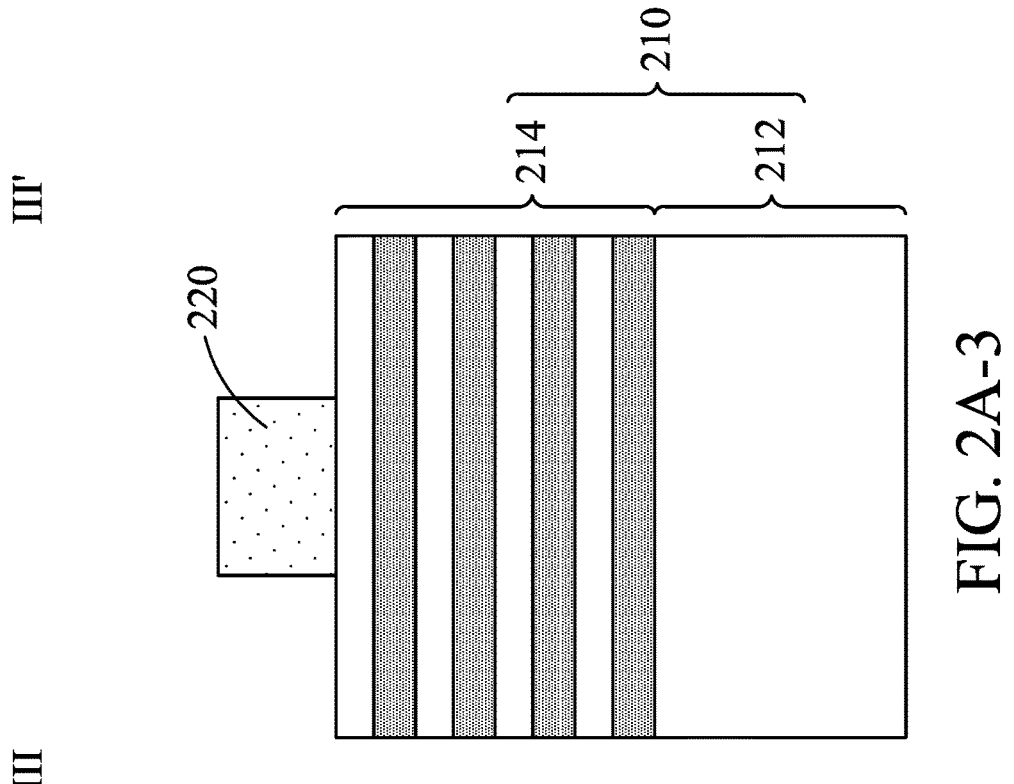
Figures 2, 2A:
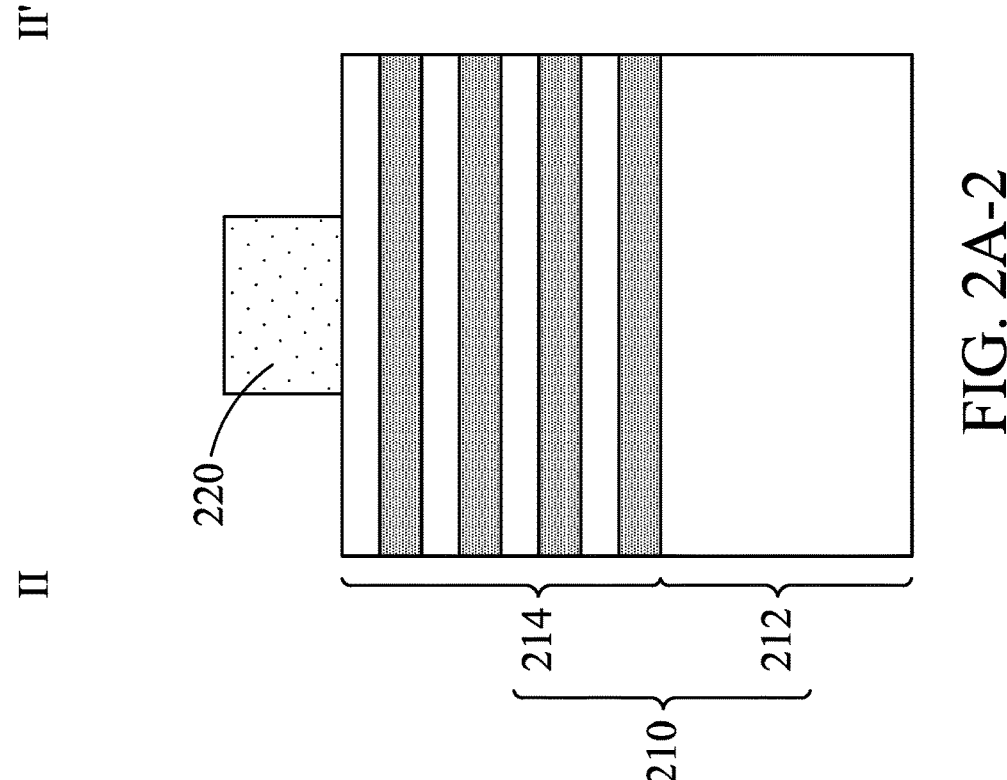

FIGS. 2A-2M are top views of various stages of a process for forming a semiconductor device structure, in accordance with some embodiments. FIGS. 2A-1 to 2M-1 are cross-sectional views illustrating the semiconductor device structure along the sectional line I-I' in FIGS. 2A-2M, in accordance with some embodiments. FIGS. 2A-2 to 2M-2 are cross-sectional views illustrating the semiconductor device structure along the sectional line II-II' in FIGS. 2A-2M, in accordance with some embodiments. FIGS. 2A-3 to 2M-3 are cross-sectional view illustrating the semiconductor device structure along a sectional line III-III' in FIGS. 2A-2M, in accordance with some embodiments.

As shown in FIGS. 2A, 2A-1, 2A-2, and 2A-3, a substrate 210 is provided, in accordance with some embodiments. The substrate 210 includes a lower portion 212 and a multilayer structure 214, in accordance with some embodiments. The multilayer structure 214 is formed over the lower portion 212, in accordance with some embodiments.

The lower portion 212 includes, for example, a semiconductor substrate. The semiconductor substrate includes, for example, a semiconductor wafer (such as a silicon wafer) or a portion of a semiconductor wafer. In some embodiments, the lower portion 212 is made of an elementary semiconductor material including silicon or germanium in a single crystal, polycrystal, or amorphous structure.

In some other embodiments, the lower portion 212 is made of a compound semiconductor, such as silicon carbide, gallium arsenide, gallium phosphide, indium phosphide, and/or indium arsenide, an alloy semiconductor, such as SiGe and/or GaAsP, or a combination thereof. The lower portion 212 may also include multi-layer semiconductors, semiconductor on insulator (SOI) (such as silicon on insulator or germanium on insulator), or a combination thereof.

In some embodiments, the lower portion 212 is a device wafer that includes various device elements. In some embodiments, the various device elements are formed in and/or over the lower portion 212. The device elements are not shown in figures for the purpose of simplicity and clarity. Examples of the various device elements include active devices, passive devices, other suitable elements, or a combination thereof. The active devices may include transistors or diodes (not shown). The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the lower portion 212. The isolation features are used to define active regions and electrically isolate various device elements formed in and/or over the lower portion 212 in the active regions. In some embodiments, the isolation features include shallow trench isolation (STI) features, local oxidation of silicon (LOCOS) features, other suitable isolation features, or a combination thereof.

The multilayer structure 214 includes sacrificial layers 214a and channel layers 214b, in accordance with some embodiments. The sacrificial layers 214a and the channel layers 214b are alternately arranged as illustrated in FIG. 2A-1, in accordance with some embodiments. It should be noted that, for the sake of simplicity, FIG. 2A-1 shows four layers of the sacrificial layers 214a and four layers of the channel layers 214b for illustration, but does not limit the invention thereto. In some embodiments, the number of the sacrificial layers 214a or the channel layers 214b is between 2 and 10.

The sacrificial layers 214a are made of a first material, such as a first semiconductor material, in accordance with some embodiments. The channel layers 214b are made of a second material, such as a second semiconductor material, in accordance with some embodiments.

The first material is different from the second material, in accordance with some embodiments. The first material has an etch selectivity with respect to the second material, in accordance with some embodiments. In some embodiments, the sacrificial layers 214a are made of SiGe, and the channel layers 214b are made of Si.

In some other embodiments, the sacrificial layers 214a or the channel layers 214b are made of other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof.

The channel layers 214b and the lower portion 212 are made of the same material such as Si, and the sacrificial layers 214a and the lower portion 212 are made of different materials, in accordance with some embodiments. In some other embodiments, the sacrificial layers 214a, the channel layers 214b, and the lower portion 212 are made of different materials, in accordance with some embodiments. The sacrificial layers 214a and the channel layers 214b are formed using a molecular beam epitaxy (MBE) process, a metal-organic chemical vapor deposition (MOCVD) process, and/or another suitable epitaxial growth process.

As shown in FIGS. 2A, 2A-1, 2A-2, and 2A-3, a patterned mask layer 220 is formed over the multilayer structure 214, in accordance with some embodiments. The patterned mask layer 220 exposes portions of the substrate 210 (or the multilayer structure 214), in accordance with some embodiments.

The patterned mask layer 220 is made of an oxide material such as silicon dioxide ($SiO_2$), a nitride material such as silicon nitride ($Si_3N_4$), or another suitable material, which is different from the materials of the substrate 210 (or the multilayer structure 214), in accordance with some embodiments. The patterned mask layer 220 is formed using a deposition process (e.g., a physical vapor deposition process or a chemical vapor deposition process), a photolithography process, and an etching process (e.g., a dry etching process), in accordance with some embodiments.

Figure 2B:
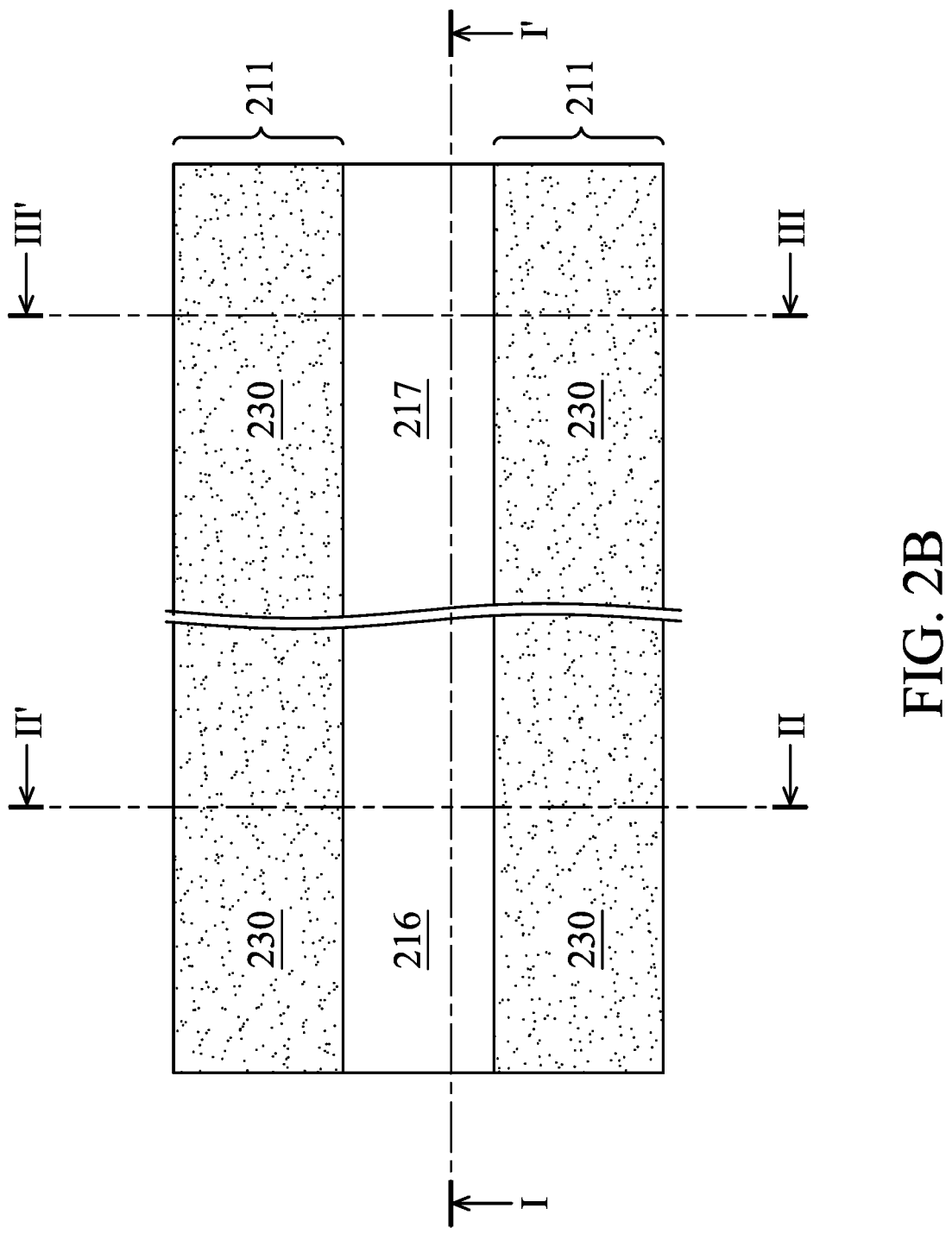
Figures 1, 2B:
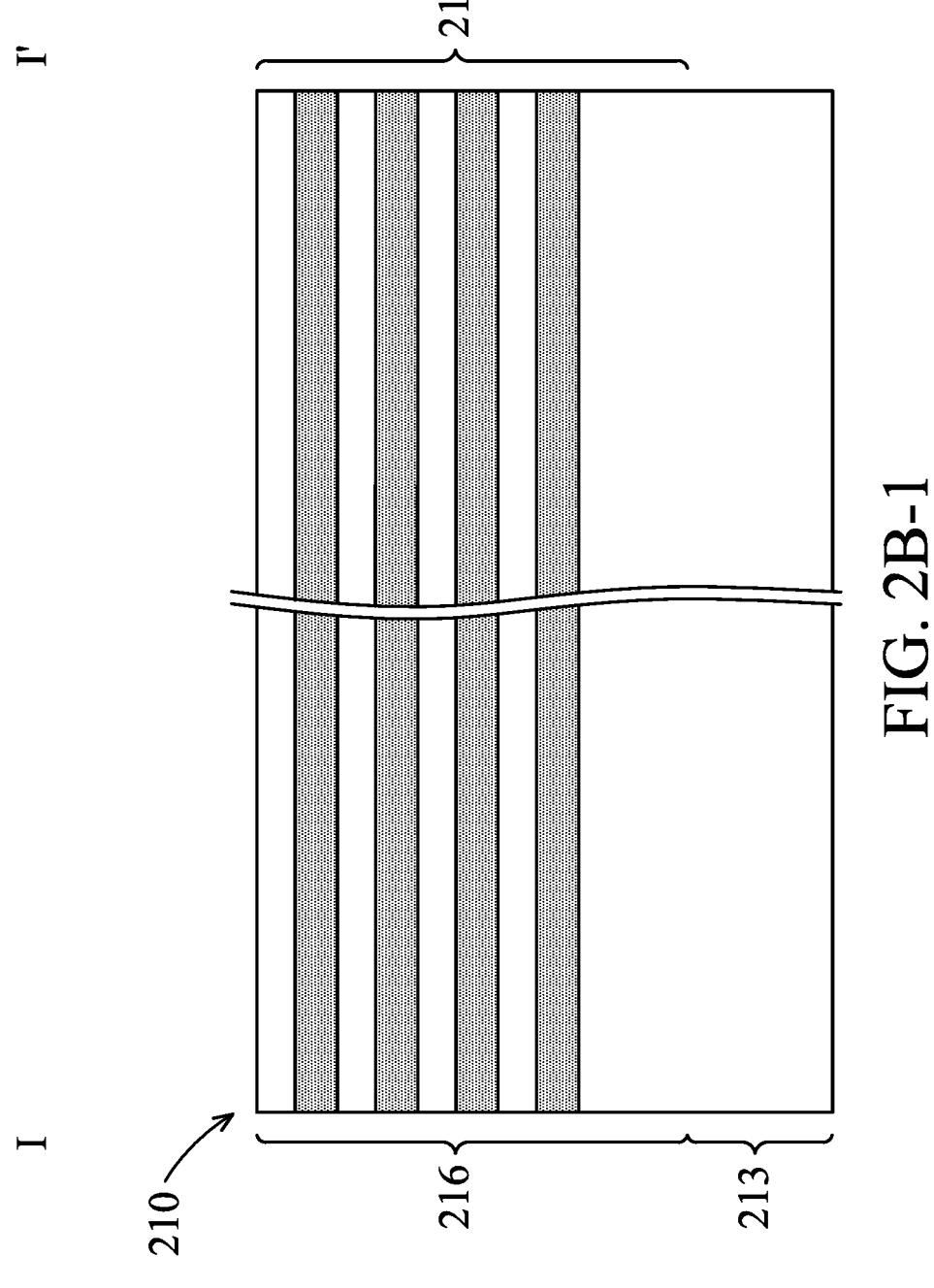
Figures 2, 2B, 3:
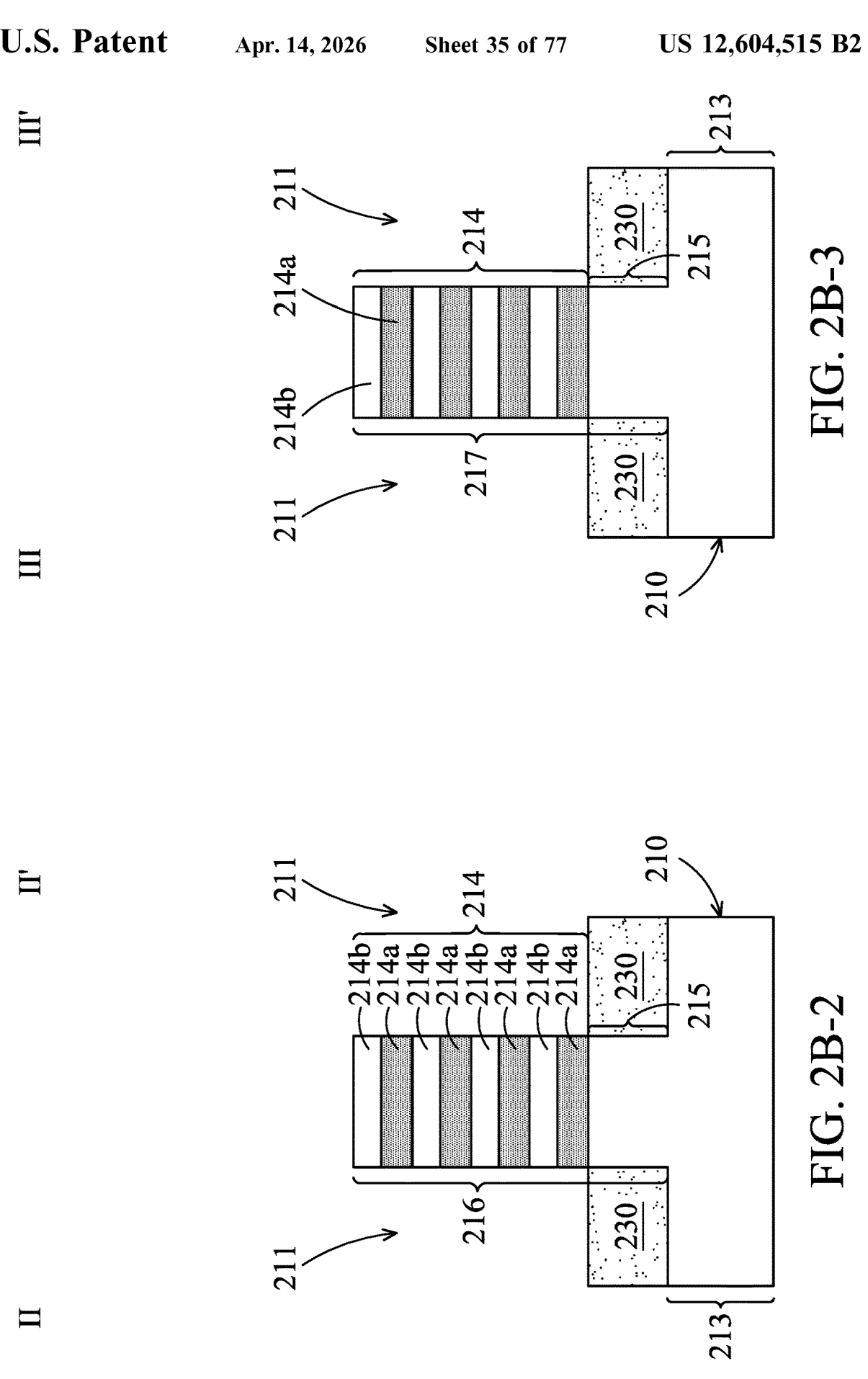

As shown in FIGS. 2A, 2B, 2B-1, 2B-2, and 2B-3, the portions of the substrate 210 exposed by the patterned mask layer 220 are removed, in accordance with some embodiments. As shown in FIGS. 2B, 2B-2, and 2B-3, the removal process forms trenches 211 in the substrate 210, in accordance with some embodiments.

After the removal process, the remaining portion of the substrate 210 includes a base 213 and fin structures 216 and 217, in accordance with some embodiments. The fin structures 216 and 217 are over the base 213, in accordance with some embodiments. The base 213 is formed from the lower portion 212 (as shown in FIGS. 2A-1, 2A-2, and 2A-3), in accordance with some embodiments.

The fin structure 216 or 217 includes a bottom portion 215 and a portion of the multilayer structure 214, which includes the sacrificial layers 214a and the channel layers 214b, in accordance with some embodiments. The bottom portion 215 is formed from the lower portion 212 (as shown in FIGS. 2A-1, 2A-2, and 2A-3), in accordance with some embodiments. The fin structures 216 and 217 are spaced apart from each other, in accordance with some embodiments. For the sake of simplicity and clarity, FIGS. 2B and 2B-1 omit some structures between the fin structures 216 and 217, in accordance with some embodiments.

Thereafter, as shown in FIGS. 2A and 2B, the patterned mask layer 220 is removed, in accordance with some embodiments. As shown in FIGS. 2B, 2B-2, and 2B-3, a dielectric layer 230 is formed in the trenches 211, in accordance with some embodiments. The dielectric layer 230 is made of oxide (such as silicon oxide), fluorosilicate glass (FSG), a low-k dielectric material, and/or another suitable dielectric material.

Figure 2C:
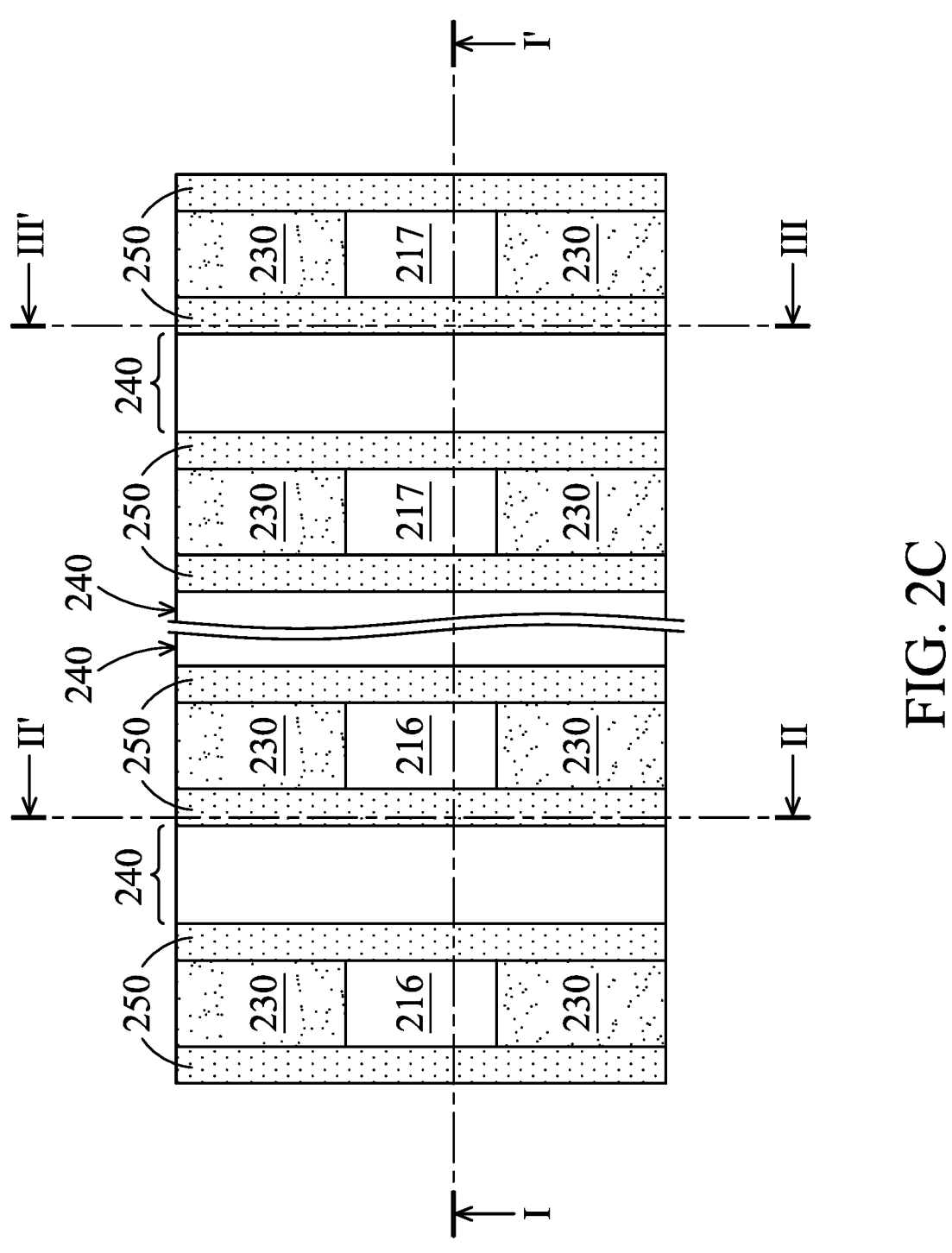
Figures 1, 2C:
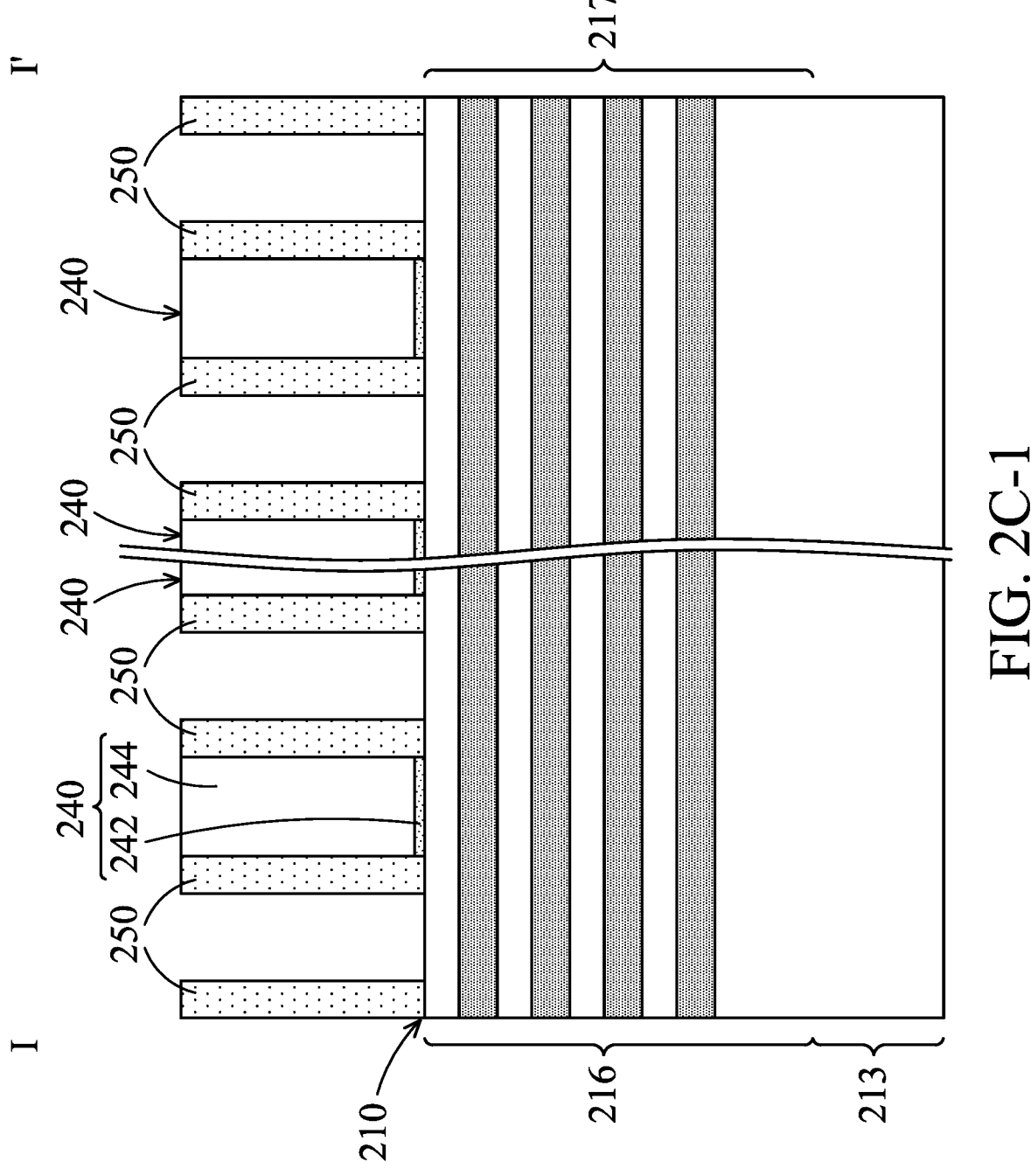
Figures 2, 2C, 3:
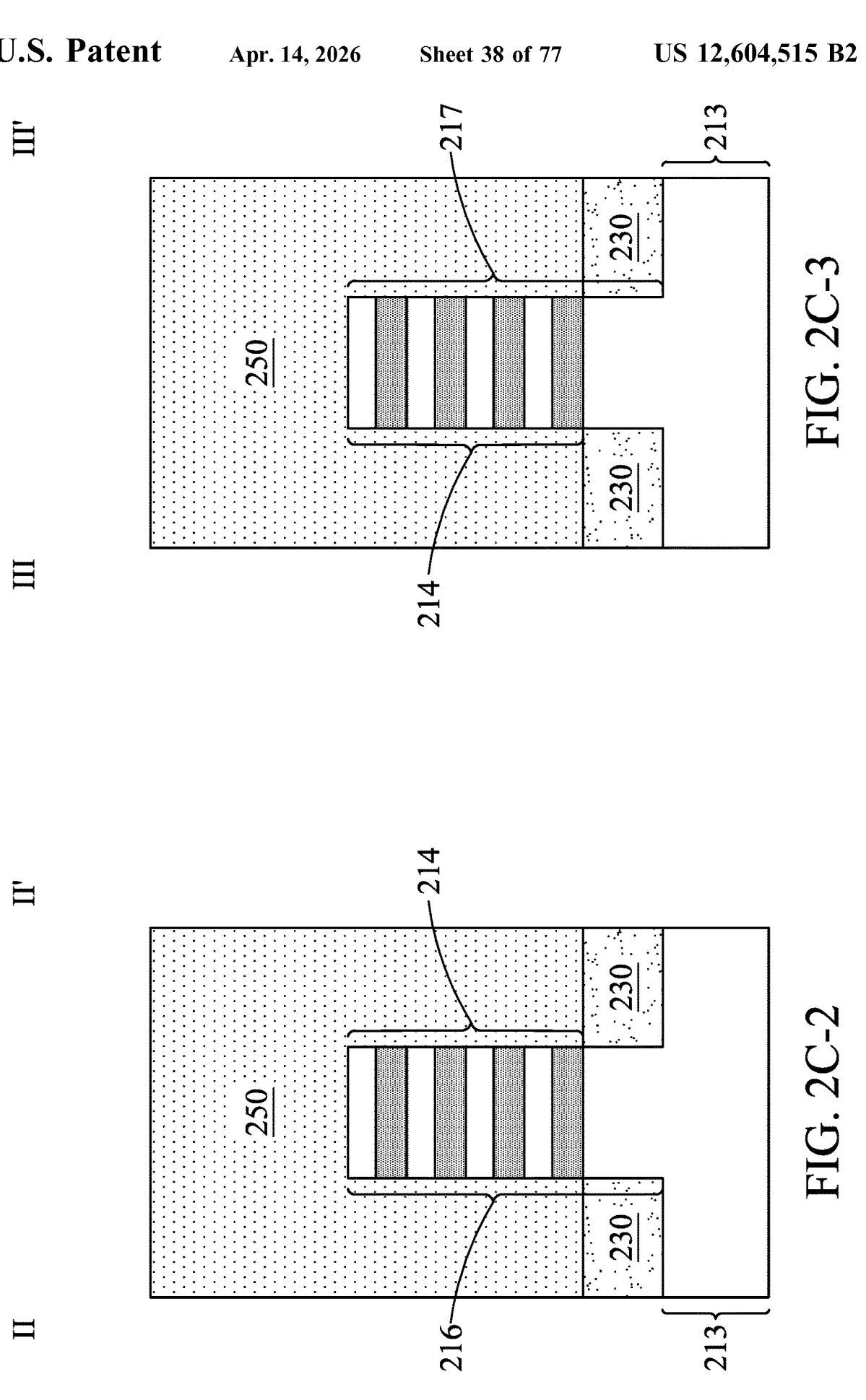
Figures 2, 2C, 3, 4:
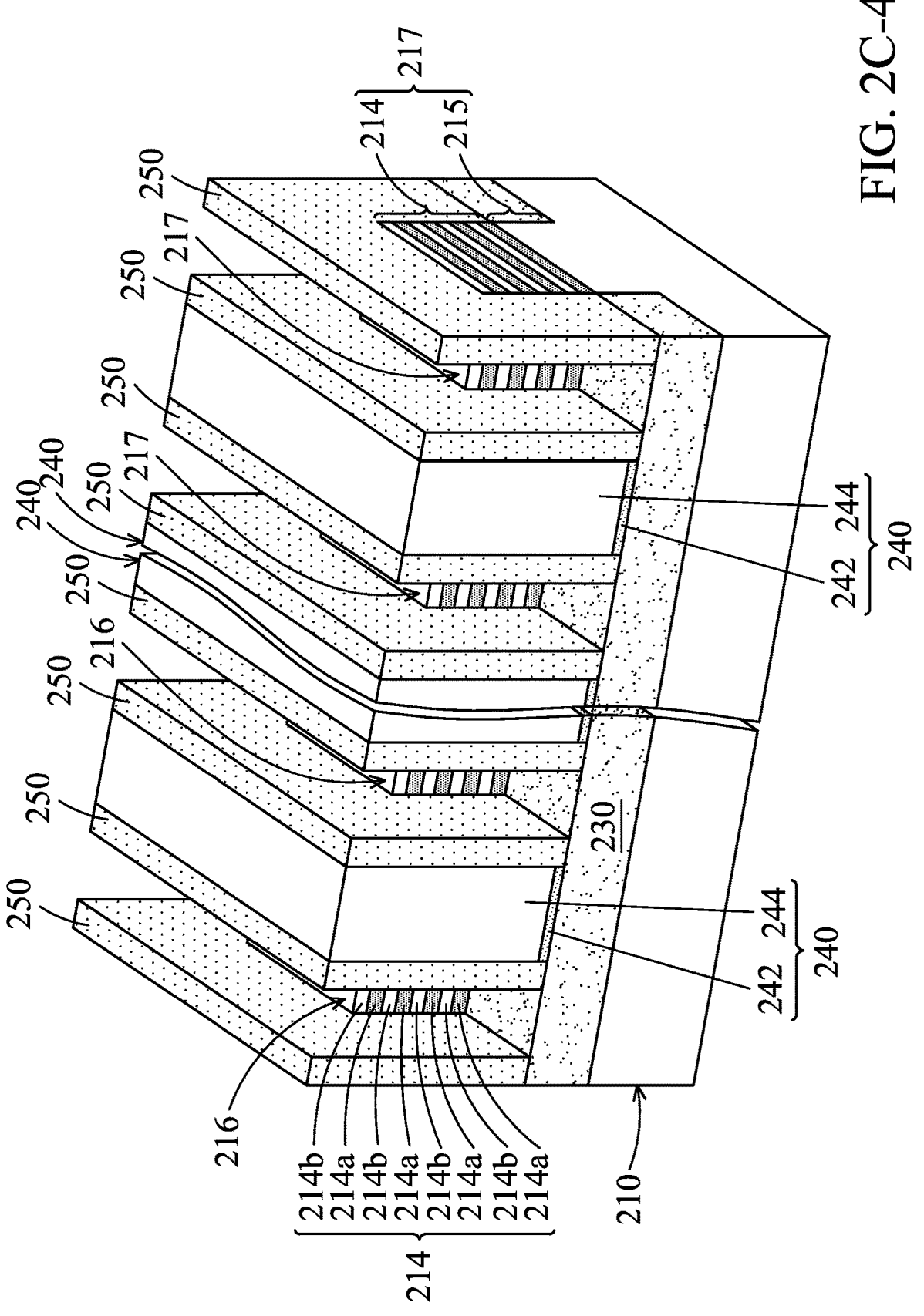
Figure 2D:
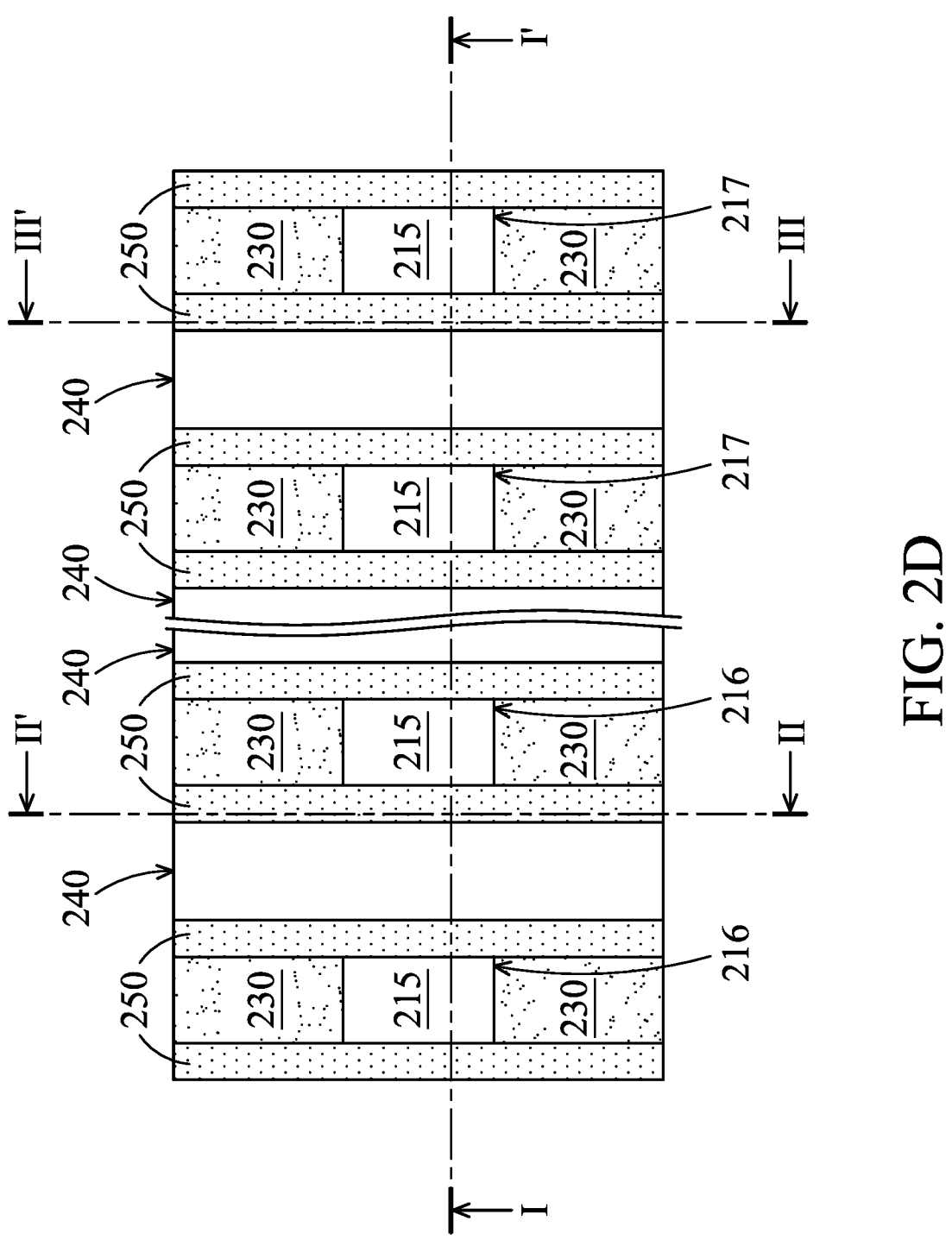
Figures 1, 2D:
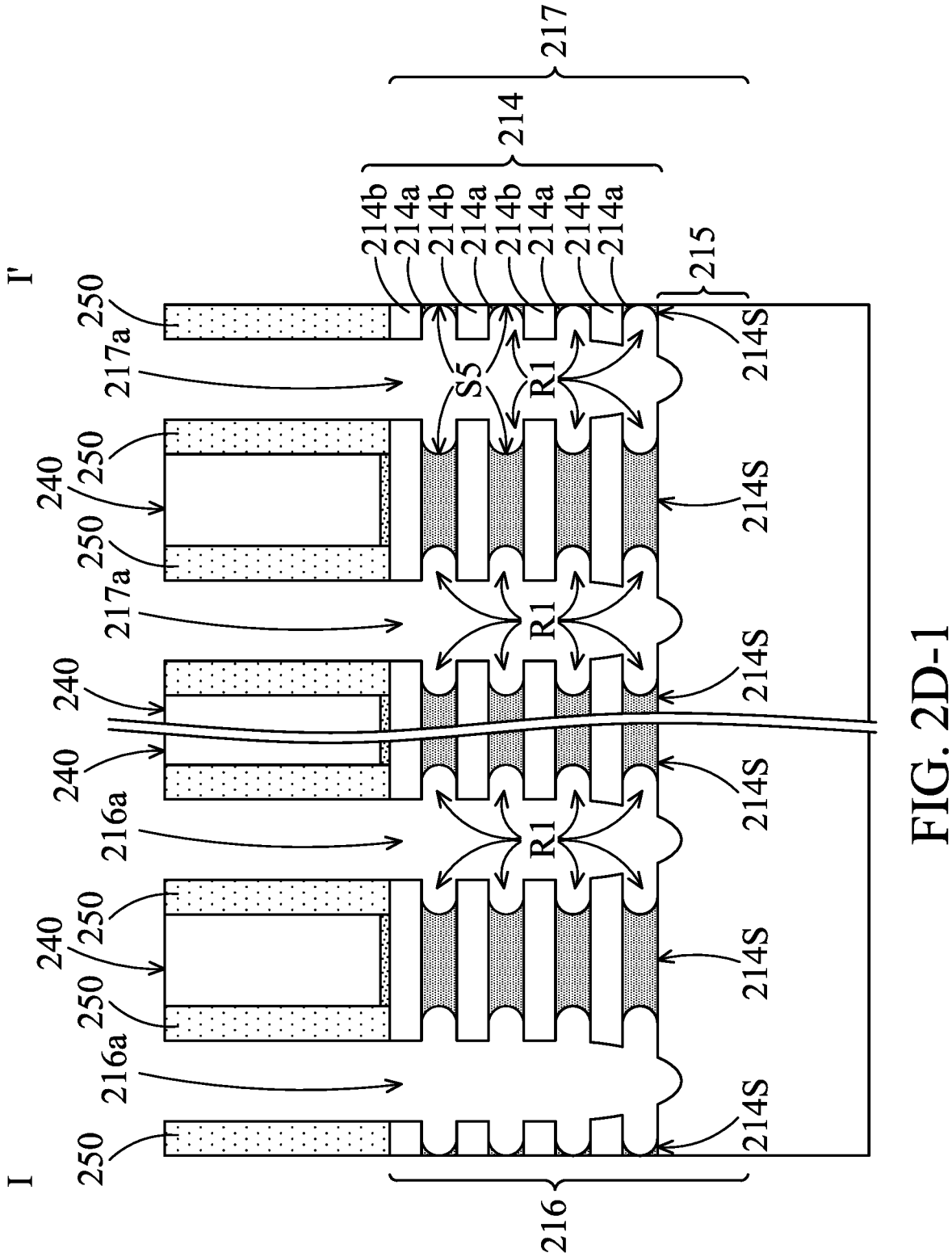
Figures 2, 2D, 3:
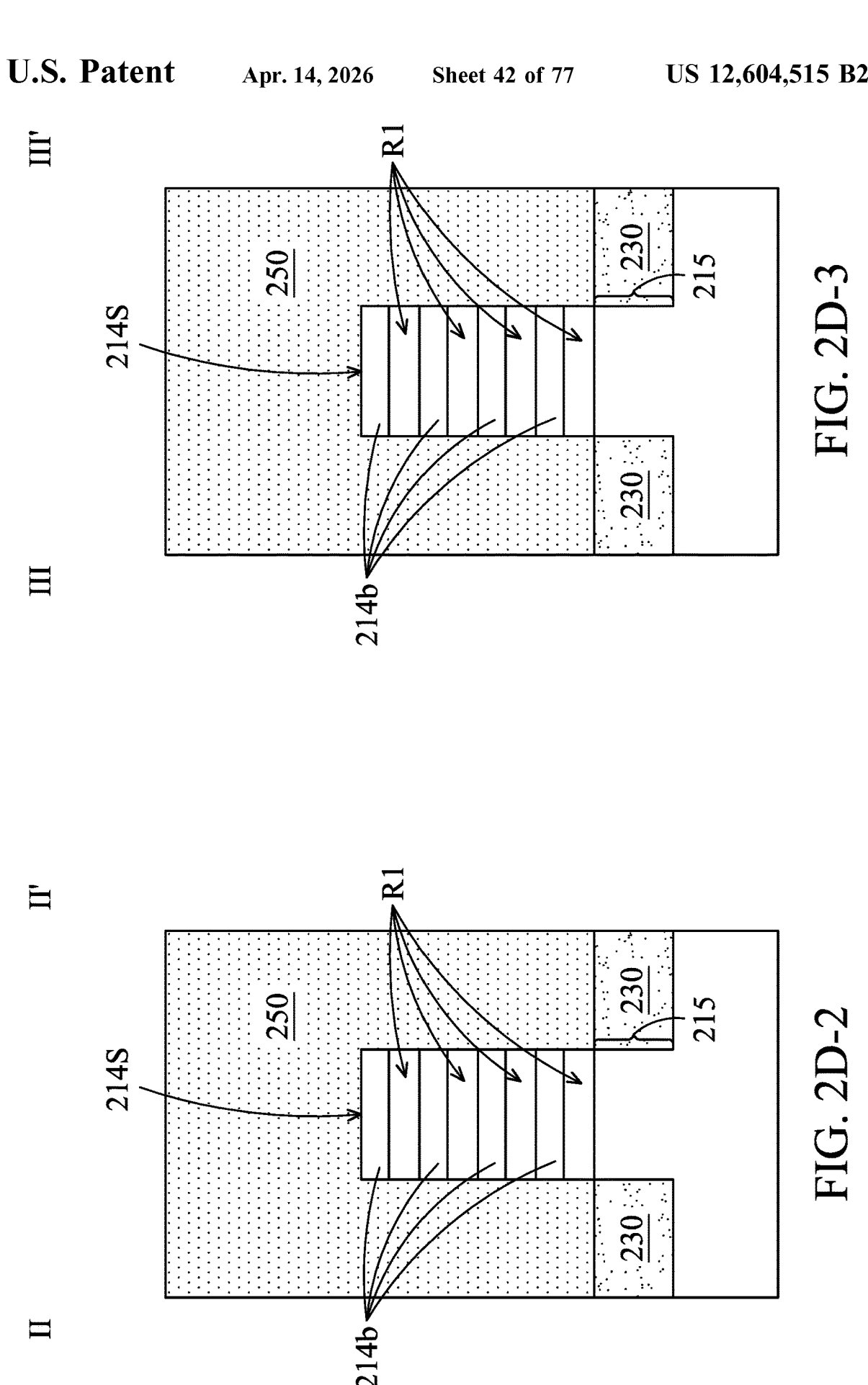
Figure 2E:
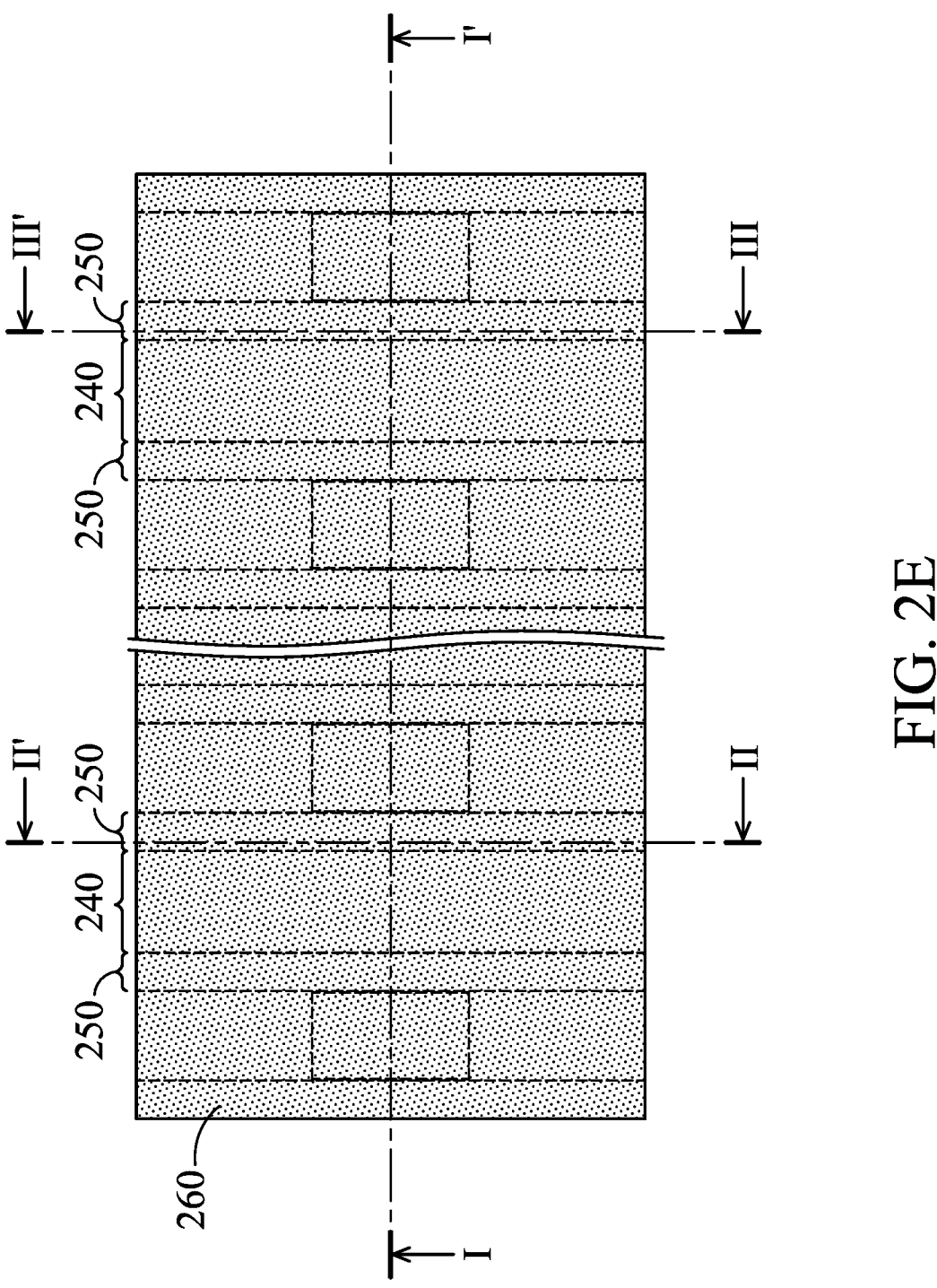
Figures 1, 2E:
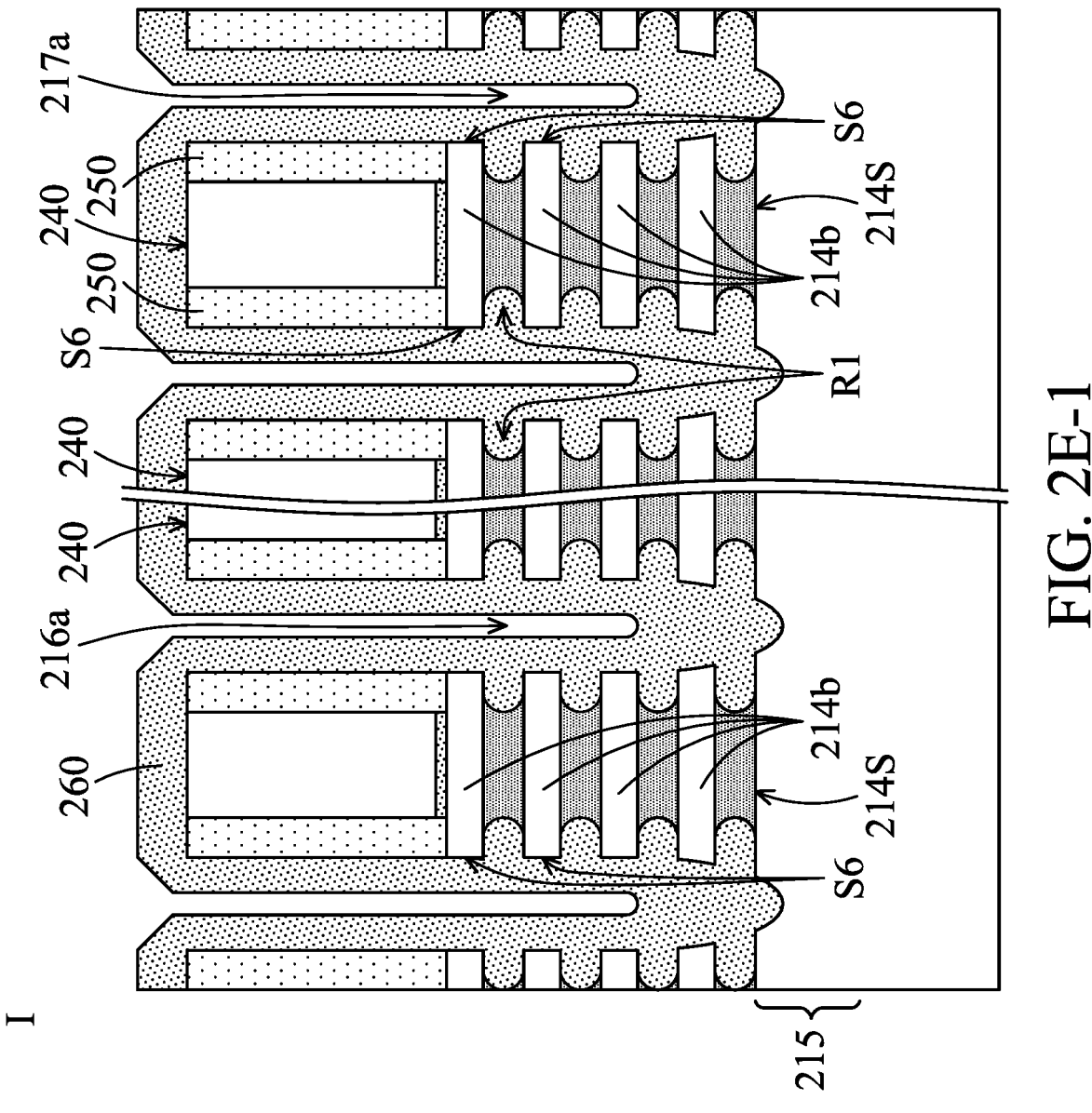
Figures 2, 2E, 3:
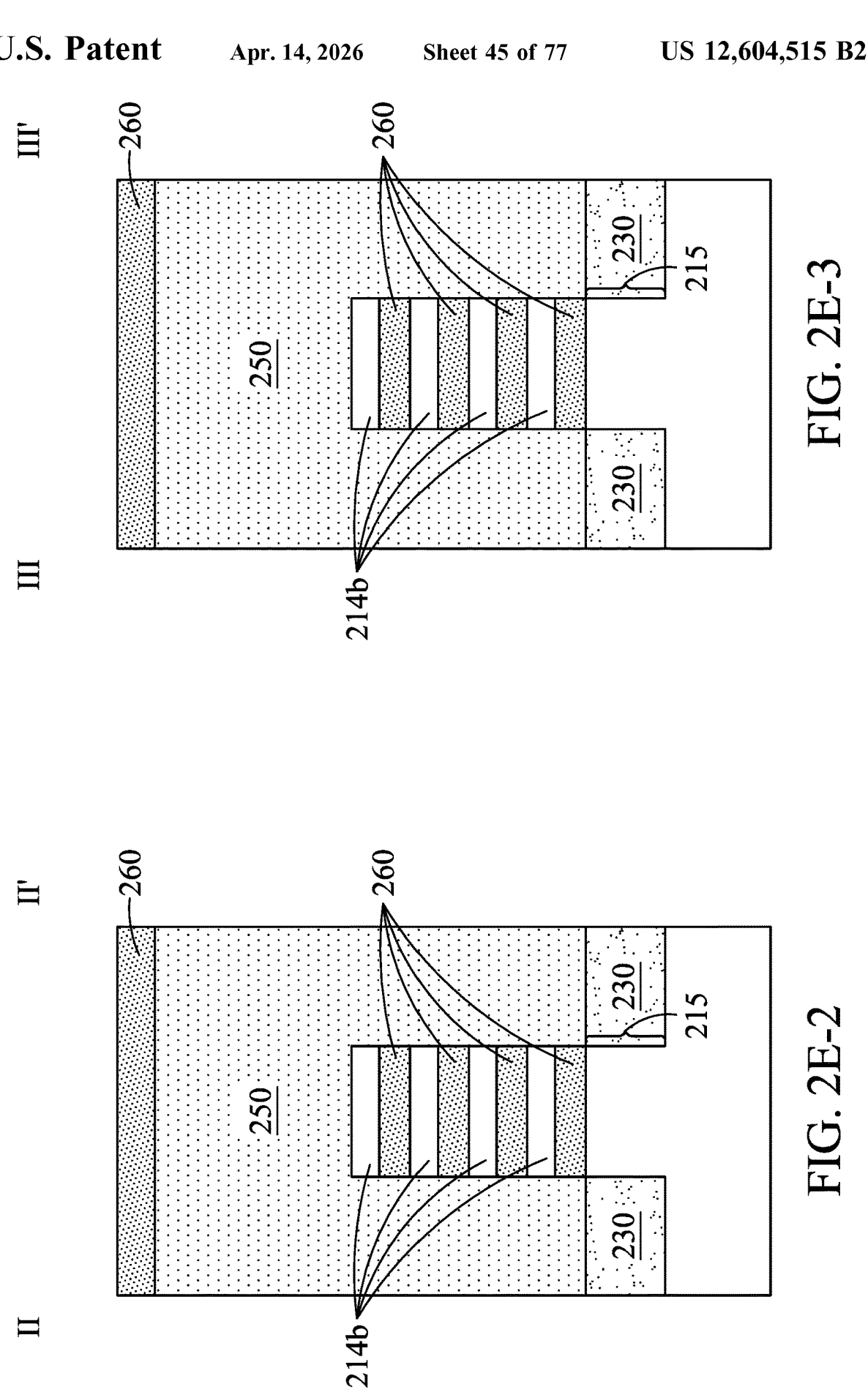
Figure 2F:
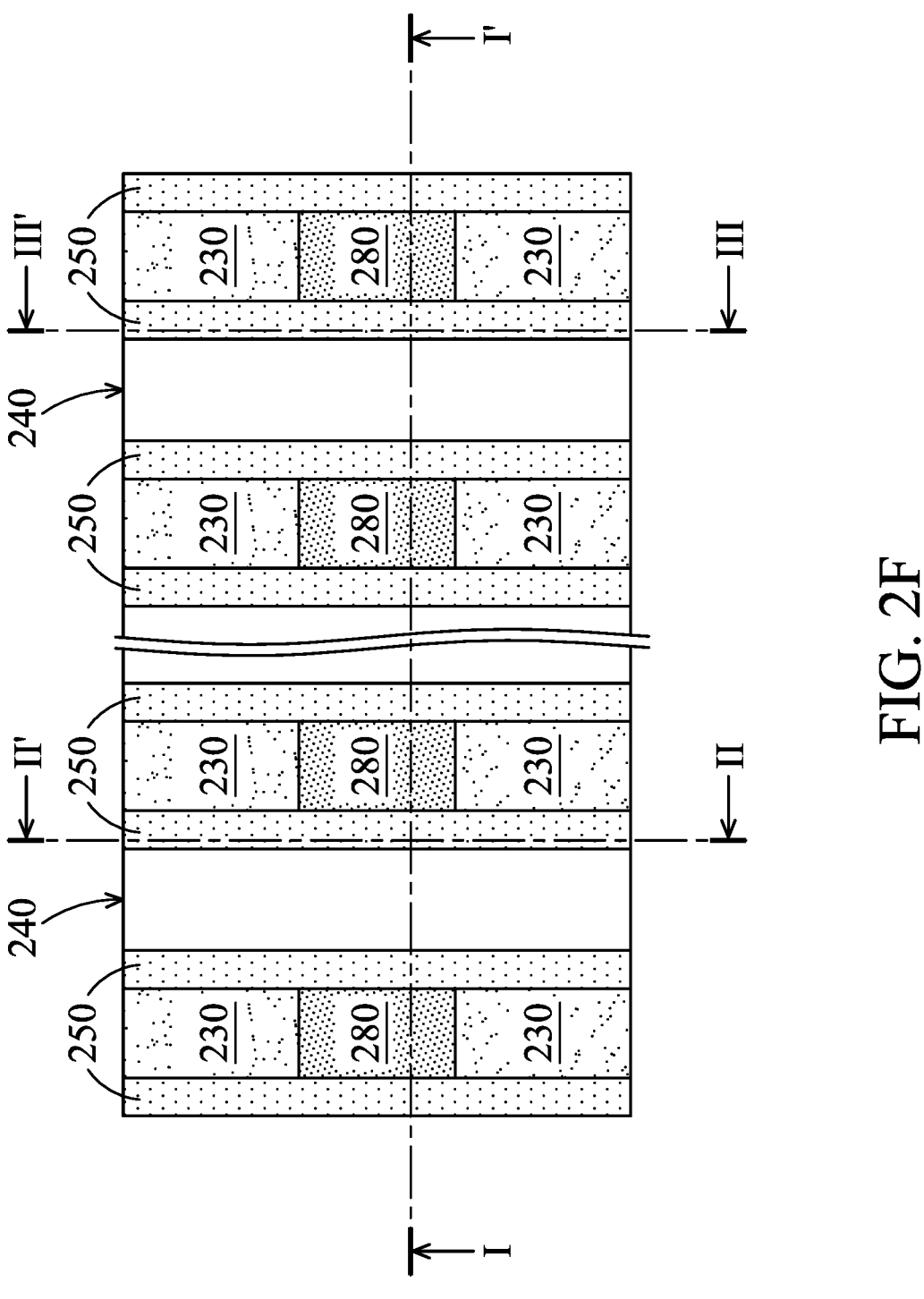
Figures 1, 2F:
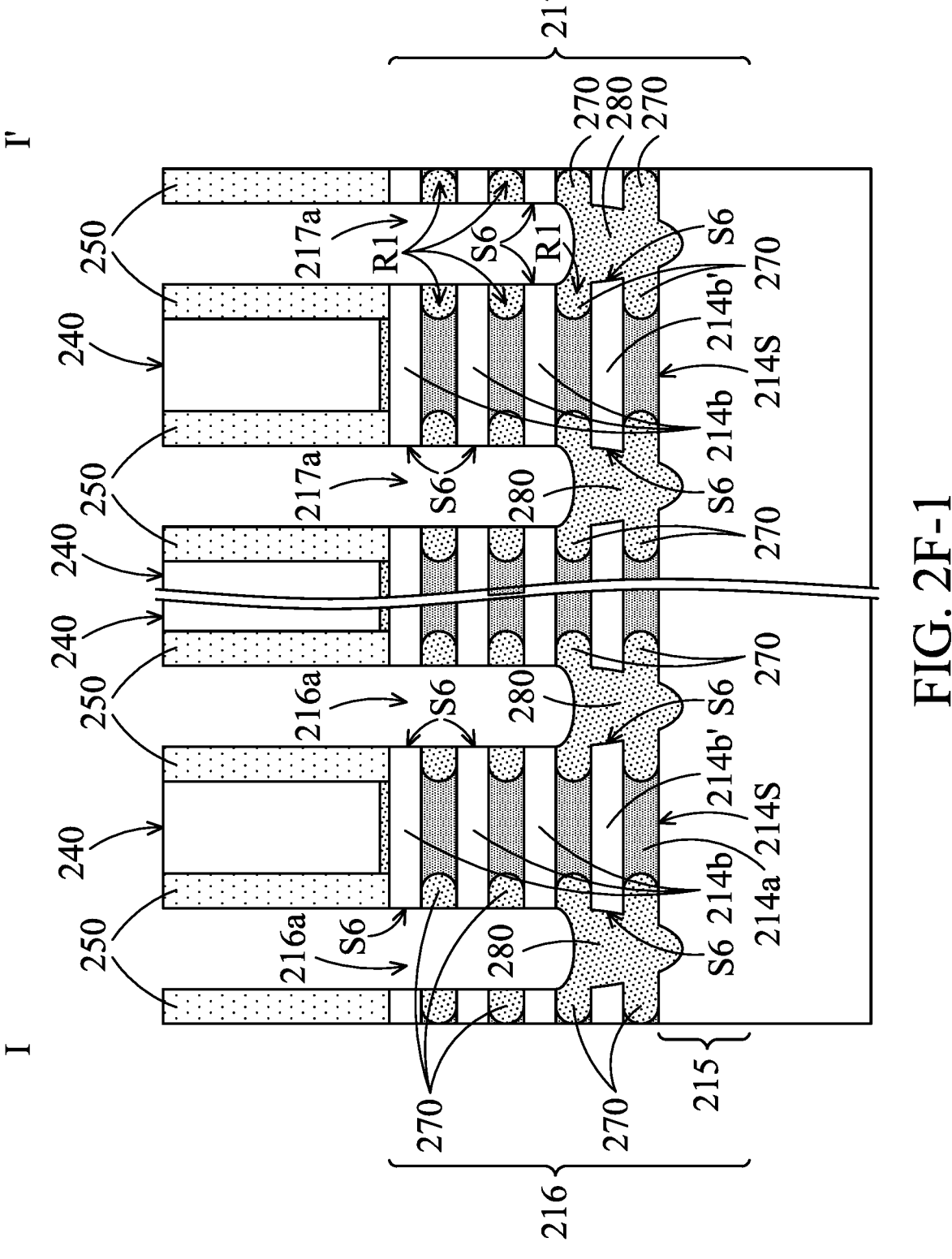
Figures 2, 2F, 3:
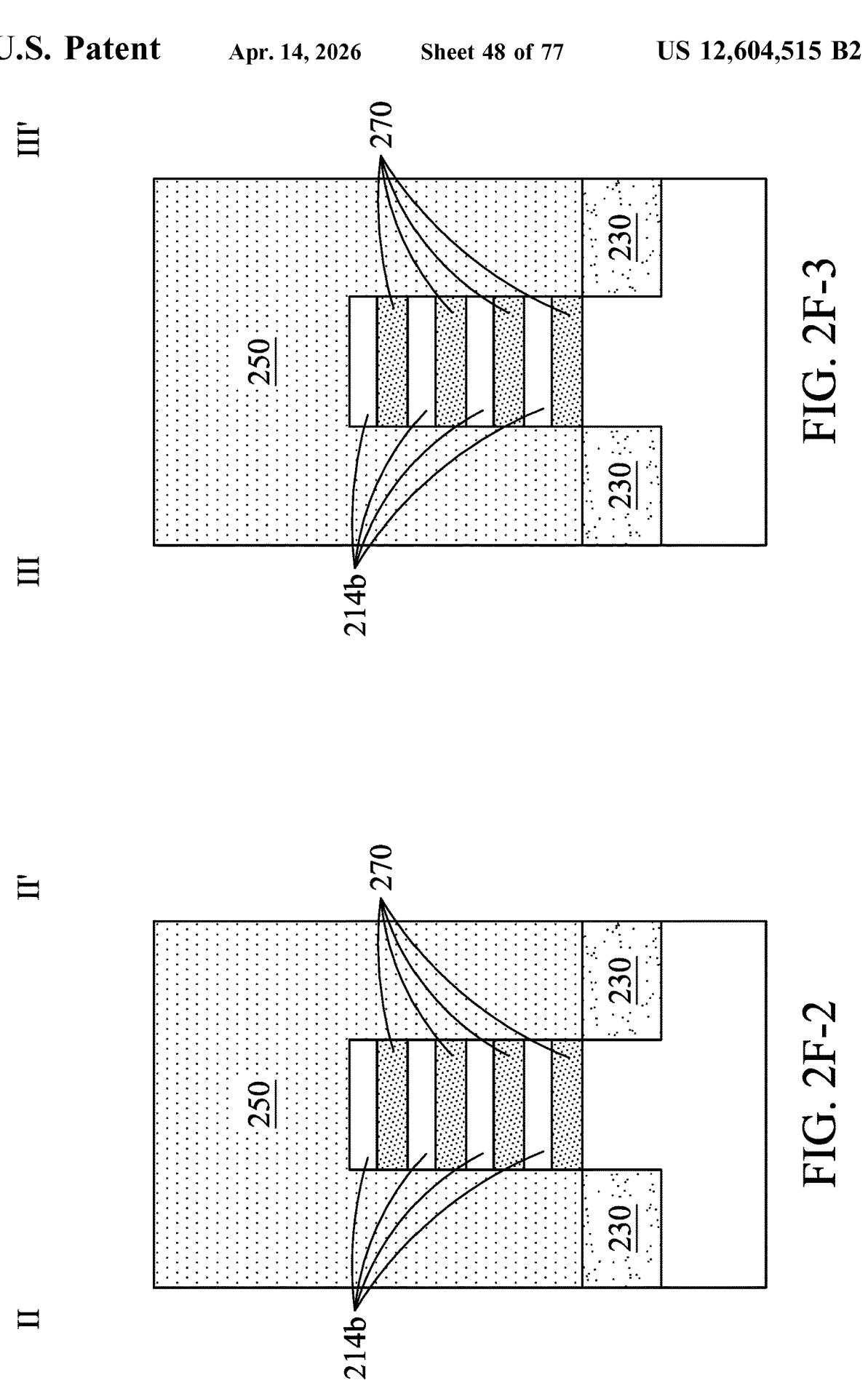
Figure 2G:
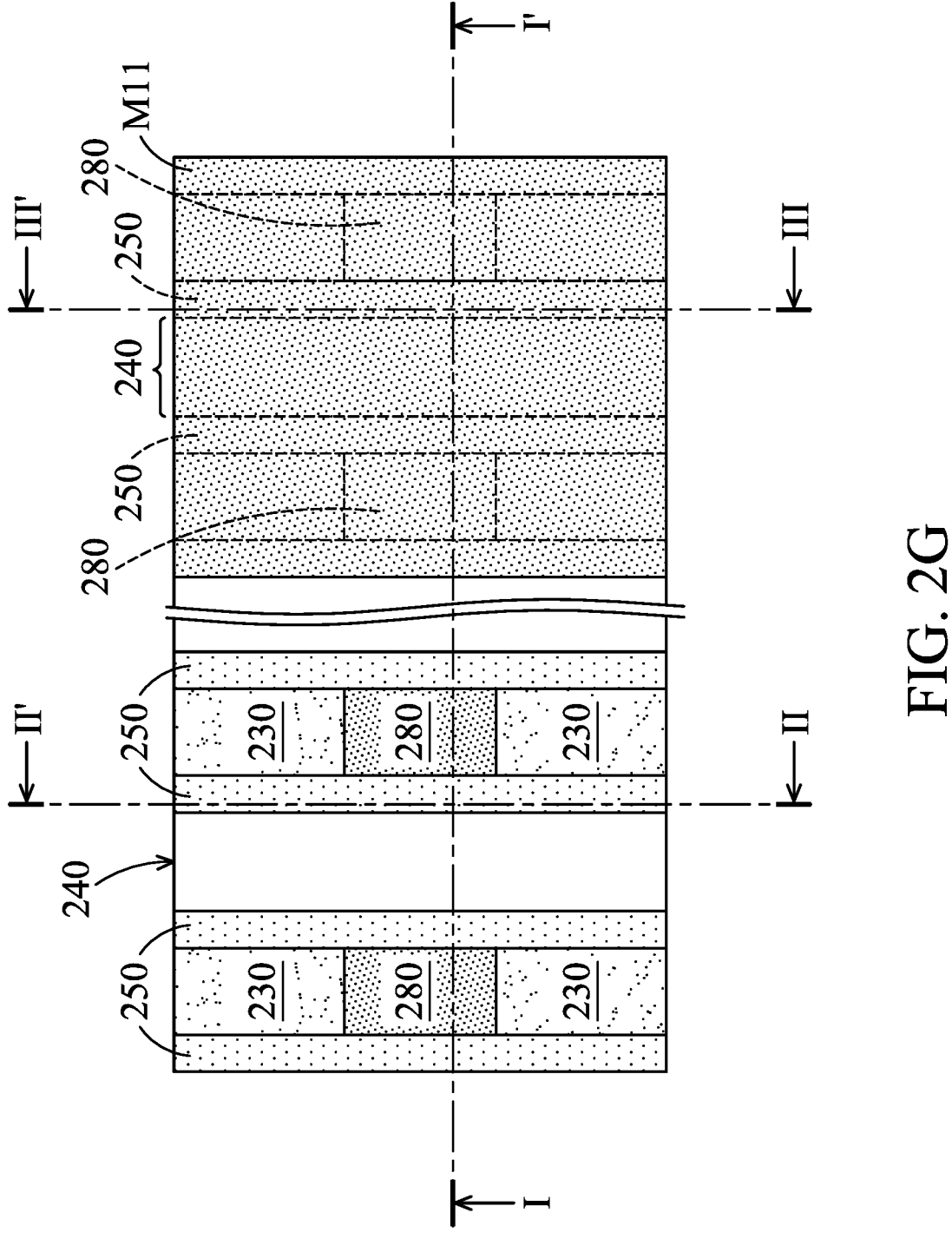
Figures 1, 2G:
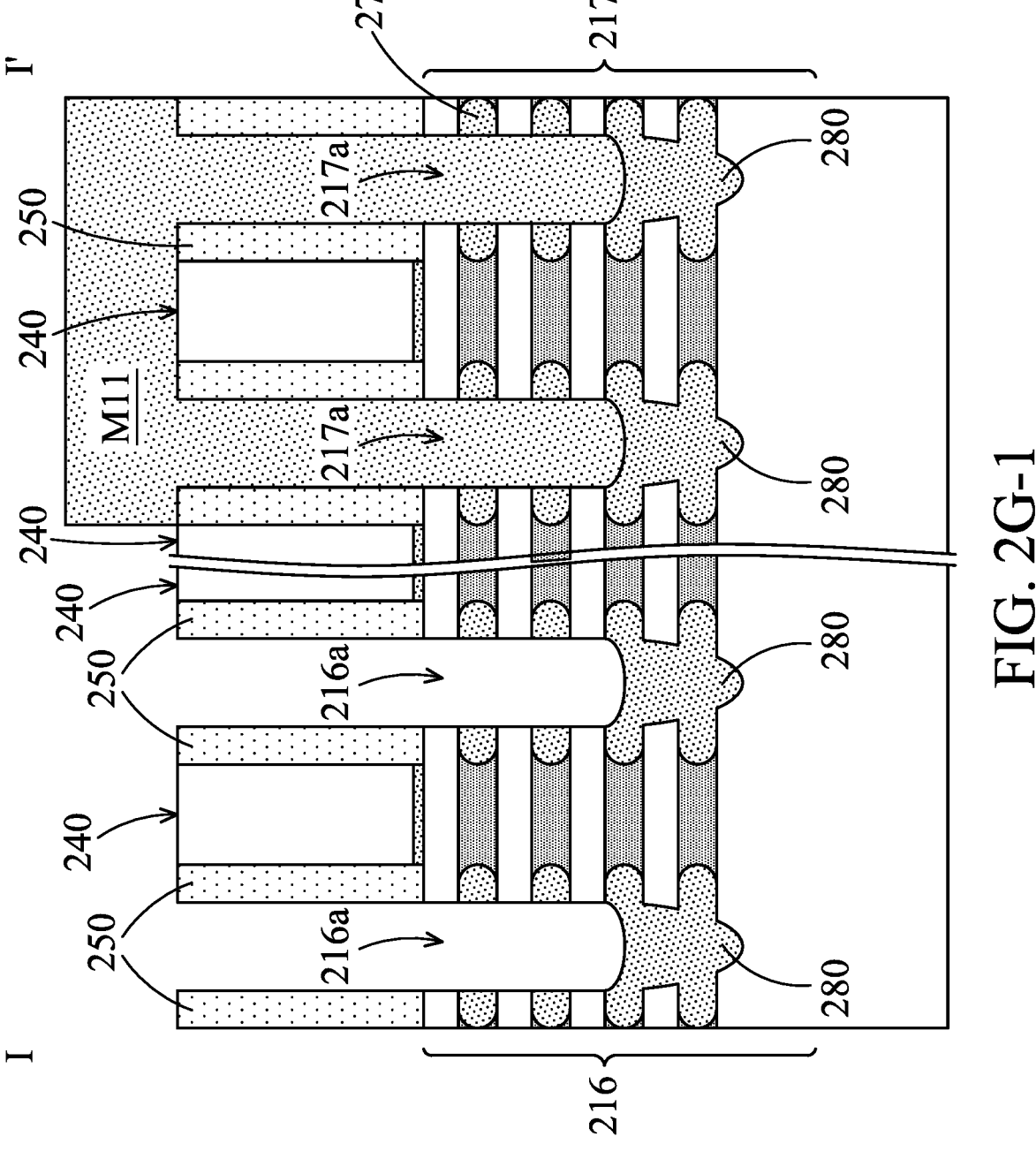
Figures 2, 2G, 3:
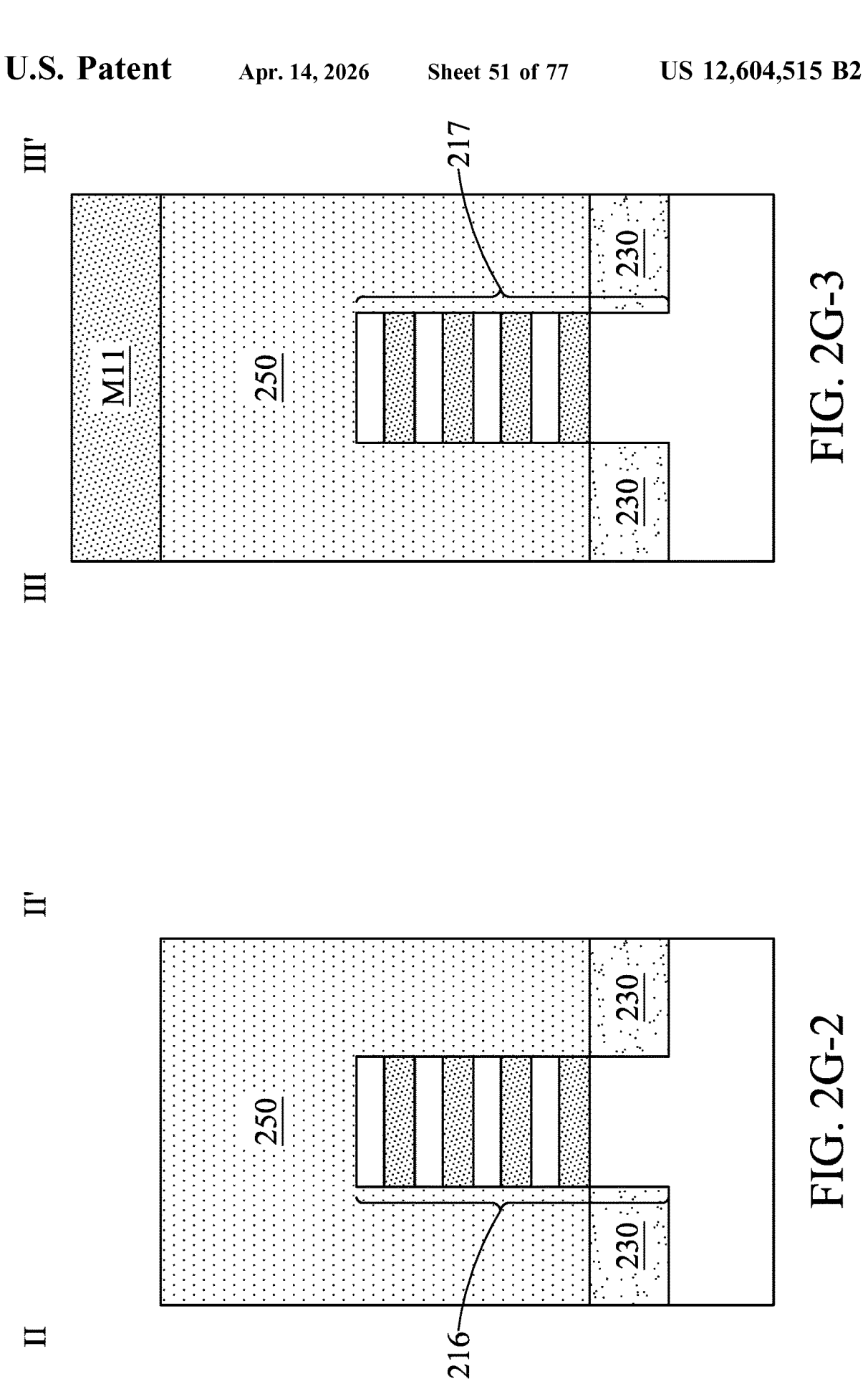
Figure 2H:
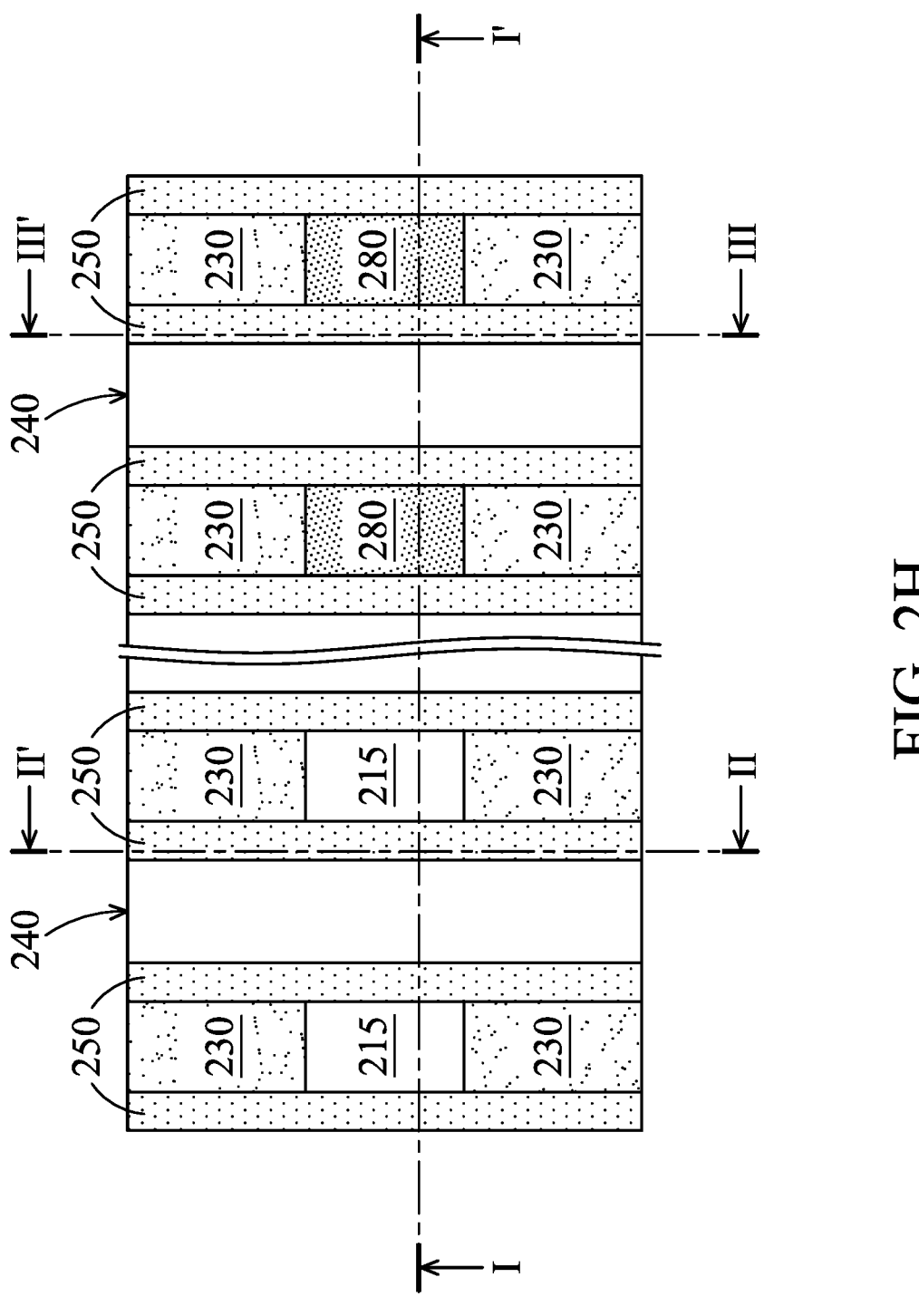
Figures 1, 2H:
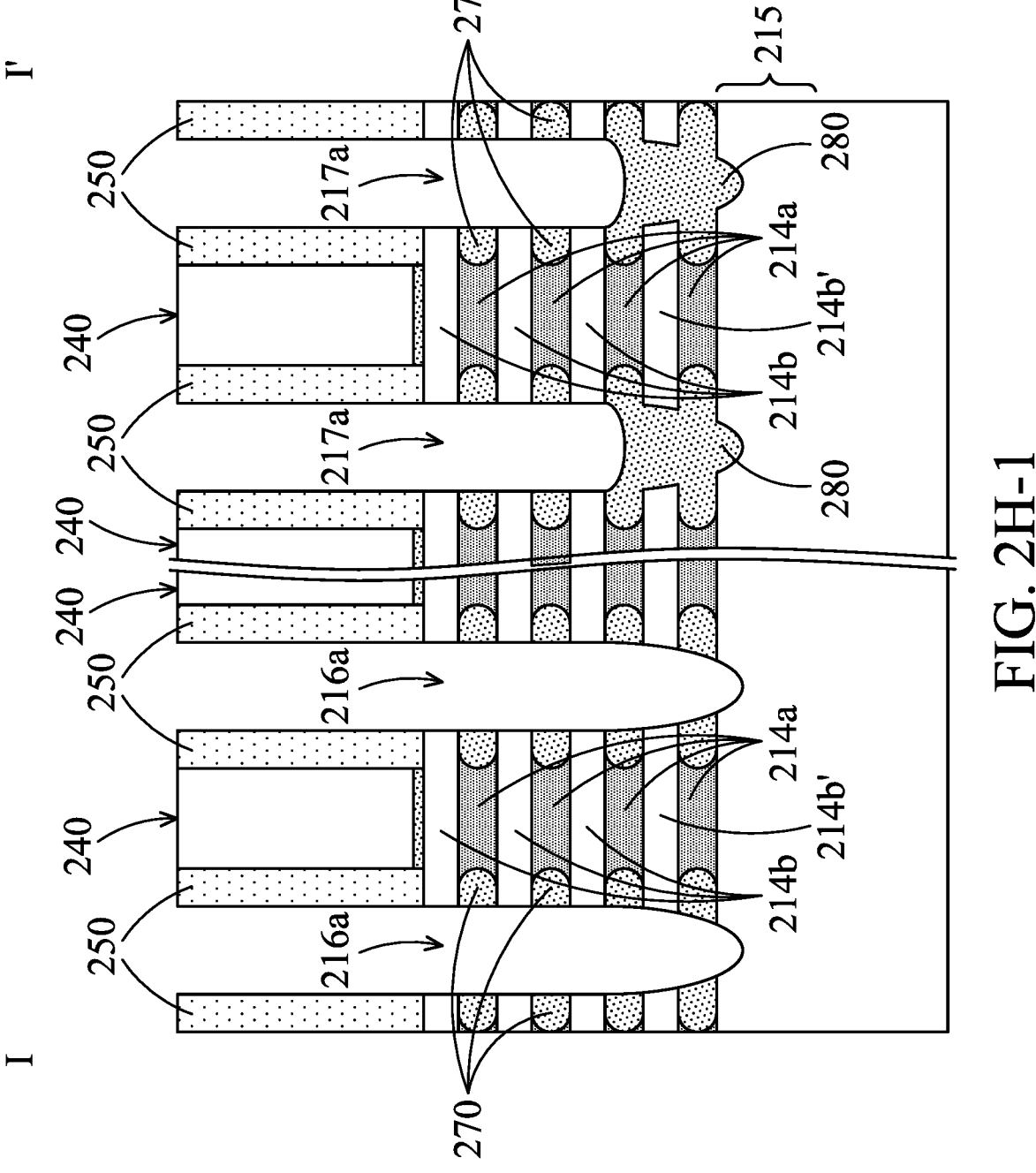
Figures 2, 2H, 3:
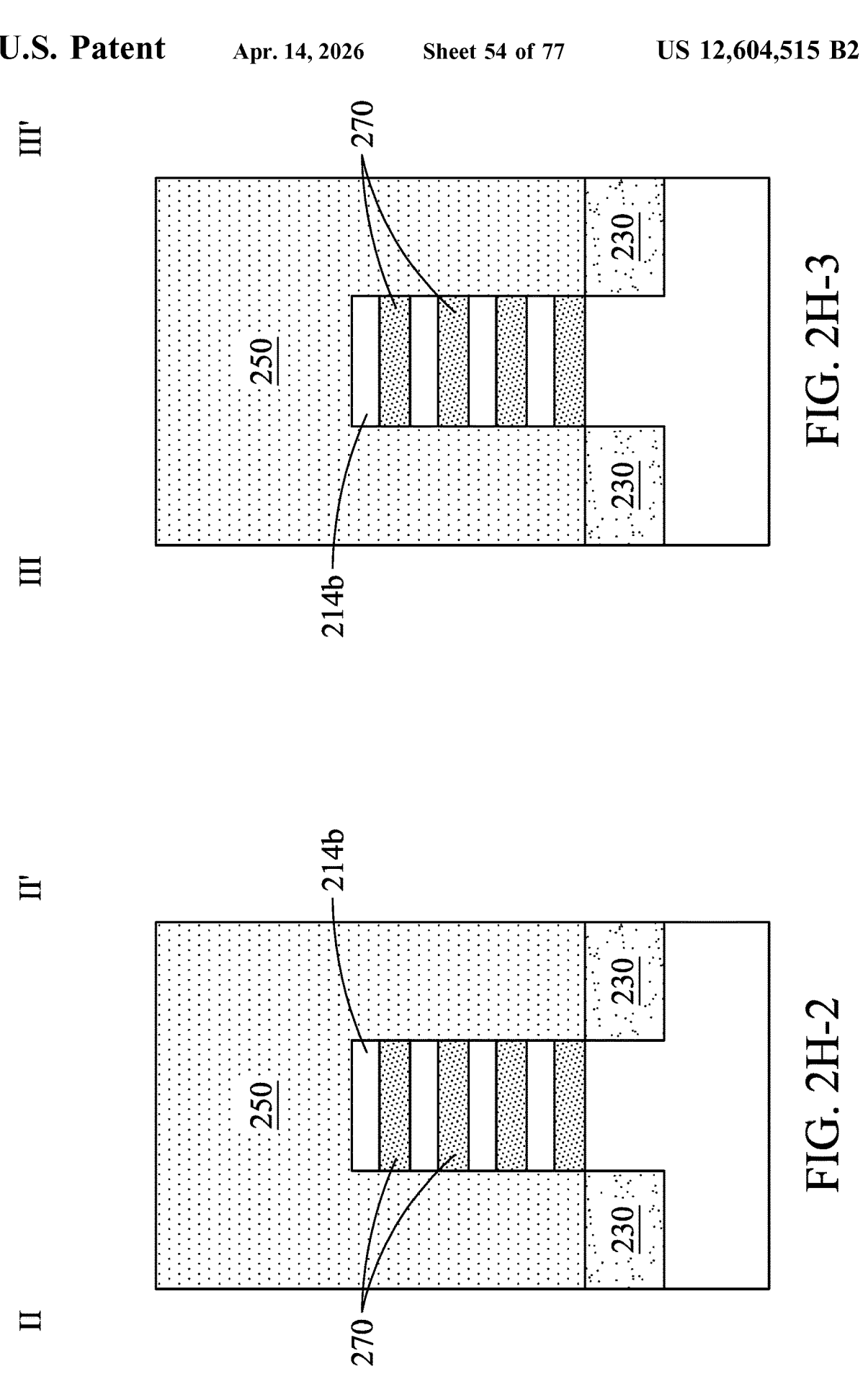
Figure 2I:
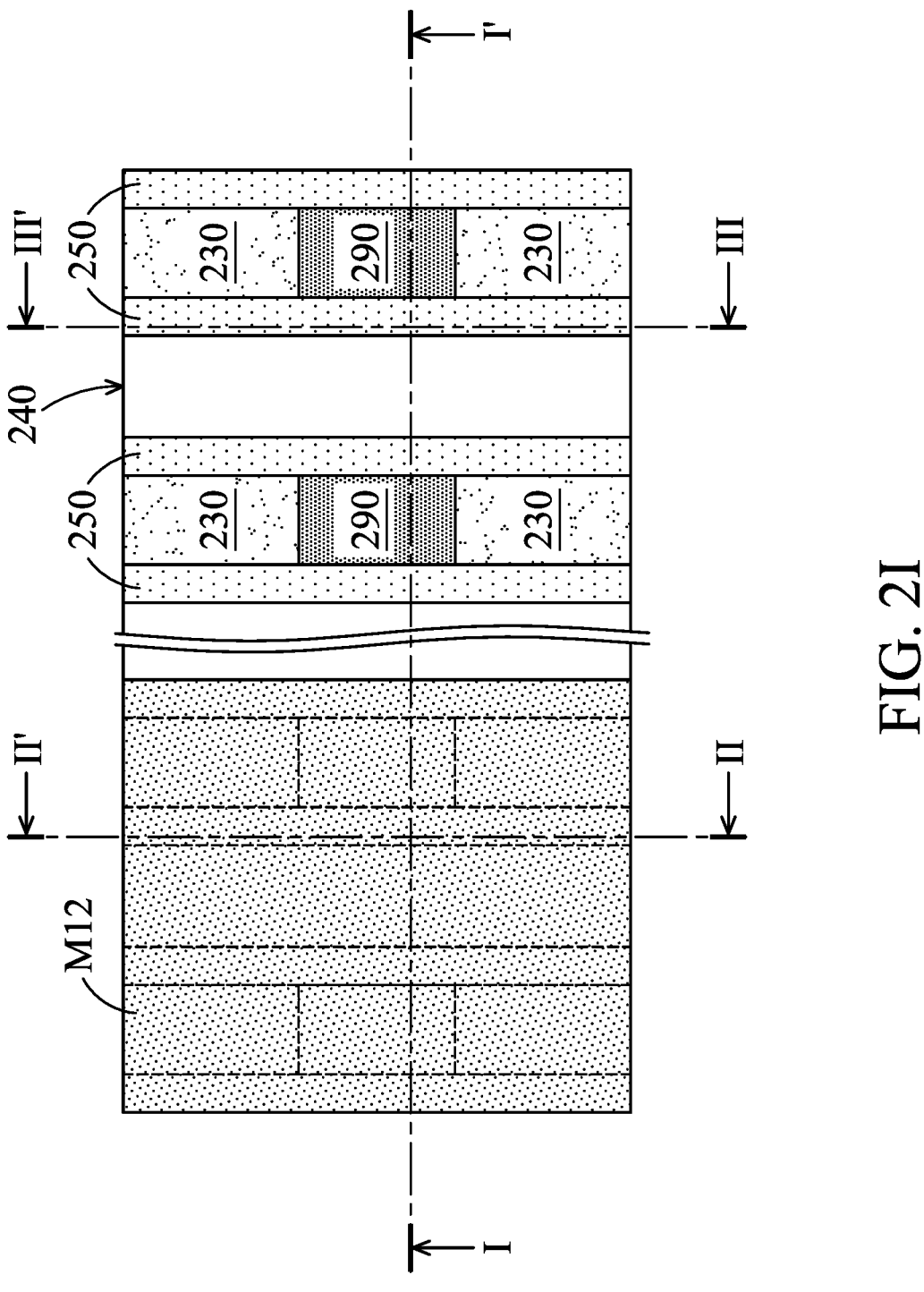
Figures 1, 2I:
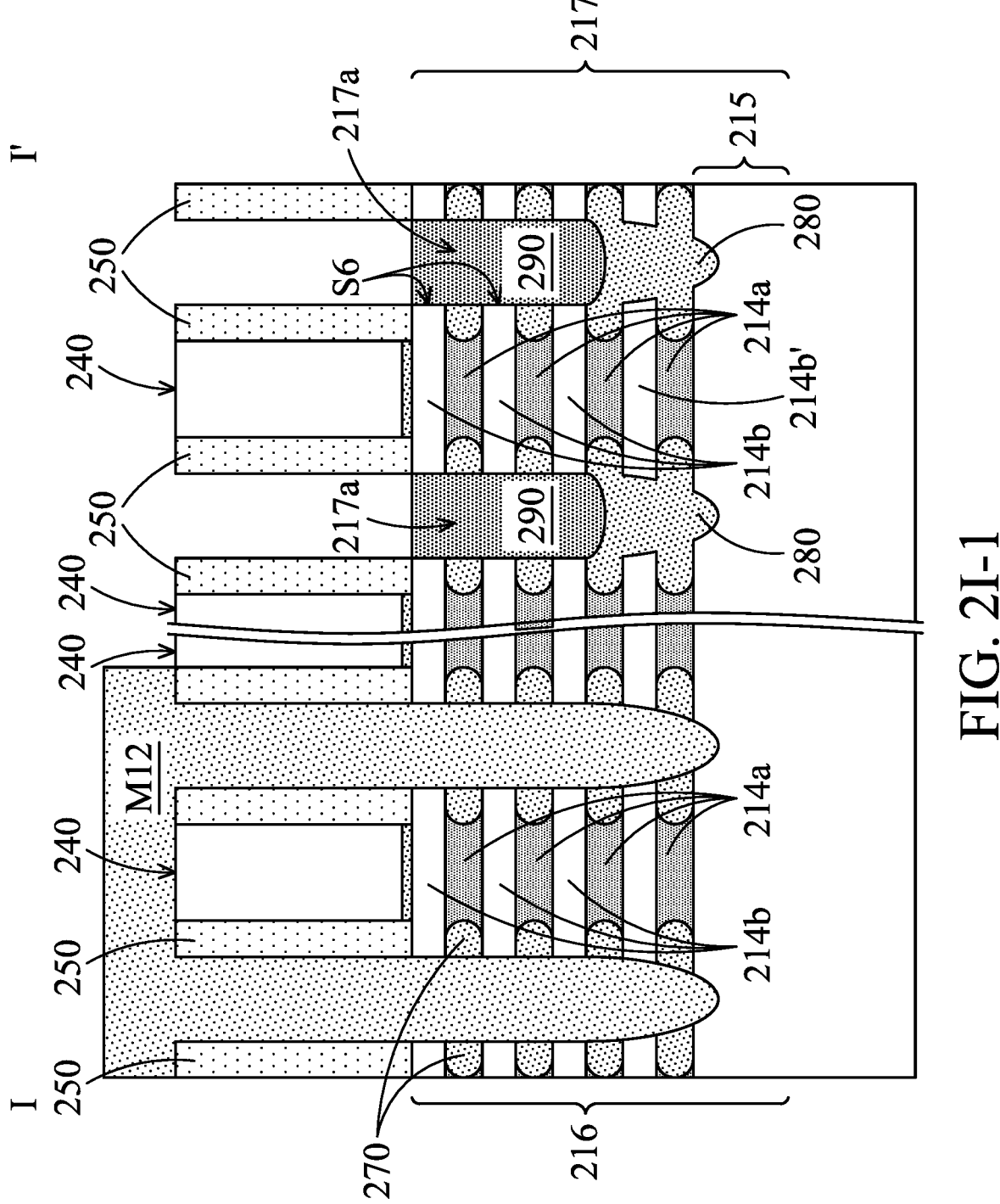
Figures 2, 2I, 3:
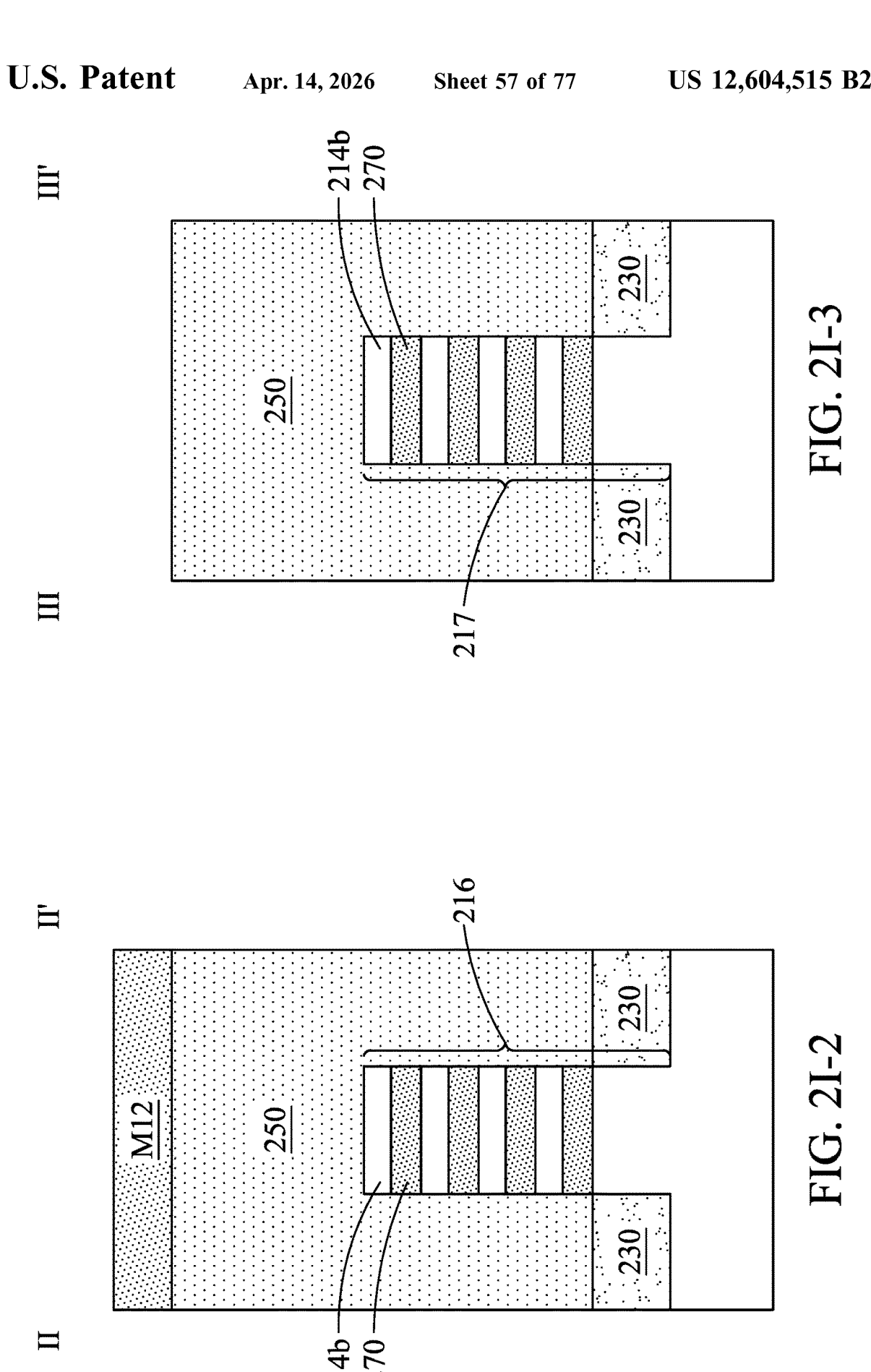
Figure 2J:
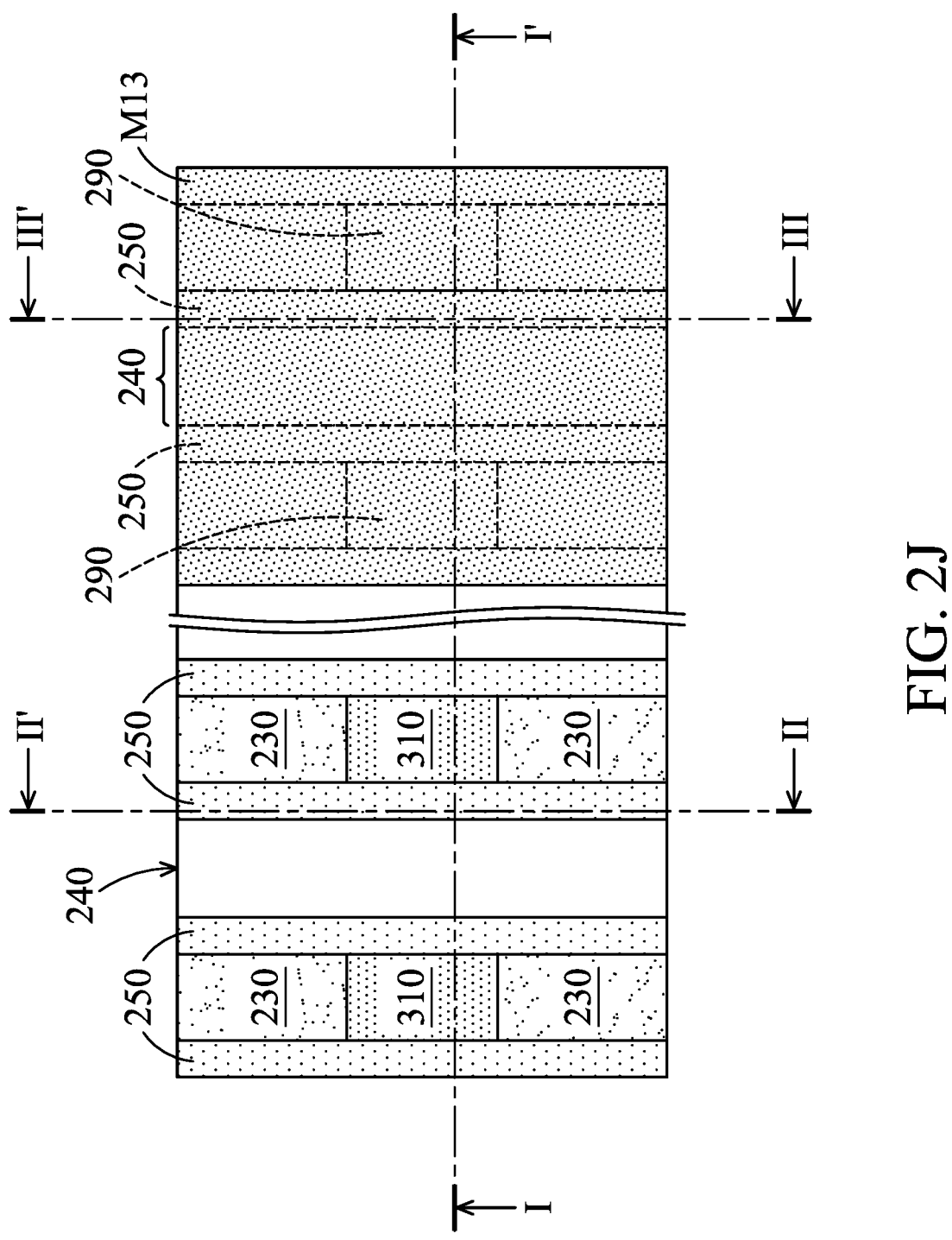
Figures 1, 2J:
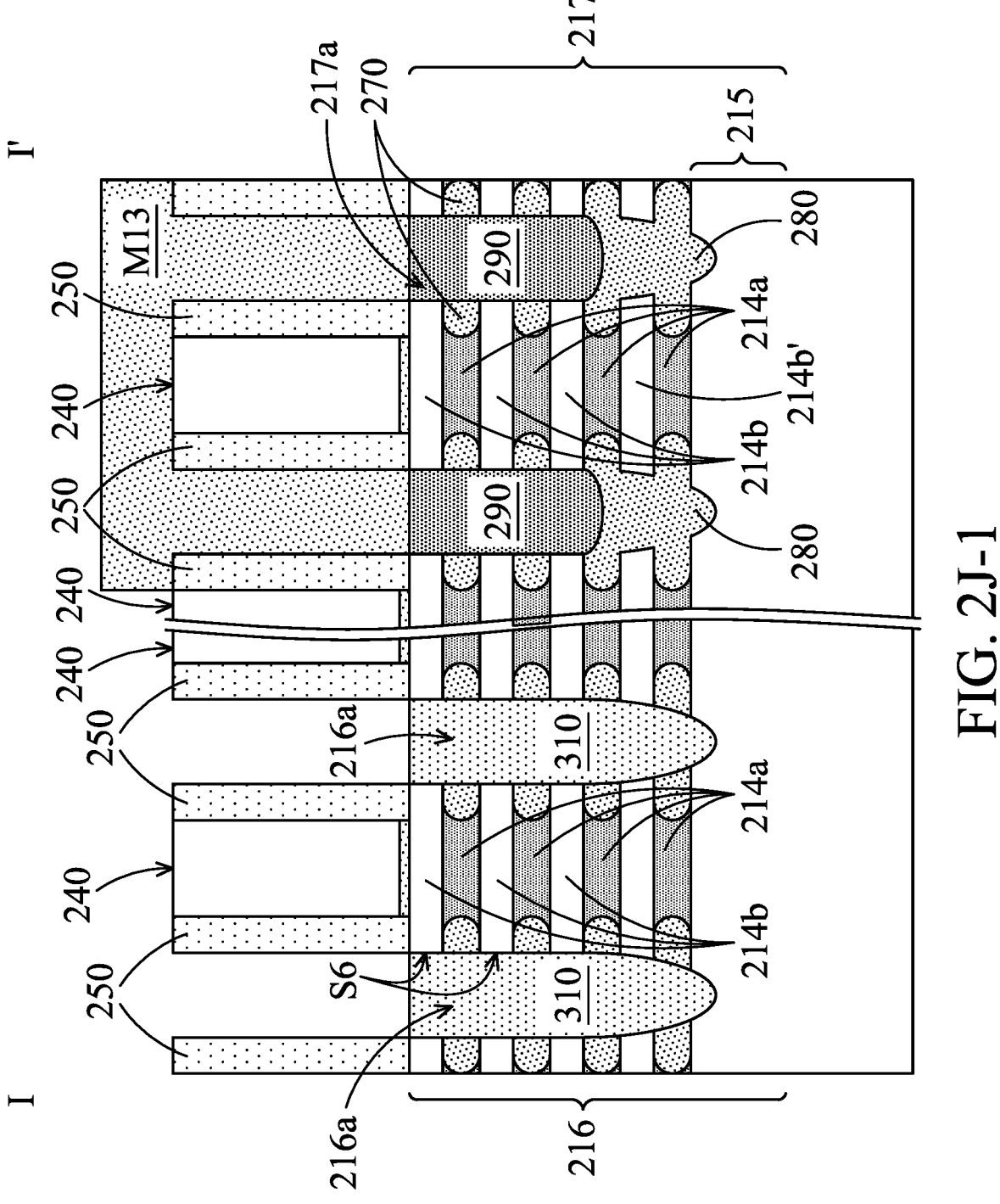
Figure 2K:
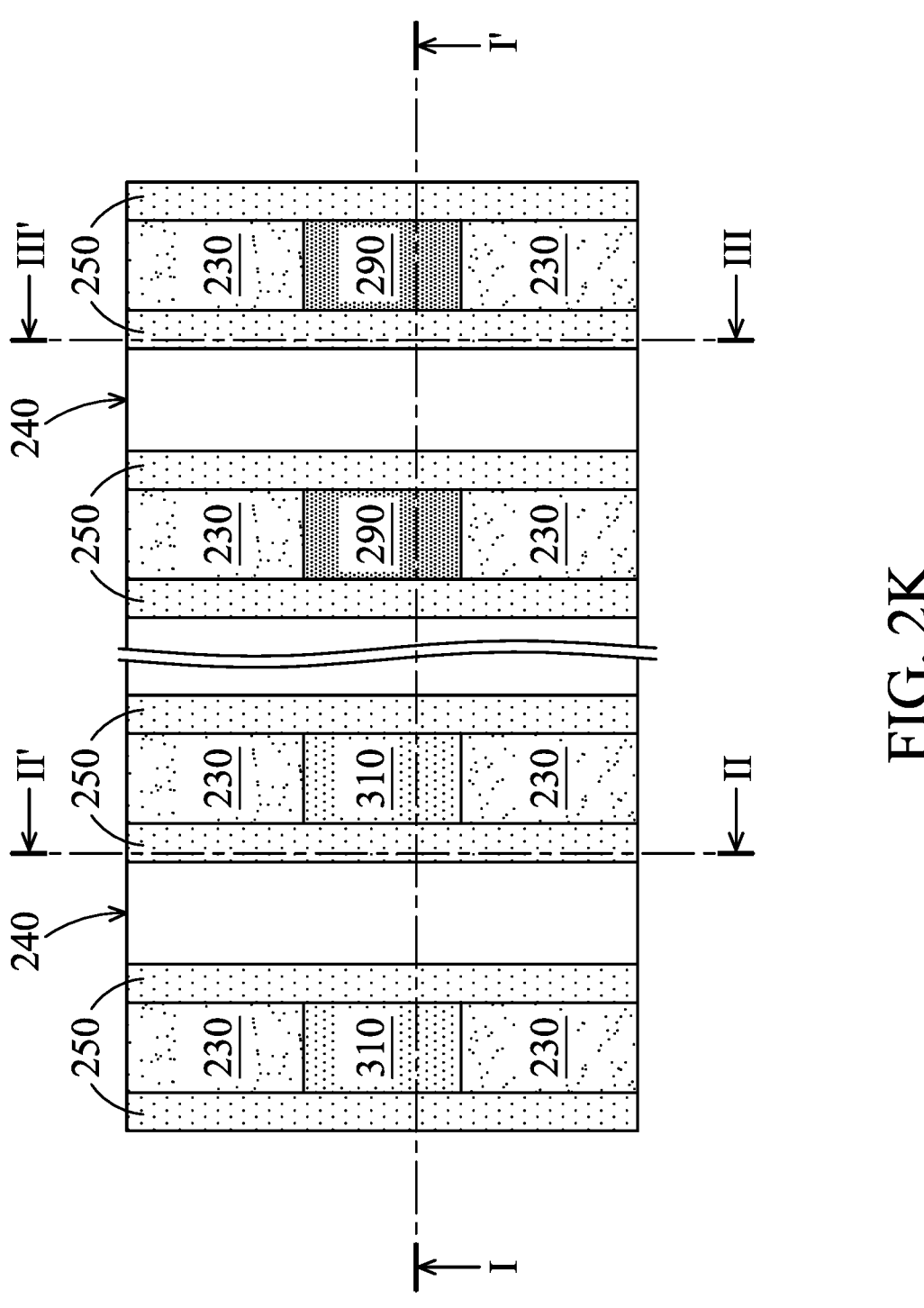
Figures 1, 2K:
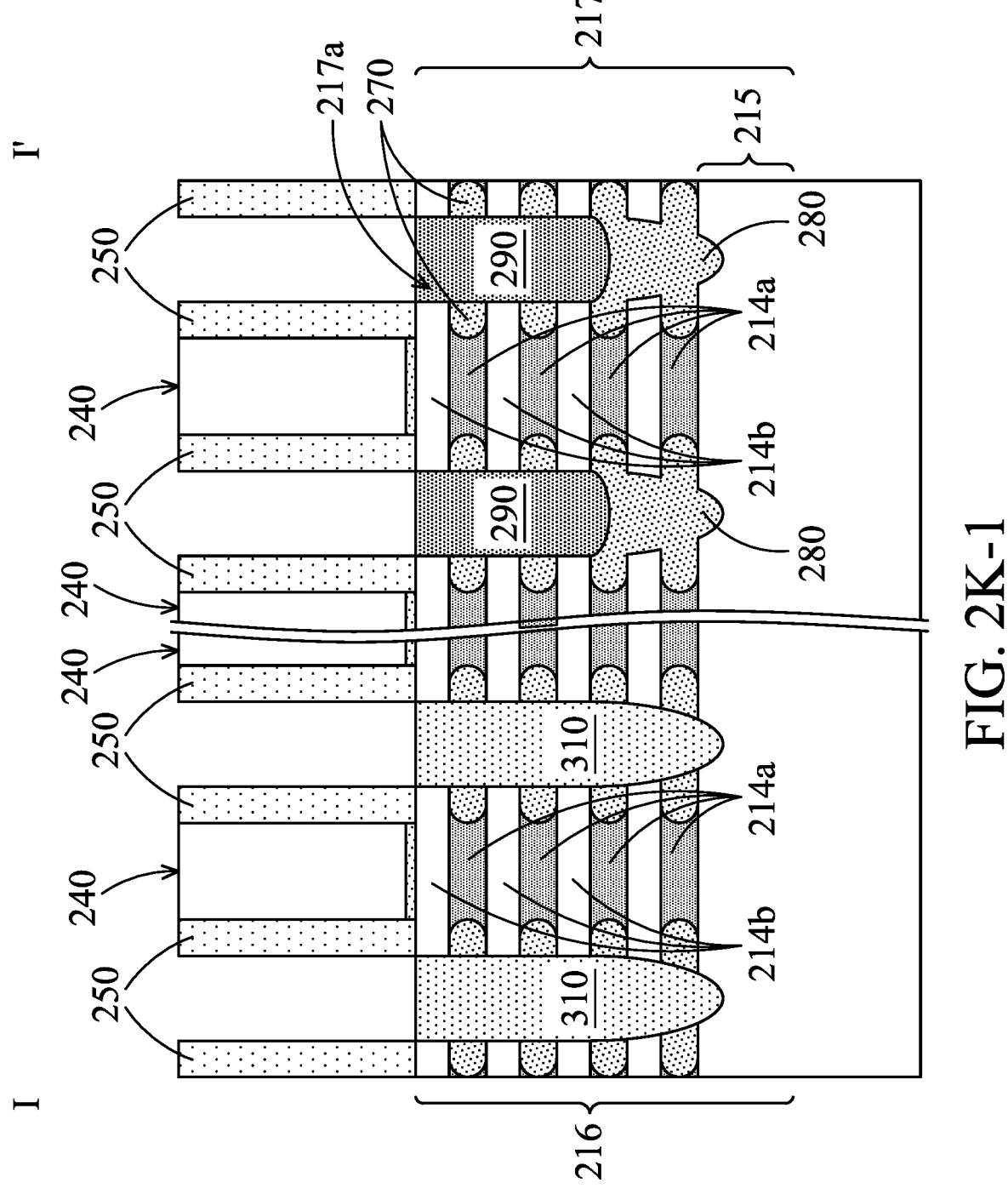
Figures 2, 2K, 3:
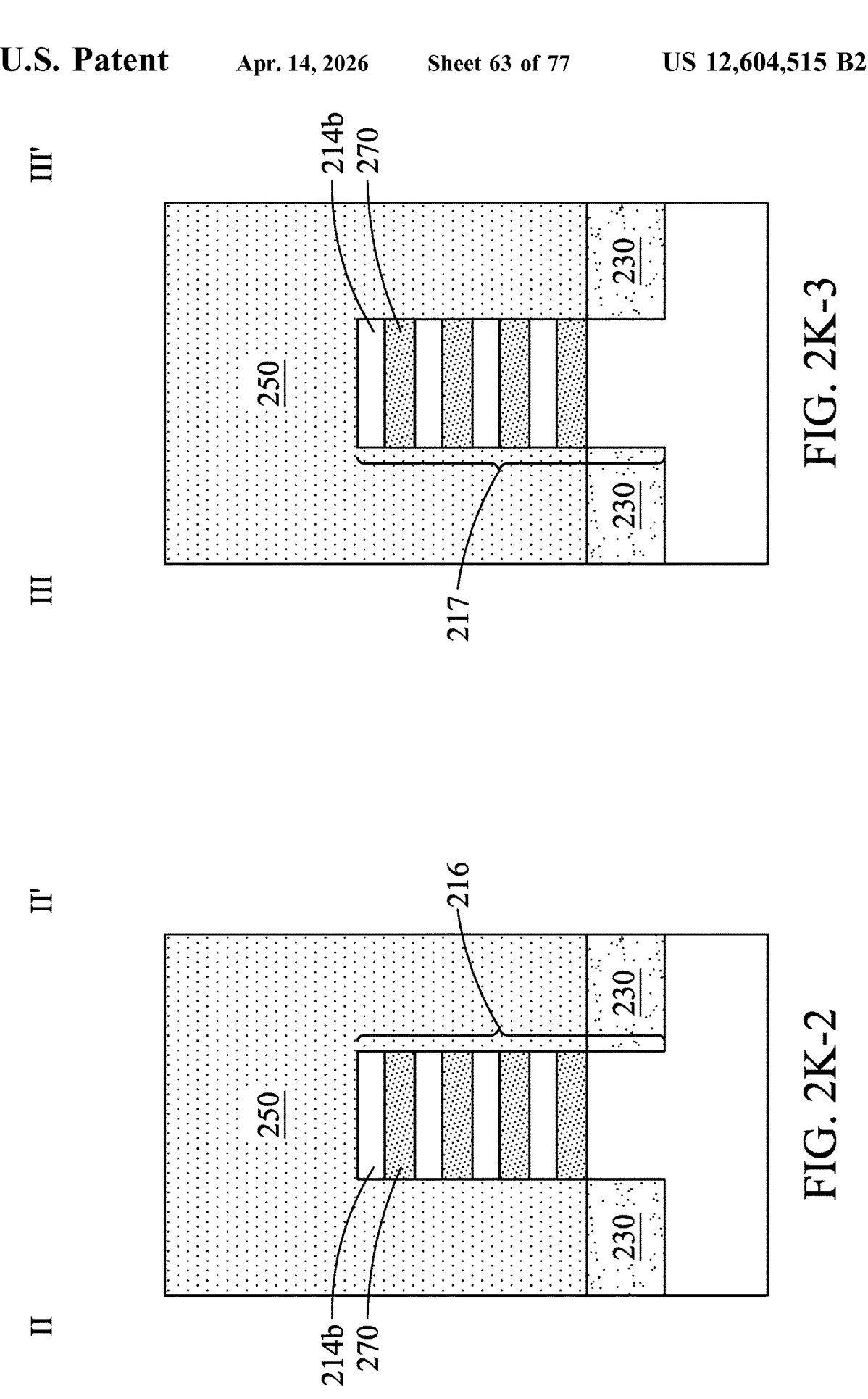

FIG. 2C-4 is a perspective view of the semiconductor device structure of FIG. 2C, in accordance with some embodiments. As shown in FIGS. 2C, 2C-1, 2C-2, 2C-3, and 2C-4, gate stacks 240 are formed over the fin structures 216 and 217, and the dielectric layer 230, in accordance with some embodiments. The gate stacks 240 respectively wrap around the multilayer stacks 214 of the fin structures 216 and 217, in accordance with some embodiments.

Each gate stack 240 includes a gate dielectric layer 242 and a gate electrode 244, in accordance with some embodiments. The gate dielectric layer 242 and the gate electrode 244 are sequentially stacked over the fin structures 216 and 217, in accordance with some embodiments.

The gate dielectric layer 242 is between the gate electrode 244 and the fin structure 216 or 217, in accordance with some embodiments. The gate dielectric layer 242 is made of an insulating material, such as oxide (e.g., silicon oxide), in accordance with some embodiments. The gate electrode 244 is made of a semiconductor material (e.g. polysilicon) or a conductive material (e.g., metal or alloy), in accordance with some embodiments.

The formation of the gate dielectric layer 242 and the gate electrode 244 includes: conformally depositing a gate dielectric material layer (not shown) over the fin structures 216 and 217 and the dielectric layer 230; depositing a gate electrode material layer (not shown) over the gate dielectric material layer; forming a mask layer (not shown) over the gate electrode material layer, wherein the mask layer exposes portions of the gate electrode material layer; removing the exposed portions of the gate electrode material layer and the gate dielectric material layer thereunder; and removing the mask layer, in accordance with some embodiments.

As shown in FIGS. 2C, 2C-1, 2C-2, 2C-3, and 2C-4, a spacer layer 250 is formed over sidewalls of the gate stacks 240, in accordance with some embodiments. In some other embodiments (not shown), the spacer layer 250 is a multi-layered structure. The spacer layer 250 is made of a nitride-containing insulating material, such as silicon nitride (SiN), silicon oxynitride (SiON), silicon oxycarbonitride (SiOCN), or silicon carbonitride (SiCN). The spacer layer 250 is formed using a deposition process, such as a chemical vapor deposition (CVD) process, an atomic layer deposition (ALD) process, or a physical vapor deposition (PVD) process, and an etching process, in accordance with some embodiments.

As shown in FIGS. 2D, 2D-1, 2D-2, and 2D-3, upper portions (i.e., the multilayer structures 214) of the fin structures 216 and 217, which are not covered by the gate stacks 240 and the spacer layer 250, are removed, in accordance with some embodiments.

The removal process forms recesses 216a and 217a respectively in the fin structures 216 and 217, in accordance with some embodiments. Each multilayer structure 214 is divided into multilayer stacks 214S by the recesses 216a and 217a, in accordance with some embodiments. Each multilayer stack 214S includes four layers of the sacrificial layers 214a and four layers of the channel layers 214b, in accordance with some embodiments. The removal process for forming the recesses 216a and 217a includes an etching process, such as an anisotropic etching process (e.g., a dry etching process), in accordance with some embodiments.

As shown in FIGS. 2D, 2D-1, 2D-2, and 2D-3, portions of the sacrificial layers 214a are removed from sidewalls S5 of the sacrificial layers 214a to form recesses R1 in the multilayer stacks 214S, in accordance with some embodiments. Each recess R1 is surrounded by the corresponding sacrificial layer 214a and the corresponding channel layers 214b, in accordance with some embodiments. The removal process includes an etching process, such as an isotropic etching process (e.g., a dry etching process or a wet etching process), in accordance with some embodiments.

As shown in FIGS. 2E, 2E-1, 2E-2, and 2E-3, a spacer material layer 260 is deposited over the multilayer stacks 214S, the bottom portions 215, the gate stacks 240, and the spacer layer 250, in accordance with some embodiments. The spacer material layer 260 fills the recesses R1 of the multilayer stacks 214S, in accordance with some embodiments. The spacer material layer 260 is made of an oxide-containing insulating material, such as silicon oxide. In some other embodiments, the spacer material layer 260 is made of a nitride-containing insulating material, such as silicon nitride (SiN), silicon oxynitride (SiON), silicon oxycarbonitride (SiOCN), or silicon carbonitride (SiCN).

As shown in FIGS. 2F, 2F-1, 2F-2, and 2F-3, portions of the spacer material layer 260 are removed, in accordance with some embodiments. The removal process removes the spacer material layer 260 covering sidewalls S6 of the highest three channel layers 214b of the multilayer stacks 214S, in accordance with some embodiments.

The spacer material layer 260 remaining in the recesses R1 forms an inner spacer layer 270, in accordance with some embodiments. The spacer material layer 260 remaining in the recesses 216a and 217a (or the spacer material layer 260 remaining over the bottom portion 215) forms bottom spacers 280, in accordance with some embodiments.

The channel layers 214b of the fin structures 216 and 217 include lowest channel layers 214b', in accordance with some embodiments. The bottom spacers 280 cover two opposite sidewalls S6 of each lowest channel layer 214b' of the fin structures 216 and 217, in accordance with some embodiments. The lowest channel layer 214b' of the fin structure 216 is between the bottom spacers 280 in the recesses 216a, in accordance with some embodiments. The lowest channel layer 214b' of the fin structure 217 is between the bottom spacers 280 in the recesses 217a, in accordance with some embodiments.

In some other embodiments (not shown), the bottom spacers 280 cover the sidewalls S6 of the lowest two channel layers 214b' or the lowest three channel layers 214b' depending on requirements, in accordance with some embodiments. The removal process includes an isotropic etching process, such as a dry etching process or a wet etching process, in accordance with some embodiments.

As shown in FIGS. 2G, 2G-1, 2G-2, and 2G-3, a mask layer M11 is formed over the bottom spacers 280 in the recesses 217a, the fin structure 217, and the gate stacks 240 over the fin structure 217, in accordance with some embodiments. The mask layer M11 is made of a polymer material (e.g., a photoresist material), or another suitable material, which is different from the materials of the bottom spacers 280, the inner spacer layer 270, the spacer layer 250, the fin structures 216 and 217, and the gate stacks 240, in accordance with some embodiments.

As shown in FIGS. 2H, 2H-1, 2H-2, and 2H-3, the bottom spacers 280 in the recesses 216a are removed, in accordance with some embodiments. The removal process includes an etching process using the mask layer M11 as an etching mask, in accordance with some embodiments. The etching process includes a dry etching process and/or a wet etching process, in accordance with some embodiments. As shown in FIGS. 2H, 2H-1, 2H-2, and 2H-3, the mask layer M11 is removed, in accordance with some embodiments.

As shown in FIGS. 2I, 2I-1, 2I-2, and 2I-3, a mask layer M12 is formed over the fin structure 216 and the gate stacks 240 over the fin structure 216, in accordance with some embodiments. The mask layer M12 is made of a polymer material (e.g., a photoresist material), or another suitable material, which is different from the materials of the inner spacer layer 270, the spacer layer 250, the fin structures 216 and 217, and the gate stacks 240, in accordance with some embodiments.

As shown in FIGS. 2I, 2I-1, 2I-2, and 2I-3, stressors 290 are formed over the sidewalls S6 of the channel layers 214b of the fin structure 217, in accordance with some embodiments. The stressors 290 are in direct contact with the channel layers 214b of the fin structure 217, in accordance with some embodiments. The stressors 290 are positioned in the recesses 217a and over the bottom spacers 280, in accordance with some embodiments.

In some embodiments, the stressors 290 are made of a semiconductor material (e.g., silicon) with N-type dopants, such as the Group VA element, in accordance with some embodiments. The Group VA element includes phosphor (P), antimony (Sb), or another suitable Group VA material. The stressors 290 are formed using an epitaxial process, in accordance with some embodiments.

As shown in FIGS. 2J, 2J-1, 2J-2, and 2J-3, a mask layer M13 is formed over the stressors 290, the fin structure 217, and the gate stacks 240 over the fin structure 217, in accordance with some embodiments. The mask layer M13 is made of a polymer material (e.g., a photoresist material), or another suitable material, which is different from the materials of the stressors 290, the gate stacks 240, the spacer layer 250, and the fin structures 216 and 217, in accordance with some embodiments.

As shown in FIGS. 2J, 2J-1, 2J-2, and 2J-3, stressors 310 are formed over the sidewalls S6 of the channel layers 214b of the fin structure 216, in accordance with some embodiments. The stressors 310 are in direct contact with the channel layers 214b of the fin structure 216, in accordance with some embodiments. The stressors 310 are positioned in the recesses 216a, in accordance with some embodiments.

In some embodiments, the stressors 310 are made of a semiconductor material (e.g., silicon germanium) with P-type dopants, such as the Group IIIA element, in accordance with some embodiments. The Group IIIA element includes boron or another suitable material.

As shown in FIGS. 2K, 2K-1, 2K-2, and 2K-3, the mask layer M13 is removed, in accordance with some embodiments. As shown in FIGS. 2L, 2L-1, 2L-2, and 2L-3, a dielectric layer 320 is formed over the stressors 290 and 310 and the dielectric layer 230, in accordance with some embodiments. The dielectric layer 320 is made of an oxide-containing insulating material, such as silicon oxide, or a nitride-containing insulating material, such as silicon nitride, silicon oxynitride, silicon oxycarbonitride, or silicon carbonitride, in accordance with some embodiments.

Figure 2L:
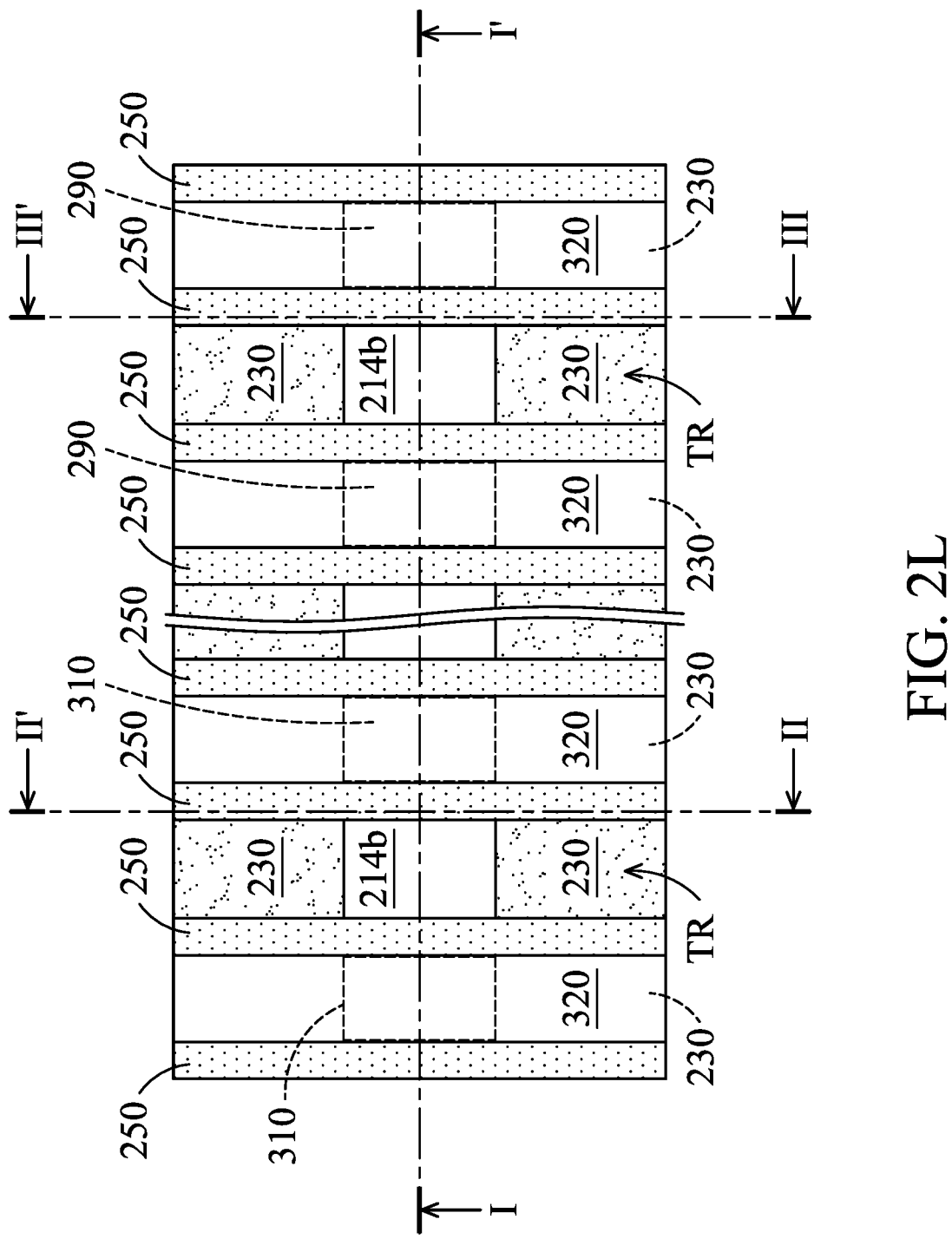
Figures 1, 2L:
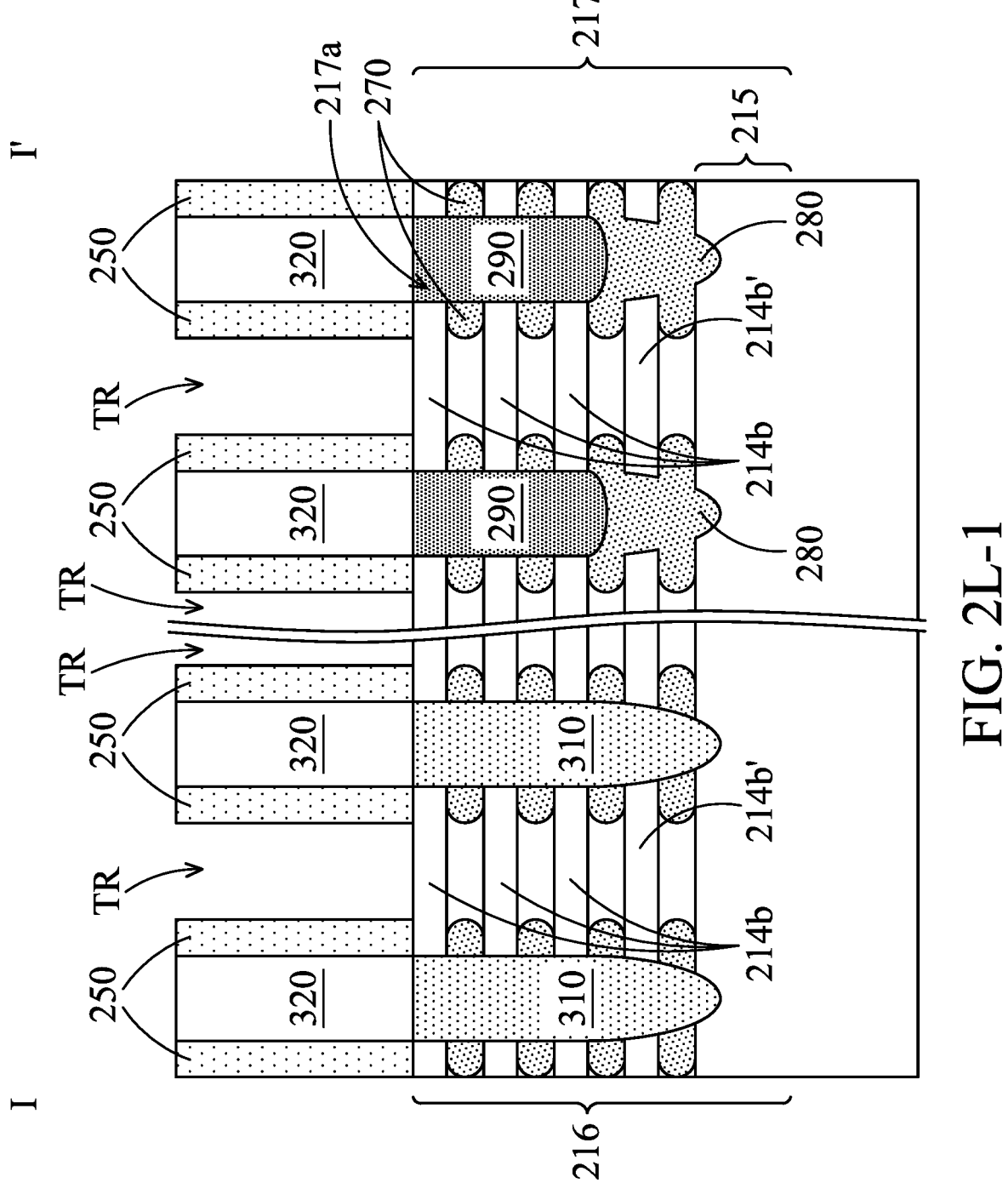
Figures 2, 2L, 3:
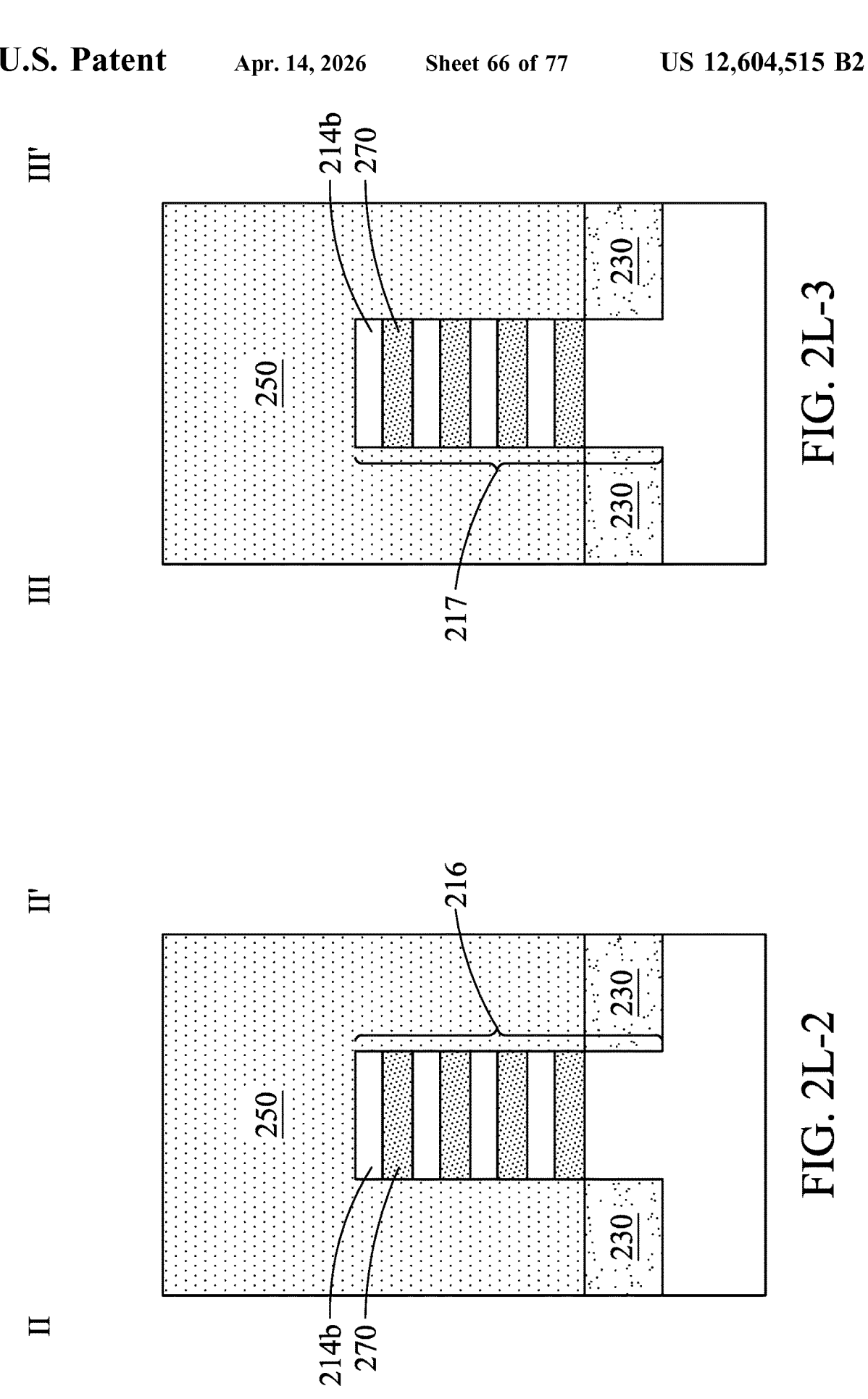
Figure 2M:
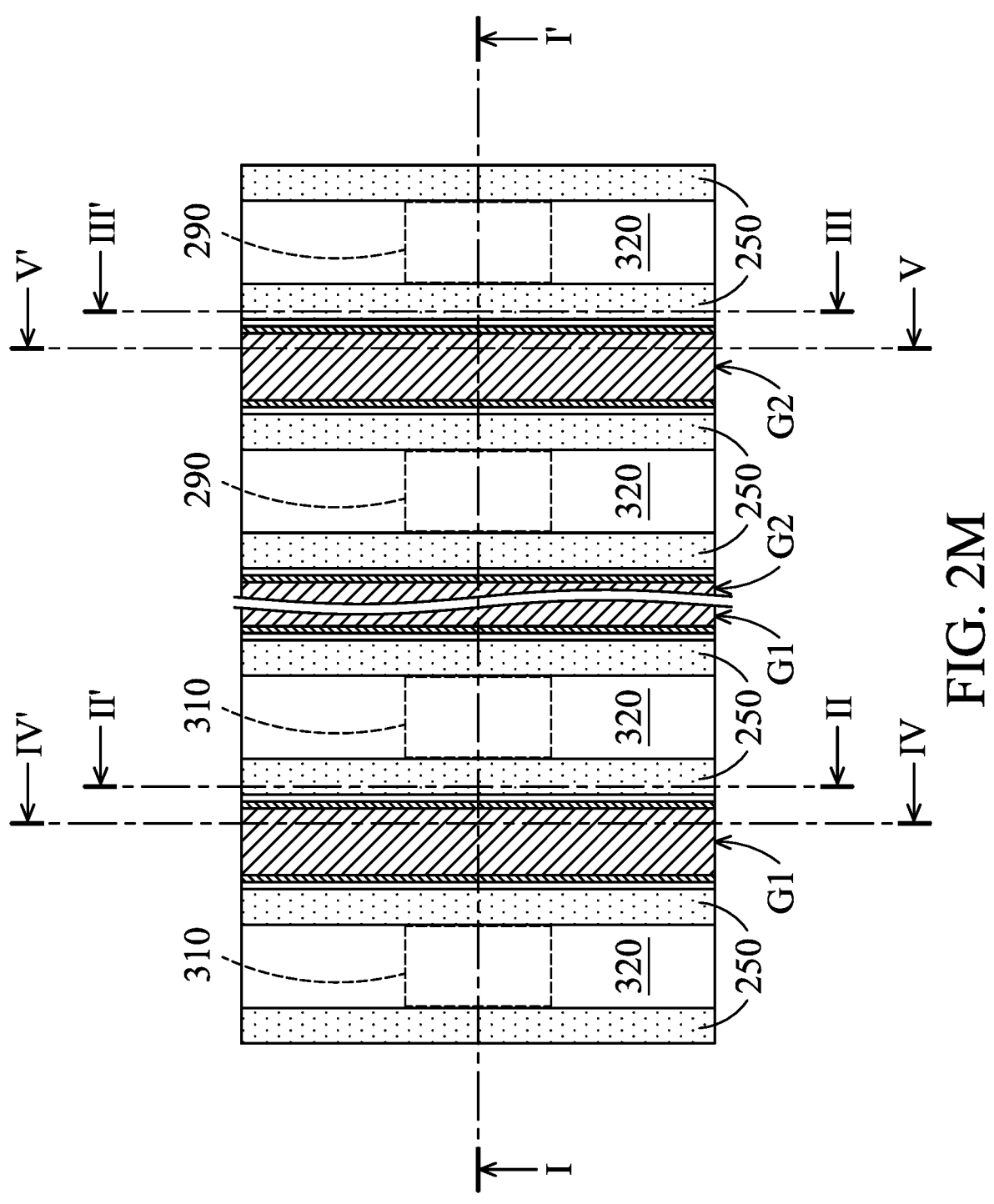
Figures 1, 2M:
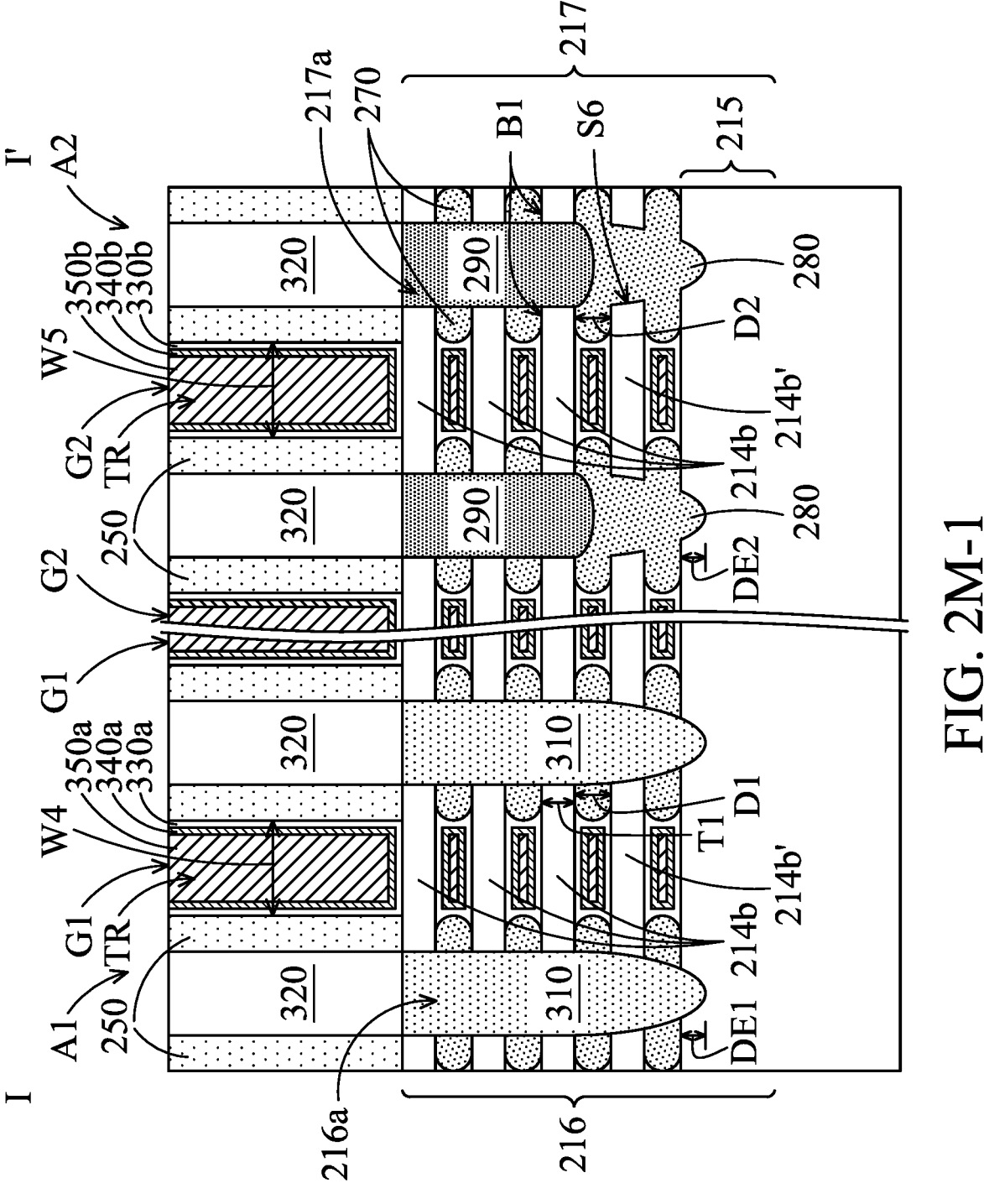
Figures 2, 2M, 3:
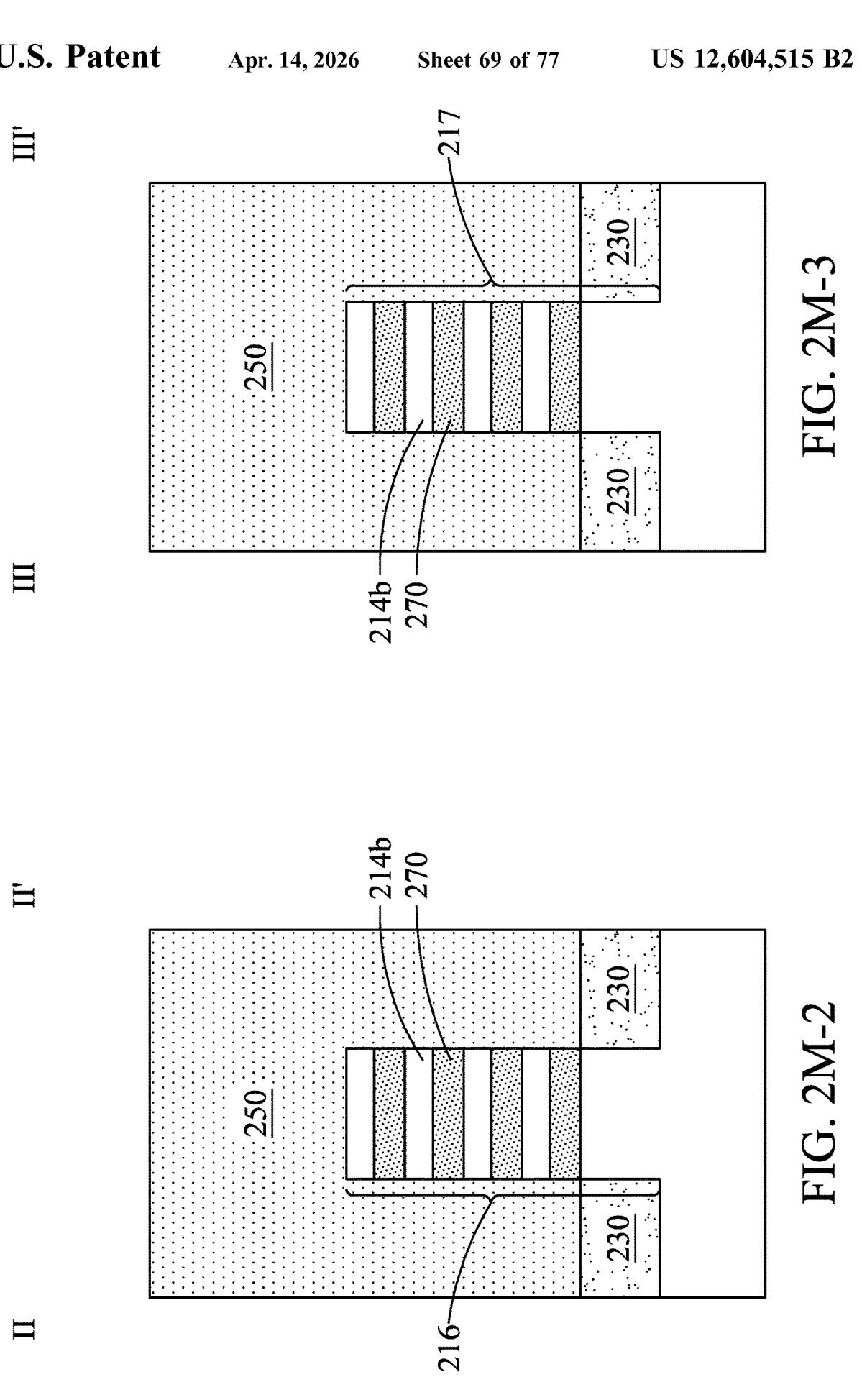
Figures 2, 2M, 3, 4:
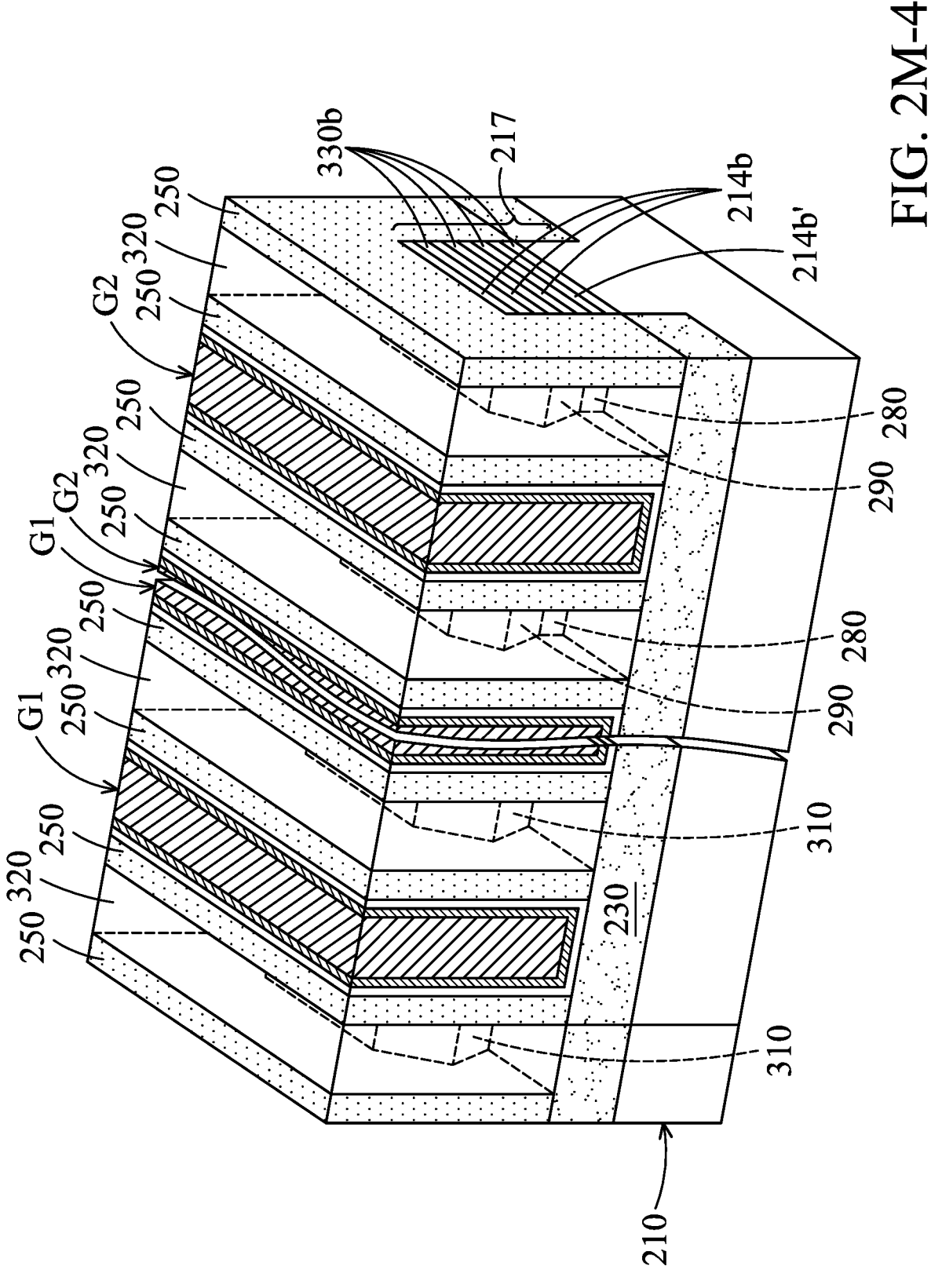

As shown in FIGS. 2L and 2L-1, the gate stacks 240 are removed to form trenches TR in the spacer layer 250, in accordance with some embodiments. The removal process includes an etching process, such as a wet etching process or a dry etching process, in accordance with some embodiments.

As shown in FIGS. 2L and 2L-1, the sacrificial layers 214a are removed through the trenches TR, in accordance with some embodiments. The removal process includes an etching process, such as a wet etching process or a dry etching process, in accordance with some embodiments.

FIG. 2M-4 is a perspective view of the semiconductor device structure of FIG. 2M, in accordance with some embodiments. As shown in FIGS. 2M, 2M-1, 2M-2, 2M-3, and 2M-4, gate stacks G1 and G2 are respectively formed in the trenches TR, in accordance with some embodiments. The gate stacks G1 are formed over the channel layers 214b of the fin structure 216, in accordance with some embodiments. The gate stacks G2 are formed over the channel layers 214b of the fin structure 217, in accordance with some embodiments.

As shown in FIG. 2M-1, each gate stack G1 includes a gate dielectric layer 330a, a work function metal layer 340a, and a gate electrode layer 350a, in accordance with some embodiments. The gate dielectric layer 330a, the work function metal layer 340a, and the gate electrode layer 350a are sequentially stacked over the channel layers 214b of the fin structure 216, in accordance with some embodiments.

Each gate stack G2 includes a gate dielectric layer 330b, a work function metal layer 340b, and a gate electrode layer 350b, in accordance with some embodiments. The gate dielectric layer 330b, the work function metal layer 340b, and the gate electrode layer 350b are sequentially stacked over the channel layers 214b of the fin structure 217, in accordance with some embodiments.

In some embodiments, a dielectric constant of the gate dielectric layers 330a and 330b is greater than a dielectric constant of silicon dioxide. The gate dielectric layers 330a and 330b are also referred to as high dielectric-constant (high-k) layers, in accordance with some embodiments. The gate dielectric layers 330a and 330b are made of a high-k dielectric material, such as hafnium dioxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

The work function metal layers 340a and 340b are made of different materials, in accordance with some embodiments. The gate stack G1 is used to form a PMOS transistor, and therefore the work function metal layer 340a is used to provide a work function value suitable for the device, such as equal to or greater than about 4.8 eV, in accordance with some embodiments. The work function metal layer 340a may be made of metal, metal carbide, metal nitride, other suitable materials, or a combination thereof. For example, the work function metal layer 340a is made of titanium, titanium nitride, other suitable materials, or a combination thereof.

The gate stack G2 is used to form a NMOS transistor, and therefore the work function metal layer 340b is used to provide a work function value suitable for the device, such as equal to or less than about 4.5 eV. The work function metal layer 340b may be made of metal, metal carbide, metal nitride, or a combination thereof. For example, the work function metal layer 340b is made of tantalum, tantalum nitride, or a combination thereof.

The gate electrode layers 350a and 350b are made of a suitable conductive material, such as metal (e.g., aluminum, tungsten, gold, platinum, or cobalt), an alloy thereof, or a combination thereof, in accordance with some embodiments. The lowest channel layer 214b' of the fin structure 217 is electrically insulated from the stressors 290 and the bottom portion 215 thereunder by the bottom spacers 280 in the recesses 217a, in accordance with some embodiments. The bottom spacers 280 separate the stressors 290 from the lowest channel layers 214b', in accordance with some embodiments.

As shown in FIG. 2M-1, the gate stack G1 and the stressors 310 adjacent thereto together form a transistor A1, in accordance with some embodiments. The transistor A1 includes a p-type field-effect transistor (pFET), in accordance with some embodiments. The gate stack G2 and the stressors 290 adjacent thereto together form a transistor A2, in accordance with some embodiments. The transistor A2 includes a n-type field-effect transistor (nFET), in accordance with some embodiments.

As shown in FIGS. 2M-5 and 2M-6, electrons have a high mobility on (100) surfaces B1 of the channel layers 214b, and holes have a high mobility on (110) surfaces B2 of the channel layers 214b, in accordance with some embodiments. Since the width W3 of the (100) surface is greater than the height H1 of the (110) surface B2, the nFET tends to have a higher driving current than that of the pFET, which results in a current mismatch between the nFET and the pFET and therefore the performance of the nFET and the pFET is reduced, in accordance with some embodiments. The bottom spacers 280 are used to reduce the number of the channel layers 214b connected to the stressors 290, in accordance with some embodiments. Therefore, the driving current of the transistor A2 (i.e., the nFET) is reduced to match the driving current of the transistor A1 (i.e., the pFET), in accordance with some embodiments. Therefore, the performance of the transistors A1 and A2 is improved, in accordance with some embodiments.

The reduction of the number of the channel layers connected to the stressors may be applied to different requirements, such as reduction of a driving current of a transistor, reduction of a capacitance of a capacitor, or improvement in speed of an I/O device. The speed of the I/O device is negatively related to the parasitic capacitance.

As shown in FIG. 2M-1, the gate stack G1 or G2 has a width W4 or W5 ranges from about 5 nm to about 20 nm, in accordance with some embodiments. Each channel layer 214b has a thickness Ti ranges from about 2 nm to about 10 nm, in accordance with some embodiments. The two adjacent channel layers 214b of the fin structure 216 are spaced apart by a distance D1 ranging from about 5 nm to about 15 nm, in accordance with some embodiments. The two adjacent channel layers 214b of the fin structure 217 are spaced apart by a distance D2 ranging from about 5 nm to about 18 nm, in accordance with some embodiments. The recesses 216a extend into the bottom portion 215 to a depth DE1 ranging from about 1 nm to about 15 nm, in accordance with some embodiments. The recesses 217a extend into the bottom portion 215 to a depth DE2 ranging from about 1 nm to about 15 nm, in accordance with some embodiments. In some other embodiments (not shown), the recesses 216a and 217a do not extend into the bottom portion 215.

Figure 3A:
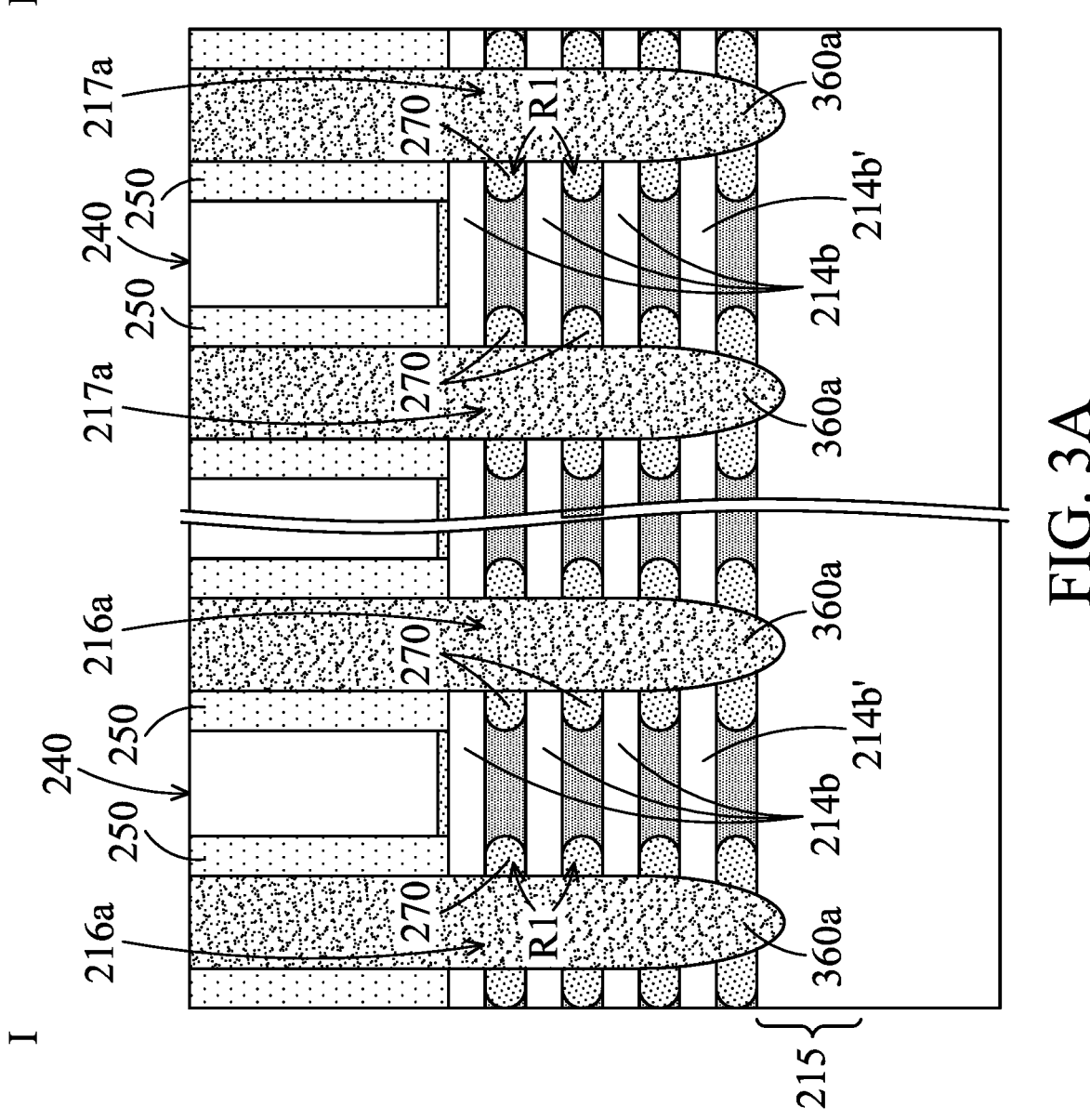
FIGS. 3A-3C are cross-sectional views of various stages of a process for forming a semiconductor device structure, in accordance with some embodiments.
Figure 3B:
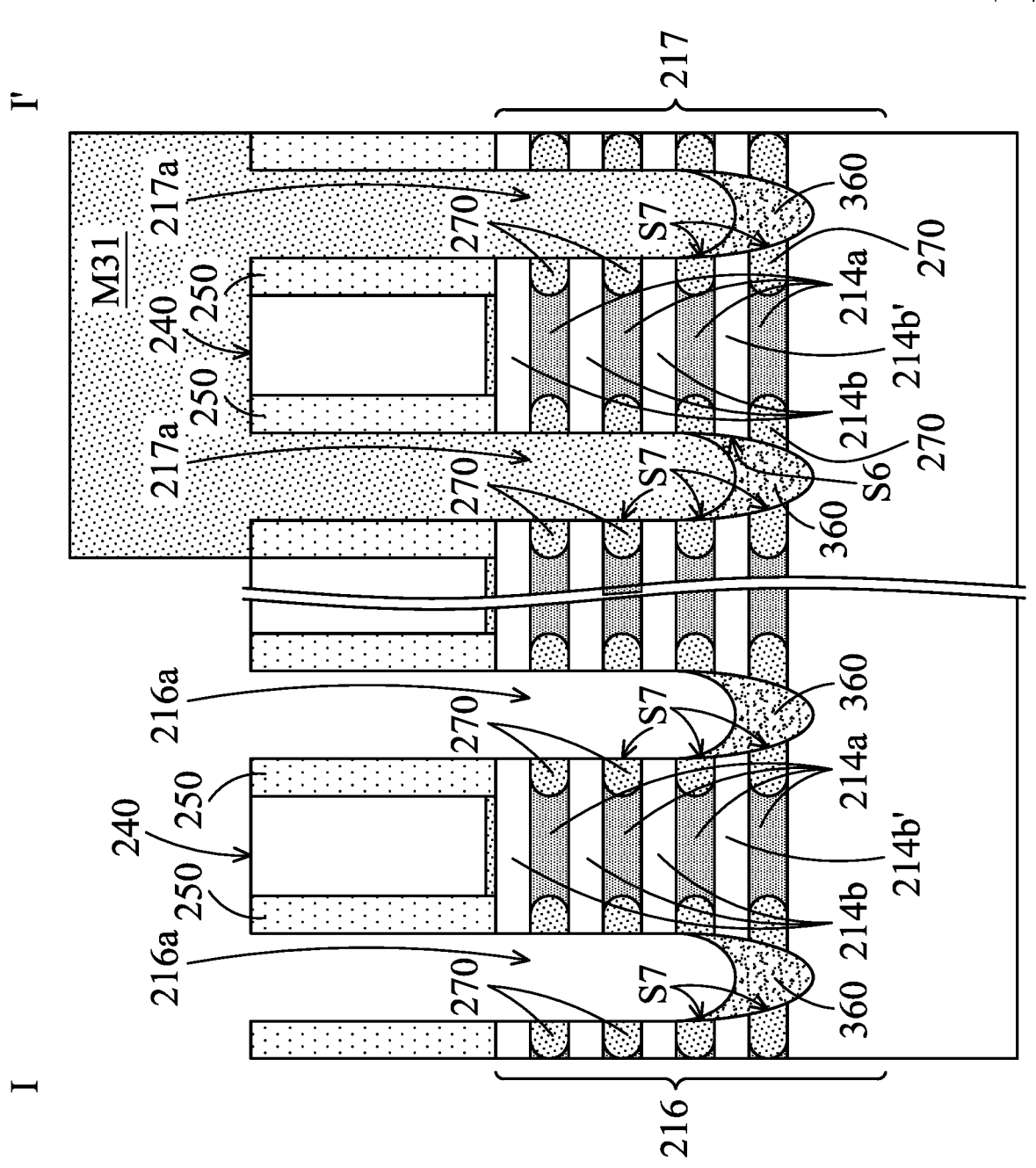
Figure 3C:
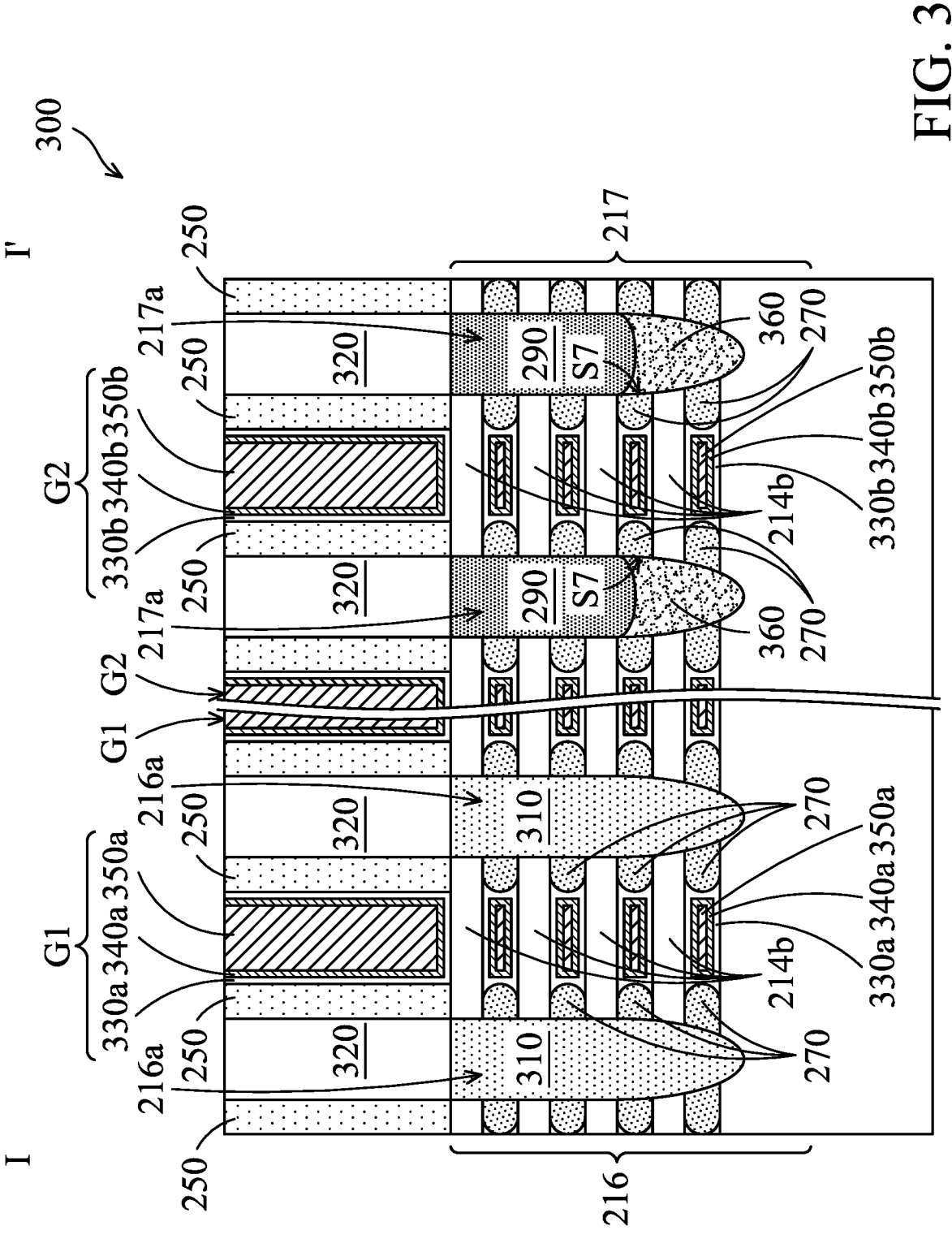

FIGS. 3A-3C are cross-sectional views of various stages of a process for forming a semiconductor device structure, in accordance with some embodiments. As shown in FIG. 3A, after the step of FIG. 2E, the spacer material layer 260 outside of the recesses R1 is removed, in accordance with some embodiments. The spacer material layer 260 remaining in the recesses R1 forms an inner spacer layer 270, in accordance with some embodiments.

As shown in FIG. 3A, a bottom spacer material layer 360a is formed in the recesses 216a and 217a, in accordance with some embodiments. The inner spacer layer 270 and the bottom spacer material layer 360a are made of different materials, in accordance with some embodiments. In some other embodiments, the inner spacer layer 270 and the bottom spacer material layer 360a are made of the same material.

The bottom spacer material layer 360a is made of an oxide-containing insulating material, such as silicon oxide. In some other embodiments, the bottom spacer material layer 360a is made of a nitride-containing insulating material, such as silicon nitride (SiN), silicon oxynitride (SiON), silicon oxycarbonitride (SiOCN), or silicon carbonitride (SiCN).

The bottom spacer material layer 360a is formed using a deposition process (e.g., a chemical vapor deposition process or a physical vapor deposition process) and a planarization process (e.g., a chemical mechanical polishing process), in accordance with some embodiments.

As shown in FIG. 3B, an upper portion of the bottom spacer material layer 360a is removed, in accordance with some embodiments. The bottom spacer material layer 360a remaining in the recesses 216a and 217a forms bottom spacers 360, in accordance with some embodiments. The bottom spacers 360 cover the sidewalls S6 of the lowest channel layers 214b' of the fin structures 216 and 217 and a sidewall S7 of a lower portion of the inner spacer layer 270, in accordance with some embodiments. The removal process includes an etching process, such as a dry etching process or a wet etching process, in accordance with some embodiments.

Thereafter, as shown in FIG. 3B, a mask layer M31 is formed over the bottom spacers 360 in the recesses 217a, the fin structure 217, the gate stacks 240 over the fin structure 217, and the spacer layer 250 over the fin structure 217, in accordance with some embodiments. The mask layer M31 is made of a polymer material (e.g., a photoresist material), or another suitable material, which is different from the materials of the bottom spacers 360, the inner spacer layer 270, the spacer layer 250, the fin structures 216 and 217, and the gate stacks 240, in accordance with some embodiments.

As shown in FIGS. 3B and 3C, the bottom spacers 360 in the recesses 216a are removed, in accordance with some embodiments. The removal process includes an etching process using the mask layer M31 as an etching mask, in accordance with some embodiments. Thereafter, the steps of FIGS. 2I-2M are performed to form the stressors 290 and 310, the dielectric layer 320, and the gate stacks G1 and G2, in accordance with some embodiments. In this step, a semiconductor device structure 300 is substantially formed, in accordance with some embodiments.

Figure 4A:
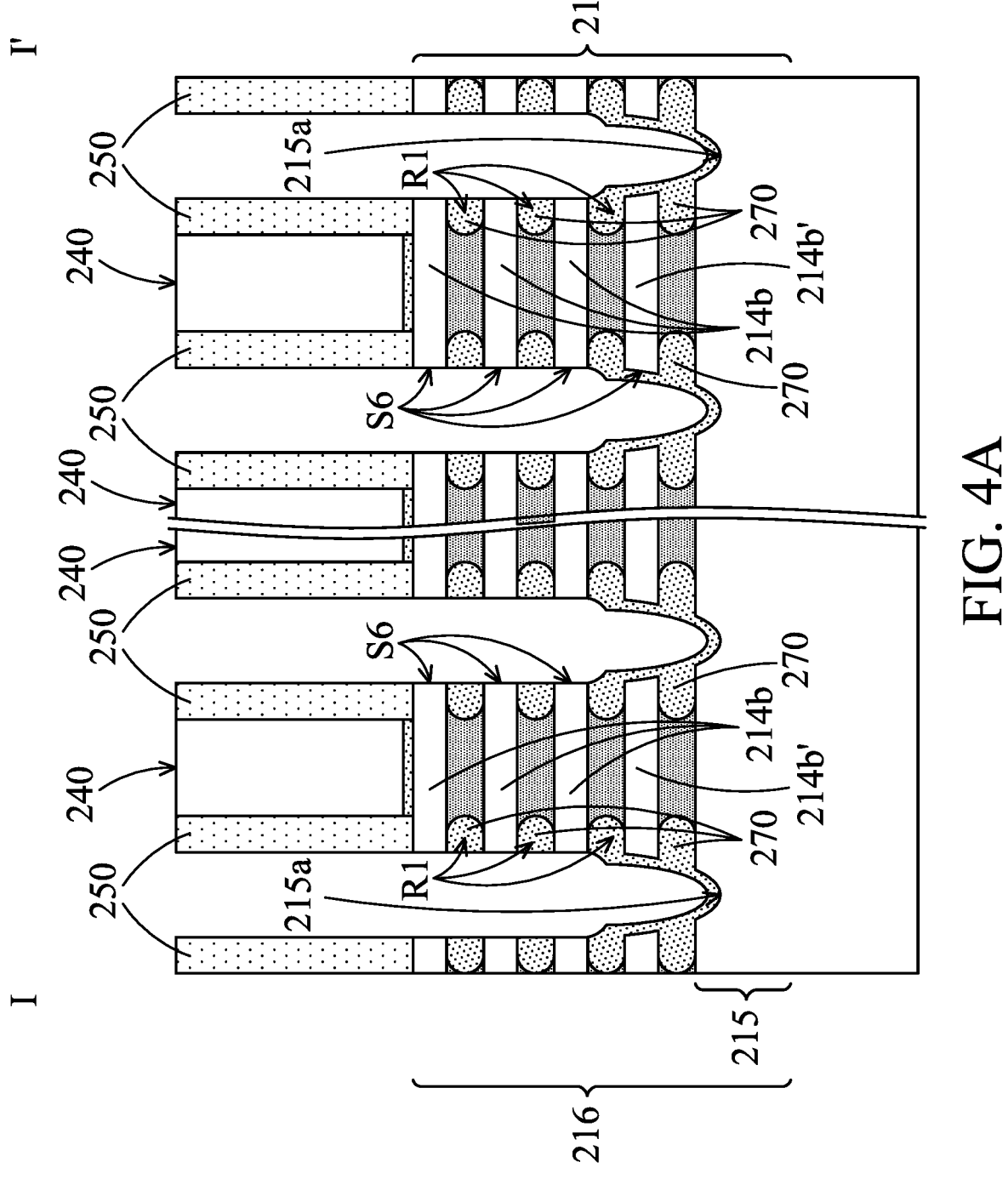
FIGS. 4A-4B are cross-sectional views of various stages of a process for forming a semiconductor device structure, in accordance with some embodiments.
Figure 4B:
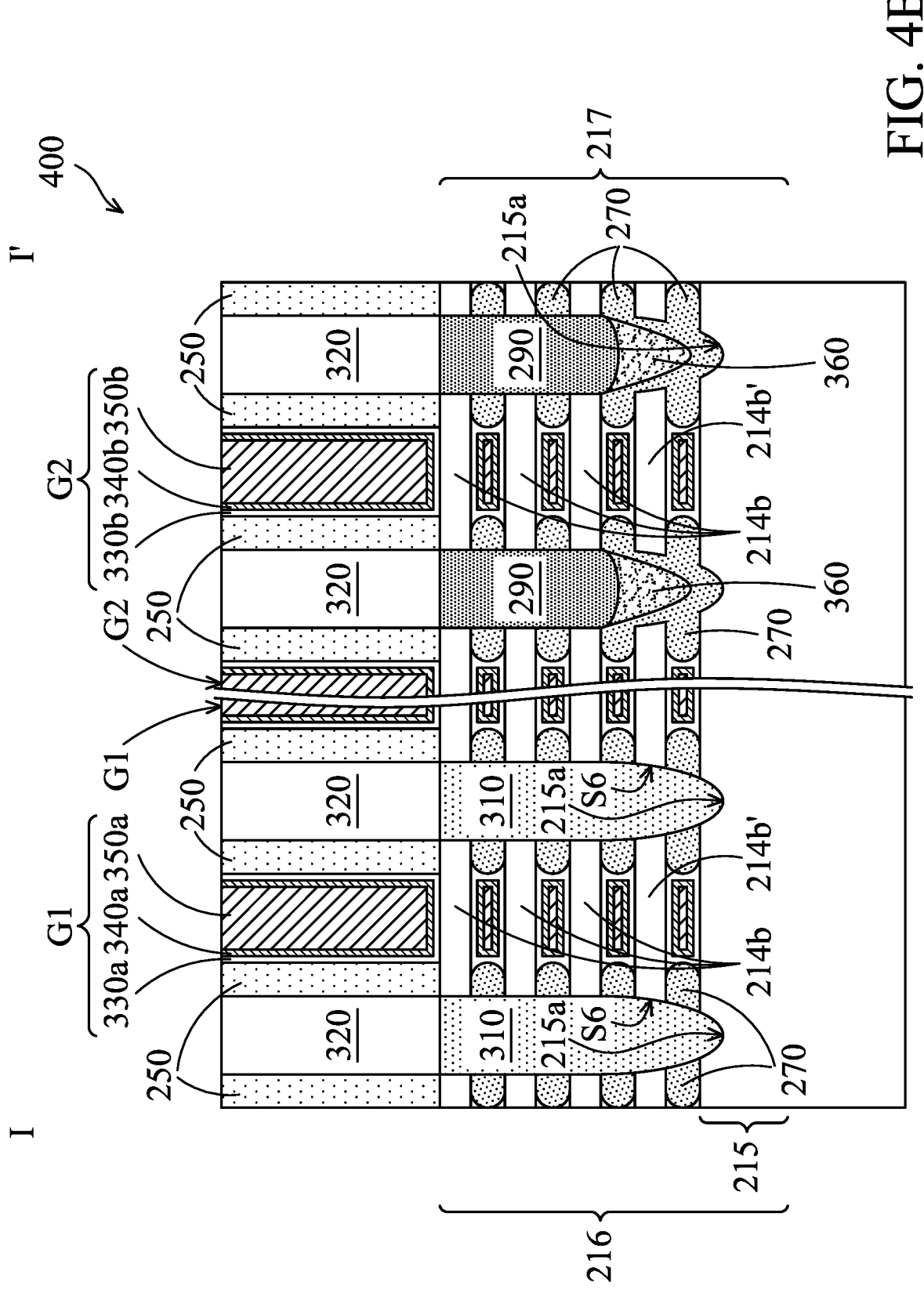
Figure 5:
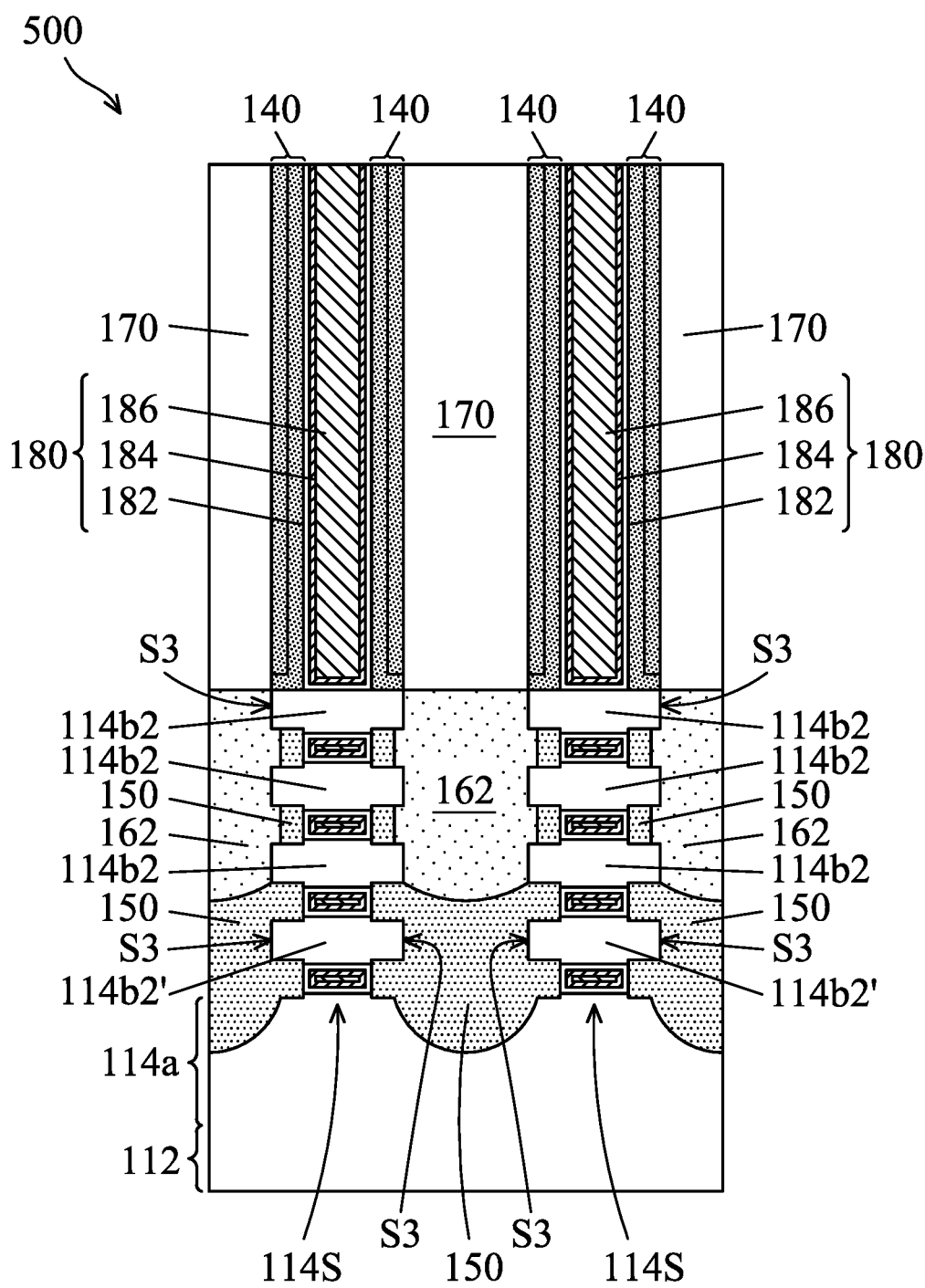

FIGS. 4A-4B are cross-sectional views of various stages of a process for forming a semiconductor device structure, in accordance with some embodiments. As shown in FIG. 4A, after the step of FIG. 2E, the spacer material layer 260 covering the sidewalls S6 of the highest three channel layers 214b of the fin structures 216 and 217 is removed, in accordance with some embodiments.

The spacer material layer 260 remaining in the recesses R1 forms an inner spacer layer 270, in accordance with some embodiments. The inner spacer layer 270 covers the sidewalls S6 of the lowest channel layers 214b' of the fin structures 216 and 217 and the upper surface 215a of the bottom portion 215, in accordance with some embodiments.

As shown in FIG. 4B, the inner spacer layer 270 covering the sidewalls S6 of the lowest channel layers 214b' and the upper surface 215a of the bottom portion 215 of the fin structure 216 is removed, in accordance with some embodiments. The remaining inner spacer layer 270 covering the sidewalls S6 of the lowest channel layers 214b' and the upper surface 215a of the bottom portion 215 of the fin structure 217, in accordance with some embodiments.

Thereafter, the steps of FIGS. 3A-3B are performed to form bottom spacers 360 over the inner spacer layer 270 over the fin structure 217, in accordance with some embodiments. Afterwards, the steps of 2I-2M are performed to form the stressors 290 and 310, the dielectric layer 320, and the gate stacks G1 and G2, in accordance with some embodiments. In this step, a semiconductor device structure 400 is substantially formed, in accordance with some embodiments.

Figures 2, 2M, 3, 4, 5, 6:
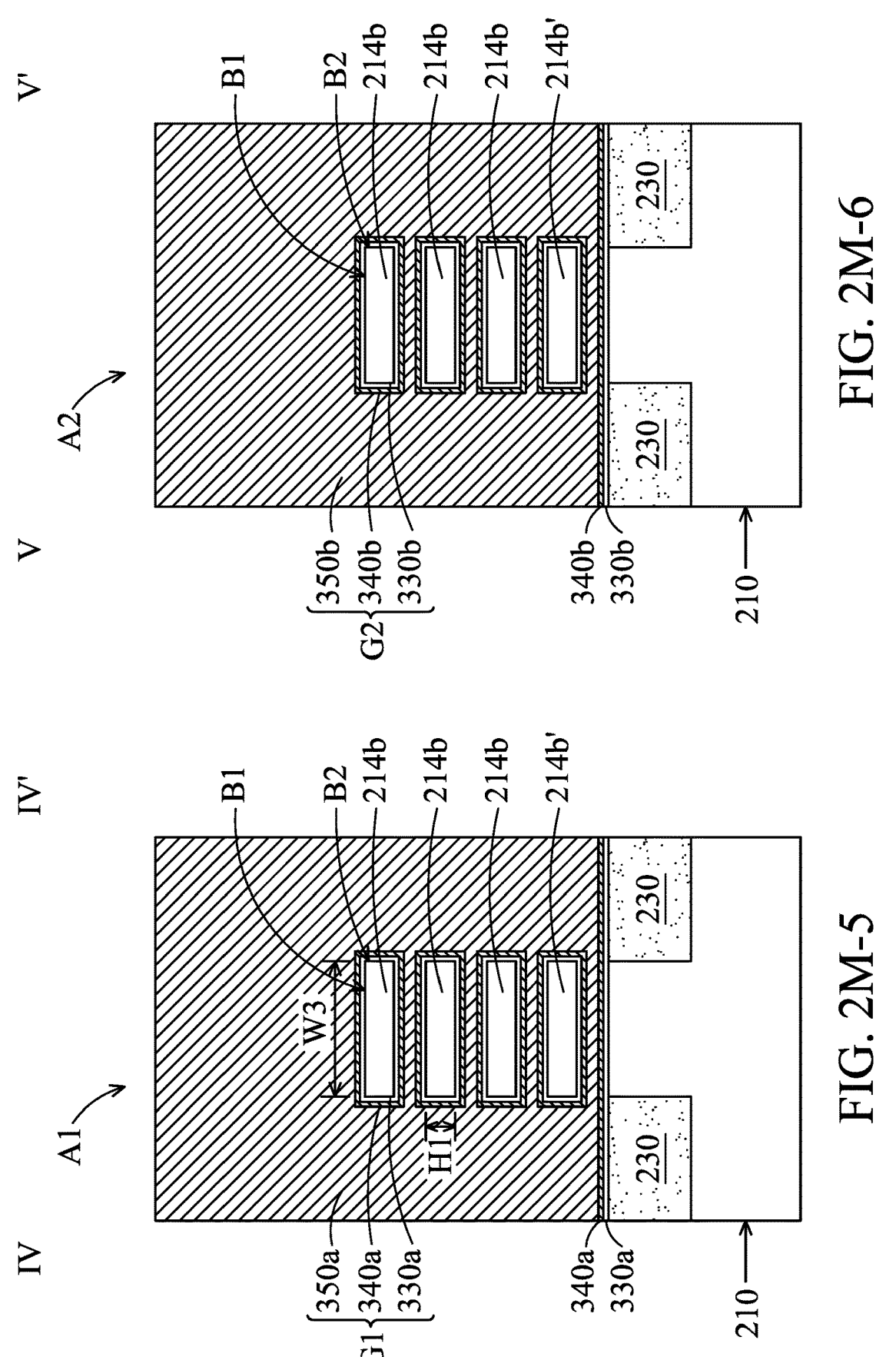

FIG. 5 is a cross-sectional view of a semiconductor device structure 500, in accordance with some embodiments. As shown in FIG. 5, the semiconductor device structure 500 is similar to the semiconductor device structure 100 of FIG. 1H-1, except that the inner spacer layer 150 of the semiconductor device structure 500 further covers the sidewalls S3 of the lowest channel layers 114b2' of the multilayer stacks 114s, in accordance with some embodiments. Therefore, the inner spacer layer 150 electrically insulates the lowest channel layers 114b2' from the stressors 162, in accordance with some embodiments. The lowest channel layers 114b2' are electrically insulated from the bottom portion 114a and other channel layers 114b2, in accordance with some embodiments.

In accordance with some embodiments, semiconductor device structures and methods for forming the same are provided. The methods (for forming the semiconductor device structure) form a spacer layer between a fin structure and a source/drain structure to electrically insulate the fin structure from the source/drain structure. Therefore, the spacer layer prevents current leakage between the source/drain structure and the fin structure.

In accordance with some embodiments, a semiconductor device structure is provided. The semiconductor device structure includes a substrate having a base. The semiconductor device structure includes a first multilayer stack over the base. The first multilayer stack includes a first channel layer and a second channel layer over and spaced apart from the first channel layer. The semiconductor device structure includes a gate stack over the substrate. The gate stack wraps around the first multilayer stack. The semiconductor device structure includes an inner spacer layer between the second channel layer and the first channel layer and between the first channel layer and the base. The semiconductor device structure includes a bottom spacer over the base. The semiconductor device structure includes a first source/drain structure over the bottom spacer and connected to the second channel layer. The bottom spacer separates the first source/drain structure from the base, and the bottom spacer and the inner spacer layer are made of a same material.

In accordance with some embodiments, a semiconductor device structure is provided. The semiconductor device structure includes a substrate having a base. The semiconductor device structure includes a multilayer stack over the base. The multilayer stack includes a first channel layer and a second channel layer over and spaced apart from the first channel layer. The semiconductor device structure includes a gate stack over the substrate. The gate stack wraps around the multilayer stack. The semiconductor device structure includes an inner spacer layer between the second channel layer and the first channel layer and between the first channel layer and the base. The semiconductor device structure includes a bottom spacer over the base and covering a first sidewall of the first channel layer. The semiconductor device structure includes a source/drain structure over the bottom spacer and connected to the second channel layer. The source/drain structure is electrically insulated from the first channel layer.

In accordance with some embodiments, a semiconductor device structure is provided. The semiconductor device structure includes a substrate. The semiconductor device structure includes a multilayer stack over the substrate. The multilayer stack includes a first channel layer and a second channel layer over and spaced apart from the first channel layer. The semiconductor device structure includes a gate stack over the substrate. The gate stack wraps around the multilayer stack. The semiconductor device structure includes an inner spacer layer between the second channel layer and the first channel layer and between the first channel layer and the substrate and covering a sidewall of the first channel layer. The inner spacer layer has a concave top surface facing away from the substrate. The semiconductor device structure includes a source/drain structure over the inner spacer layer and connected to the second channel layer. The source/drain structure is electrically insulated from the first channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a substrate having a base;
a first multilayer stack over the base, wherein the first multilayer stack comprises a first channel layer and a second channel layer over and spaced apart from the first channel layer;
a gate stack over the substrate, wherein the gate stack wraps around the first multilayer stack;
an inner spacer layer between the second channel layer and the first channel layer and between the first channel layer and the base;
a bottom spacer over the base, wherein a bottom of the inner spacer layer is located vertically between a top of the bottom spacer and a bottom of the bottom spacer; and
a first source/drain structure over the bottom spacer and connected to the second channel layer, wherein the bottom spacer separates the first source/drain structure from the base, and the bottom spacer and the inner spacer layer are made of a same material.

2. The semiconductor device structure as claimed in claim 1, wherein the bottom spacer is connected to the inner spacer layer.

3. The semiconductor device structure as claimed in claim 1, wherein the first source/drain structure extends into the bottom spacer.

4. The semiconductor device structure as claimed in claim 1, further comprising:
a second multilayer stack over the base, wherein the gate stack further wraps around the second multilayer stack, and the second multilayer stack is wider than the first multilayer stack.

5. The semiconductor device structure as claimed in claim 4, further comprising:
a second source/drain structure connected to the second multilayer stack, wherein the second source/drain structure is wider than the first source/drain structure.

6. The semiconductor device structure as claimed in claim 5, wherein the substrate has a first fin structure and a second fin structure over the base, the first fin structure comprises a first bottom portion, the first multilayer stack is over the first bottom portion, the second fin structure comprises a second bottom portion, the second multilayer stack is over the second bottom portion, the bottom spacer separates the first source/drain structure from the first bottom portion, and the second source/drain structure is over the second bottom portion.

7. The semiconductor device structure as claimed in claim 6, wherein the second source/drain structure is in direct contact with the second bottom portion.

8. The semiconductor device structure as claimed in claim 6, wherein the bottom spacer extends into the first bottom portion.

9. A semiconductor device structure, comprising:
a substrate having a base;
a multilayer stack over the base, wherein the multilayer stack comprises a first channel layer and a second channel layer over and spaced apart from the first channel layer;
a gate stack over the substrate, wherein the gate stack wraps around the multilayer stack;
an inner spacer layer between the second channel layer and the first channel layer and between the first channel layer and the base;
a bottom spacer over the base and covering a first sidewall of the first channel layer, wherein a portion of the inner spacer layer is located between the bottom spacer and a side edge of the first channel layer; and a source/drain structure over the bottom spacer and connected to the second channel layer, wherein the source/drain structure is electrically insulated from the first channel layer.

10. The semiconductor device structure as claimed in claim 9, wherein the bottom spacer and the inner spacer layer together form a continuous structure.

11. The semiconductor device structure as claimed in claim 9, wherein the inner spacer layer continuously covers the first sidewall of the first channel layer, a second sidewall of the gate stack, and a top surface of the base.

12. The semiconductor device structure as claimed in claim 11, wherein the bottom spacer is embedded in the inner spacer layer.

13. A semiconductor device structure, comprising:

a substrate;

a multilayer stack over the substrate, wherein the multilayer stack comprises a first channel layer and a second channel layer over and spaced apart from the first channel layer;

a gate stack over the substrate, wherein the gate stack wraps around the multilayer stack;

an inner spacer layer between the second channel layer and the first channel layer and between the first channel layer and the substrate and covering a sidewall of the first channel layer, wherein the inner spacer layer has a concave top surface facing away from the substrate, and the inner spacer layer extends upwards along a side edge of the first channel layer; and a source/drain structure over the inner spacer layer and connected to the second channel layer, wherein the source/drain structure is electrically insulated from the first channel layer.

14. The semiconductor device structure as claimed in claim 13, further comprising:

a bottom spacer between the inner spacer layer and the source/drain structure.

15. The semiconductor device structure as claimed in claim 14, wherein the bottom spacer is embedded in the inner spacer layer.

16. The semiconductor device structure as claimed in claim 15, wherein the bottom spacer has a curved bottom surface.

17. The semiconductor device structure as claimed in claim 13, wherein the concave top surface of the inner spacer layer is a concave curved surface.

18. The semiconductor device structure as claimed in claim 1, wherein the bottom spacer has a curved sidewall surface extending upwards along a sidewall of the inner spacer layer and a side edge of the first channel layer.

19. The semiconductor device structure as claimed in claim 9, wherein the inner spacer layer laterally extends across opposite edges of the bottom spacer.

20. The semiconductor device structure as claimed in claim 13, wherein inner spacer layer laterally surrounds the bottom spacer.

* * * * *